United States Patent [19]

Ishikawa et al.

[11] Patent Number: 4,978,968
[45] Date of Patent: Dec. 18, 1990

[54] IMAGE RECORDING APPARATUS

[75] Inventors: Noriyoshi Ishikawa; Toshiharu Inui; Yasuyuki Tamura, all of Yokohama; Toshiaki Harada, Kawasaki, all of Japan

[73] Assignee: Canon Kabushiki Kaisha, Tokyo, Japan

[21] Appl. No.: 368,088

[22] Filed: Jun. 19, 1989

Related U.S. Application Data

[63] Continuation of Ser. No. 86,720, Aug. 18, 1987, abandoned.

[30] Foreign Application Priority Data

| Aug. 22, 1986 | [JP] | Japan | 61-195182 |
| Oct. 27, 1986 | [JP] | Japan | 61-253778 |
| Nov. 6, 1986 | [JP] | Japan | 61-262661 |
| Nov. 13, 1986 | [JP] | Japan | 61-268676 |
| Nov. 27, 1986 | [JP] | Japan | 61-280736 |
| Nov. 27, 1986 | [JP] | Japan | 61-280737 |
| Dec. 1, 1986 | [JP] | Japan | 61-284424 |
| Dec. 1, 1986 | [JP] | Japan | 61-284427 |
| Dec. 1, 1986 | [JP] | Japan | 61-284428 |

[51] Int. Cl.$^5$ .............................. G01D 9/00
[52] U.S. Cl. ...................... 346/1.1; 430/138; 355/27
[58] Field of Search ............ 355/3 R, 15, 30, 27; 430/138; 346/25, 1.1

[56] References Cited

U.S. PATENT DOCUMENTS

| Re. 29,323 | 7/1977 | Kawakubo et al. | 355/215 |
| 3,944,356 | 3/1976 | Hayne | 355/3 R |
| 4,255,042 | 3/1981 | Armitage | 355/3 R |
| 4,364,661 | 12/1982 | Landa | 355/35 H |
| 4,448,516 | 5/1984 | Arney et al. | |
| 4,571,066 | 2/1986 | Morrison | 355/15 |
| 4,592,986 | 6/1986 | Nelson et al. | |
| 4,647,186 | 3/1987 | Armstrong et al. | 355/15 |
| 4,723,144 | 2/1988 | Silverberg | 355/15 |

FOREIGN PATENT DOCUMENTS

| 0109838 | 5/1984 | European Pat. Off. . |
| 2550036 | 2/1985 | France . |
| 2113860 | 11/1875 | United Kingdom . |
| 2113860 | 8/1983 | United Kingdom . |

Primary Examiner—Leo P. Picard
Assistant Examiner—L. Donovan
Attorney, Agent, or Firm—Fitzpatrick, Cella, Harper & Scinto

[57] ABSTRACT

An image recording apparatus for recording an image on a recording medium by using a transfer recording medium having a transfer recording layer whose transfer characteristics change on application of a plurality of kinds of energy thereto. The apparatus comprises: a conveyor for conveying the transfer recording medium; a recording section disposed along an advancing route of the transfer recording medium conveyed by the conveyor and having energy applicators for selectively applying the plurality of kinds of energy to the transfer recording medium; a transfer section for transferring an image formed on the transfer recording medium in the recording section onto the recording medium; and a contacting member disposed between the recording section and the transfer section in such a manner as to be brought into contact with the transfer recording medium. Members constituting the advancing route of the transfer recording medium are formed separably from a main body of the unit.

35 Claims, 47 Drawing Sheets

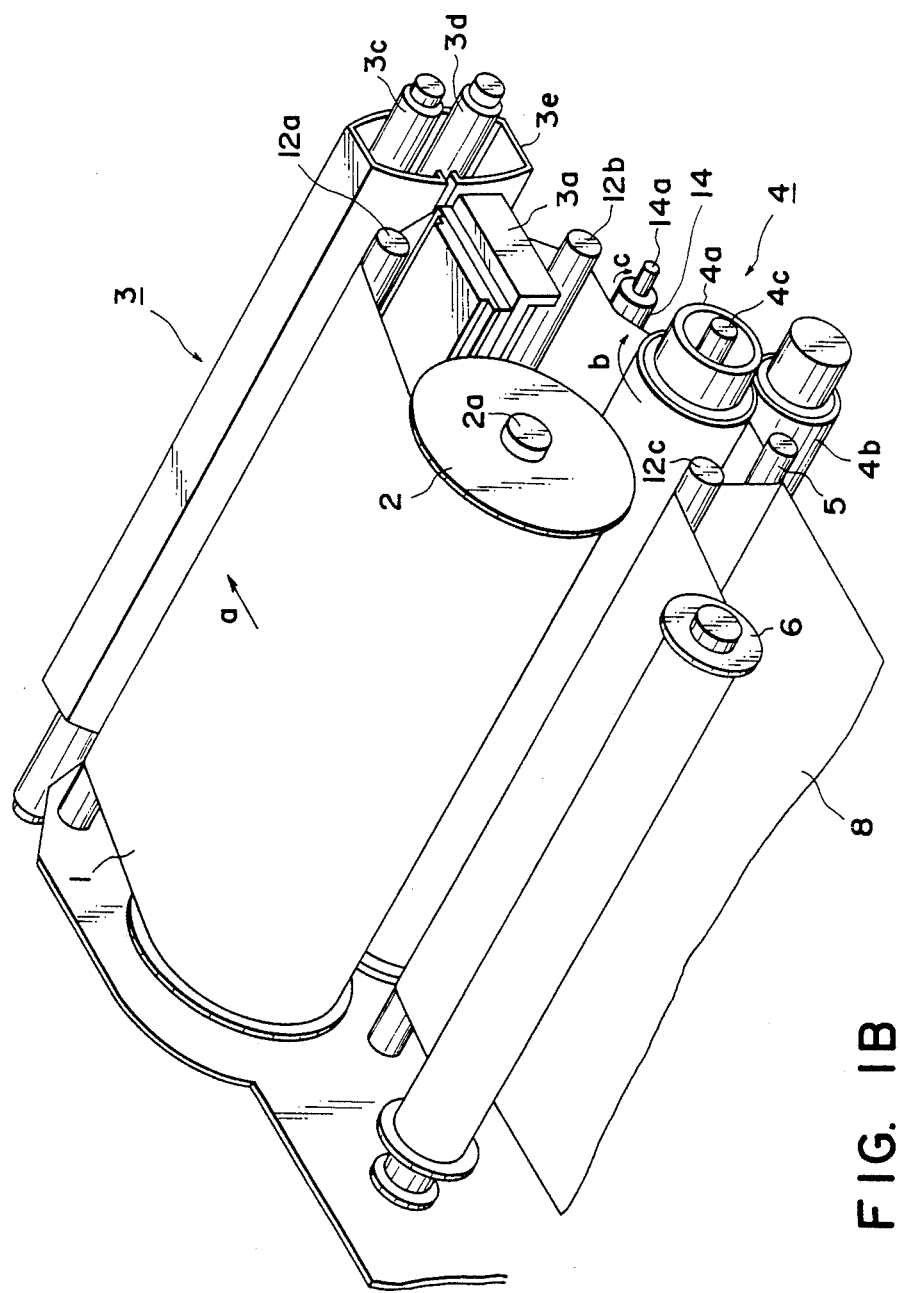
FIG. IB

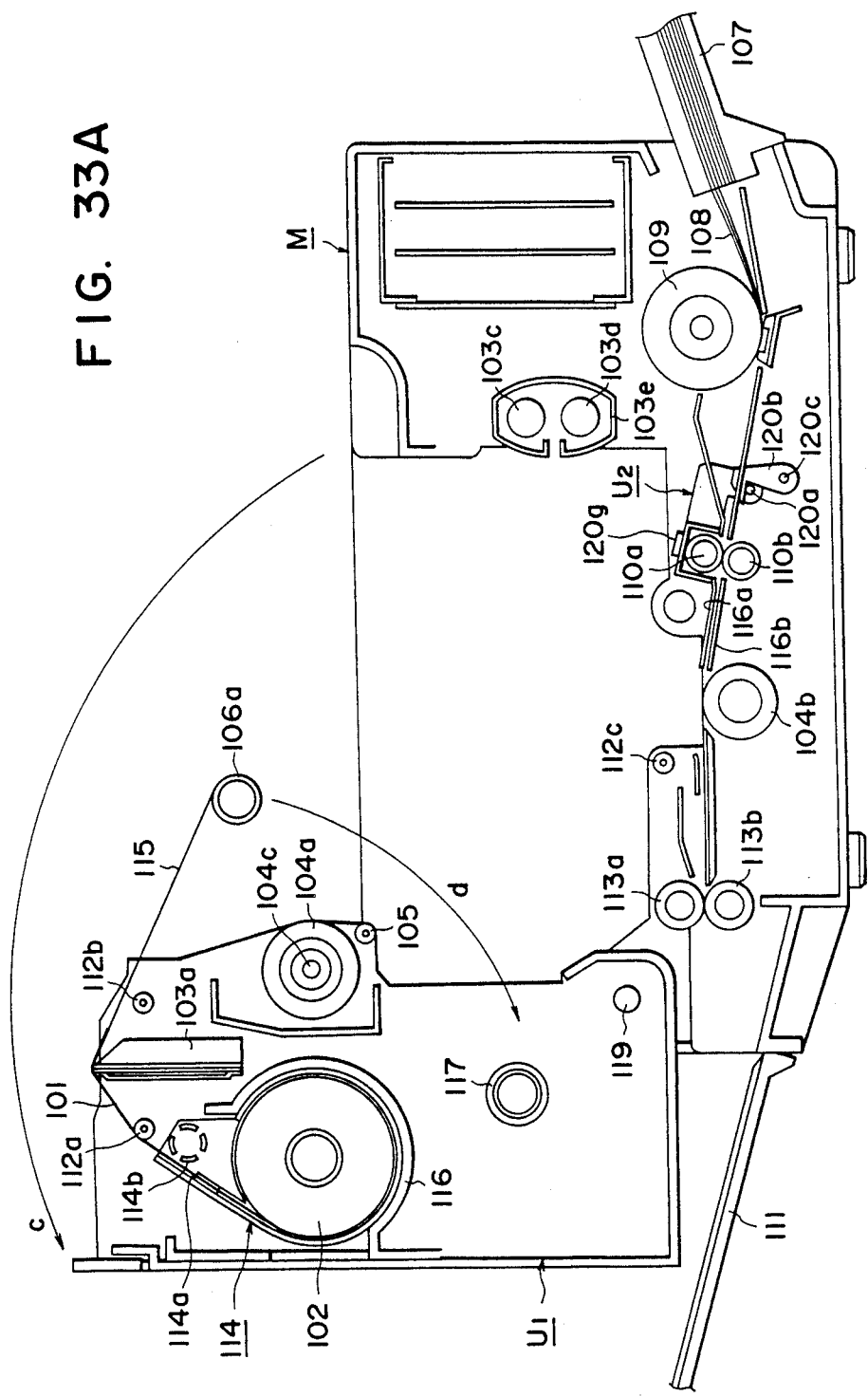

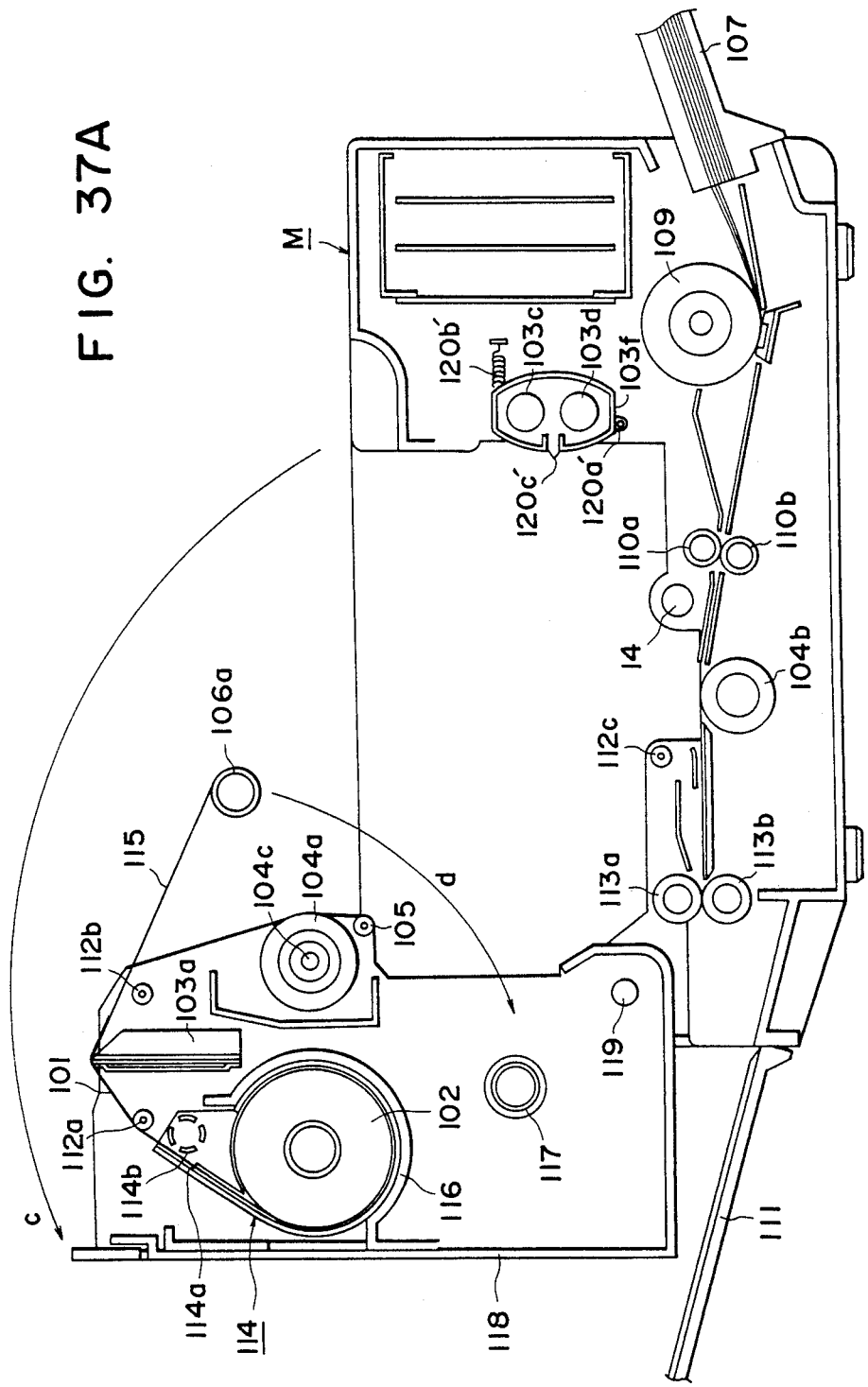

IMAGE RECORDING APPARATUS

This application is a continuation of application Ser. No. 071,086,720 filed Aug. 18, 1987, now abandoned.

BACKGROUND OF THE INVENTION

1. Field of the Invention

The present invention relates to an image recording apparatus applicable to printers, copying machines, electronic typewriters, facsimile equipment, and the like.

2. Related Background Art

In recent years, various kinds of information processing system have been developed in conjunction with rapid progress made in the information industry, and recording methods and apparatus suitable for various information processing systems have also been developed and adopted. Among such recording methods, the thermal transfer recording method has recently been used widely since the associated apparatus may be light in weight, compact and noise-free as well as excelling in terms of operational features and maintenance capabilities.

This heat transfer recording method is generally effected as follows: A heat transfer medium is used in which a thermal transfer ink with a coloring agent dispersed in a heat melting binder is applied to a sheet-like substrate, and this thermal transfer medium is superposed on a recording medium in such a manner that a thermal transfer ink layer will contact the recording medium. By supplying heat from the side of the thermal transfer medium's substrate by means of a thermal head to transfer the melted ink layer to the recording medium, a transferred ink image corresponding to the configuration of the heat supplied is formed on the recording medium. In accordance with this method, plain paper can be used as the recording medium.

However, conventional thermal transfer recording methods are not free from problems. In other words, with conventional thermal transfer recording methods, the transfer recording performance, i.e., the printing quality, is substantially affected by the smoothness of the surface of the recording medium. In the case of a recording medium with a low degree of smoothness, there is a possibility of this resulting in a decline in the quality of images recorded.

In addition, if a multi-color image is to be obtained using a conventional thermal transfer recording apparatus, it is necessary to provide a plurality of thermal heads or provide the transfer recording medium or the recording medium with complicated functions such as reverse feeding and stopping. Thus, there are problems in that the overall apparatus becomes large in size and complex, and that the recording speed declines.

Therefore, the present applicant invented image recording methods and transfer recording media which allow high-quality images to be recorded on a recording medium having a low degree of surface smoothness by overcoming the aforementioned problems of the prior art. In addition, the present applicant invented image recording methods and transfer recording media which allow multi-color images to be obtained without needing to have the recording medium perform complicated functions. The present applicant filed patent applications in Japan for these inventions as Japanese Patent Application Nos. 120080/1985 (filed on June 3, 1985), 120081/1985 (filed on June 3, 1985), 131411/1985 (filed on June 17, 1985), 134831/1985 (filed on June 20, 1985), 150597/1985 (filed on July 9, 1985), 199926/1985 (filed on Sept. 10, 1985), and 250884/1985 (filed on Nov. 11, 1985). Furthermore, on the basis of the priority rights afforded by these Japanese Applications, the present applicant filed an application in the United States (U.S. Ser. No. 869,689, filed on June 2, 1985) and a European application (Application No. 86107540.6, filed on June 3, 1986).

In addition, the present applicant further invented image recording apparatuses which are capable of effectively employing the aforementioned inventions, for which patent applications had been filed in Japan, the United States, and Europe. Thus, the present applicant filed patent applications in Japan for these inventions, and, on the basis of the priority rights afforded by these Japanese applications (priority date: Feb. 3, 1986), filed patent applications in the United States (U.S. Ser. No. 008,914, filed on Jan. 30, 1987) and Europe (Application No. 87300800.7, filed on Jan. 29, 1987).

The present invention which will be described below is a further development of the aforementioned inventions for which the present applicant filed the Japanese applications, the U.S. applications, and the European applications. The present invention can be applied, as necessary, to the image recording methods and transfer recording media described in the specifications of the aforementioned applications.

SUMMARY OF THE INVENTION

A primary object of the present invention is to provide an image recording apparatus which is capable of forming high-quality images on a recording medium with a low degree of surface smoothness (e.g., plain paper etc.).

Another object of the present invention is to provide an image recording apparatus which is capable of forming clear images.

Still another object of the present invention is to provide an image recording apparatus which is capable of obtaining multi-color recorded images without the need to have a transfer recording medium or a recording medium perform complicated functions.

A further object of the present invention is to provide an image recording apparatus which is capable of effecting in separate processes the formation of images on a transfer recording medium and the transfer of the images onto a recording medium.

A still further object of the present invention is to provide an image recording apparatus which is capable of transferring onto a recording medium an image formed on a transfer recording layer after smoothening the surface of the transfer recording layer.

Another object of the present invention is to provide an image recording apparatus which is capable of improving the contact between a transfer recording layer and a recording medium.

Still another object of the present invention is to provide an image recording apparatus which is capable of improving the image quality by preventing creases from being formed in a transfer recording medium.

To this end, according to one aspect of the present invention, there is provided an image recording apparatus for recording an image on a recording medium by using a transfer recording medium having a transfer recording layer whose transfer characteristics change on application of a plurality of kinds of energy thereto, the apparatus comprising: conveying means for conveying the transfer recording medium; a recording section disposed along an advancing route of the transfer recording medium conveyed by the conveyor and having energy application means for selectively applying the plurality of kinds of energy to the transfer recording medium; a transfer section for transferring an image formed on the transfer recording medium in the recording section onto the recording medium; and a contacting member disposed between the recording section and the transfer section in such a manner as to be brought into contact with the transfer recording medium.

According to this aspect of the invention, a thin surface layer of the transfer recording layer which has passed the recording section by the rotation of the rotary member is scraped off and is thereby smoothed, so that the characteristics of contact between the transfer recording layer and the recording medium can be improved, thereby making it possible to effect recording of images having stable and favorable image quality.

According to another aspect of the invention, there is provided an image recording apparatus for recording an image on a recording medium by using a transfer recording medium having a transfer recording layer whose transfer characteristics change on application of a plurality of kinds of energy thereto, comprising a unit constituting an advancing route of the transfer recording medium and arranged such as to be separable from a main body of the image recording apparatus.

According to still another aspect of the invention, there is provided an image recording apparatus for recording an image on a recording medium by using a transfer recording medium having a transfer recording layer whose transfer characteristics change on application of a plurality of kinds of energy thereto, the apparatus comprising: conveying means for conveying the transfer recording medium; a recording section having application means for applying the plurality of kinds of energy to the transfer recording medium and disposed along an advancing route of the transfer recording medium conveyed by the conveying means; a transfer section for transferring onto the recording medium an image formed on the transfer recording medium in the recording section; a rotary member which is disposed between the recording section and the transfer section such as to contact the transfer recording layer of the transfer recording medium and which is held rotatably, and means for rotating the rotary member.

The above and other objects and features of the present invention will become apparent from the following detailed description of the invention when read in conjunction with the accompanying drawings.

BRIEF DESCRIPTION OF THE DRAWINGS

FIGS. 1A and 1B are overall schematic diagram illustrating an image recording apparatus in accordance with an embodiment of the present invention;

FIGS. 33A and 33B are explanatory cross-sectional views of the image recording apparatus with a conveying unit opened with respect to the main body of the apparatus;

FIGS. 37A and 37B are cross-sectional views illustrating the image recording apparatus with the unit opened with respect to the main body of the apparatus.

DESCRIPTION OF THE PREFERRED EMBODIMENTS

Referring now to the accompanying drawings, description will be made of embodiments of an image recording apparatus in accordance with the present invention. As mentioned before, it goes without saying that the embodiments of the present invention can, as necessary, be applied to the image recording methods and transfer recording media described in the specifications of the aforementioned applications.

In an image recording apparatus in accordance with the present invention, a transferred image is formed by varying the physical properties governing the transfer characteristics. These physical properties are determined, as required, in accordance with the kinds of transfer recording media used. For instance, in the case of a transfer recording medium in which transfer is effected after rendering a transfer image in a thermally melted state, the physical properties are determined by the melting temperature, the softening temperature, or the glass transfer point. In the case of a transfer recording medium in which transfer is effected after rendering a transfer image in an adhesive state or in a state in which it is capable of permeating a recording medium, the physical properties are determined by the viscosity at an identical temperature. In addition, a plurality of kinds of energy used for forming a transfer image can also be determined as required. For instance, optoelectronic beams, heat, pressure, or the like may be used in a suitable combination.

A detailed description of an embodiment of the present invention will be made hereafter with reference to the accompanying drawings.

Figure 1A:
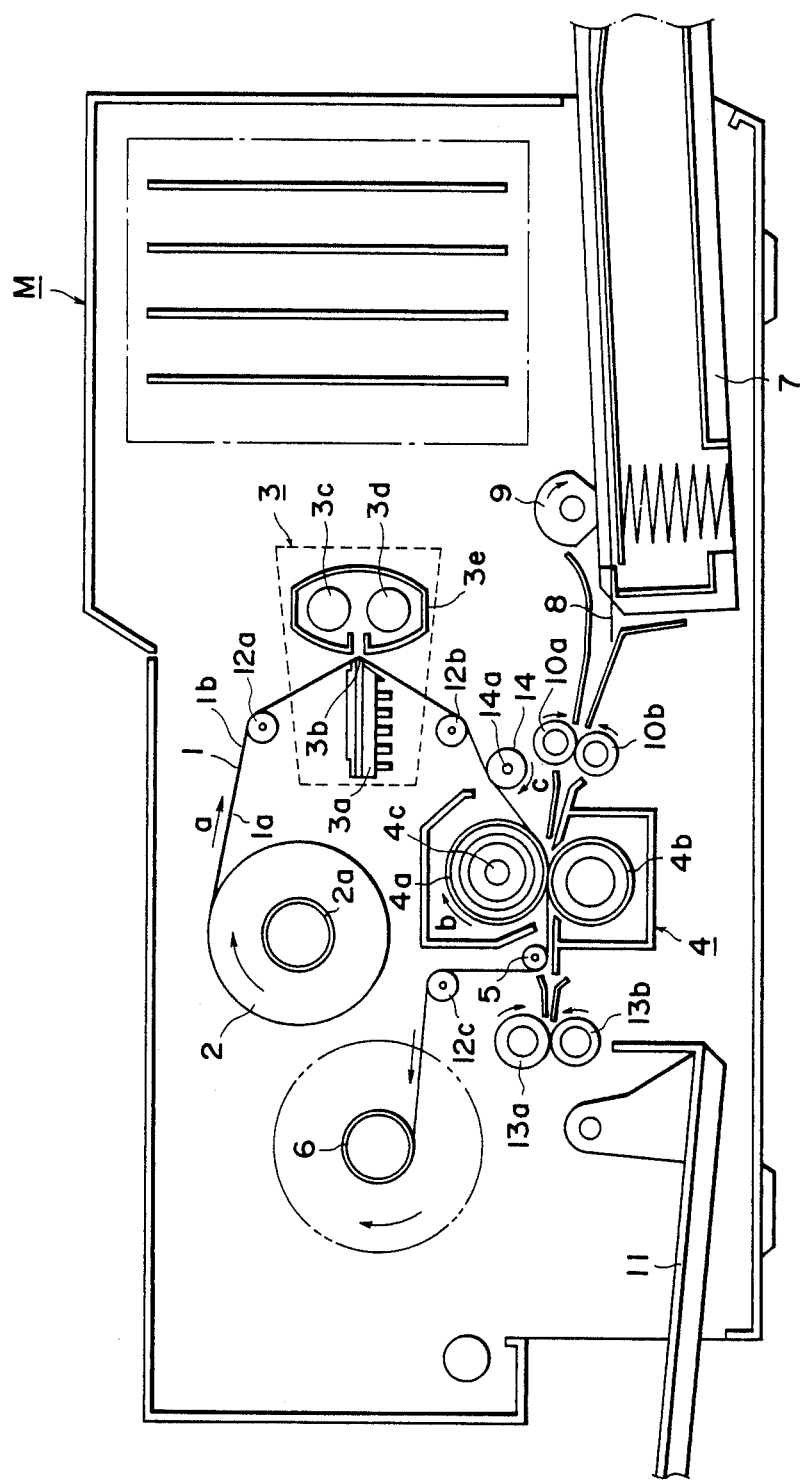

FIG. 1A is a schematic cross-sectional view of an image recording apparatus, while FIG. 1B is a perspective view thereof.

In the drawings, an elongated sheet-like transfer recording medium 1 is wound up in the form of a roll and is incorporated detachably in a main body M of the apparatus as a supply roll 2. In other words, this supply roll 2 is detachably loaded around a rotatable shaft 2a provided in the main body M of the apparatus.

First, this transfer recording medium 1 is paid out from the supply roll 2 and is made to pass along a guide roller 12a, a recording head 3a, a guide roller 12b, and a scraping roller 14 which is a rotary member. The tip of the transfer recording medium 1 is then inserted between a transfer roller 4a and a pressure roller 4b, is redirected by a release roller 5 and a guide roller 12c, and is made to reach a takeup roll 6, and the tip is retained by the takeup roll 6 by means of a gripper (not shown). Subsequently, when the takeup roll 6 is rotatively driven by means of a known driving means, the transfer recording medium 1 is paid out in the direction of an arrow a, and is consecutively taken up around the periphery of the takeup roll 6.

Incidentally, during the aforementioned takeup, a constant back tension is applied to the supply roll 2 by means of a hysteresis brake (not shown), and the arrangement is such that the transfer recording medium 1 is conveyed while being brought into pressure contact with the recording head 3a by means of this tension and the guide rollers 12a, 12b with a constant pressure and at a fixed angle with respect to the recording head 3a.

Description will now be made of the arrangement of the aforementioned respective parts.

Figure 2:
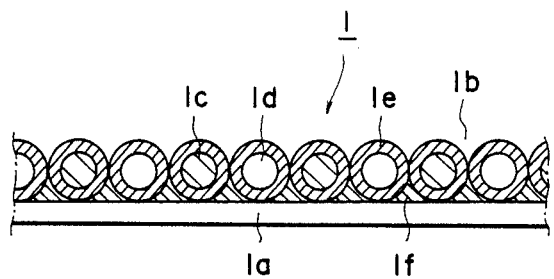
FIG. 2 is a schematic diagram illustrating a transfer recording medium.

First, the transfer recording medium 1 is arranged such that an ink layer 1b, which has properties capable of forming an image in cases where both heat and light energy is applied thereto, is adhered to a sheet-like substrate 1a, as shown in FIG. 2.

To given an example, as shown in FIG. 2, the transfer recording layer 1b is constituted by microcapsule-like image-forming elements formed by the following method using the components shown in Tables 1 and 2 as cores 1c, 1d.

In other words, 10g of components shown in Tables 1 and 2 are first mixed with 20 wt. % of methylene chloride, and this mixture is then mixed with 200 ml of water in which 1 g of gelatine and a cationic or nonionic surface active agent having an HLB value of at least 10 or above are dissolved. This mixture is agitated by a homomixer held at a temperature of 60 C. at a speed of 8000-10,000 r.p.m. to emulsify the same, thereby obtaining oily droplets having an average particle diameter of 26 $\mu$m.

The mixture is further agitated for 30 minutes at 60° C., and the average particle diameter is reduced to approximately 10 $\mu$m by removing methylene chloride. 20 ml of water in which 1 g of gum arabic is dissolved is added to the same. Subsequently, NH$_4$OH (ammonium) water is added to the mixture while cooling it gradually to set the pH to 11 or above, and a microcapsule slurry is thereby obtained. The walls of the microcapsules are hardened by gradually adding 1.0 ml of a 20% aqueous solution of glutaraldehyde to the same.

Subsequently, the microcapsule slurry is separated into a solid and a liquid using a Nutsche funnel, and the solid is then dried by a vacuum cleaner for 10 hours at 35° C., thereby obtaining microcapsule-like image-forming elements.

These image-forming elements are microcapsules in which the cores 1c, 1d of Tables 1 and 2 are respectively covered with shells 1e, and are formed into a particle size of 7-15 $\mu$m and an average particle size of 10 $\mu$m.

The image-forming elements thus formed are adhered on the substrate 1a constituted by a 6 $\mu$m-thick polyethylene terephthalate film, using an adhesive 1f, thereby forming the transfer recording layer 1b. Thus the transfer recording medium 1 is arranged.

To give a more detailed description, Epolsion EAI and Epolsion EBI, a two-liquid-type epoxy adhesive manufactured by Kanebo NSC, Ltd., were used as the adhesive 1f. A liquid in which the Epolsion EAI and EBI were mixed at a ratio of 1:1 was diluted two-fold by water. The liquid was then applied onto the polyethylene tetraphthalate film, and was allowed to dry, thereby obtaining an adhered layer. This adhered layer displayed adhesiveness even after it was dry, and the thickness of the adhered layer after it was subsequently allowed to harden was approximately 0.3 μm. The microcapsule-like image forming elements having as core materials the above-described components shown in Tables 1 and 2 were mixed at a ratio of 1:1, and were sprayed onto the adhesive layer so as to be adhered thereonto. Subsequently, when surplus image forming elements were removed, the remaining 90% of the image forming elements were disposed on the adhesive layer in a substantially one layer thereof.

The material thus obtained was let to stand in a 100° C. environment for about two hours to harden the adhesive 1f, thereby arranging the transfer recording medium 1, as shown in FIG. 2.

TABLE 1

| Item | Component | wt. % |
| --- | --- | --- |
| Polymerizable prepolymer |  | 70 |
| Reaction initiator | dichlorobenzophenon/ ethyl-p-dimethyl-amino-benzoate | 4/7 |
| Binder | Elvasite 2041 (mfd. by Du Pont) | 17 |
| Colorant | Diaresin Red K (mfd. by Mitsubishi Chemical Industries, Ltd. | 2 |

TABLE 2

| Item | Component | wt. % |
| --- | --- | --- |
| Polymerizable prepolymer | 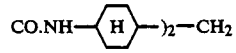 | 75 |
| Reaction initiator | 2-chlorothioxanthone/ ethyl-p-dimethyl-amino-benzoate | 1.5/3 |
| Binder | Elvasite 2041 (mfd. by Du Pont) | 18.5 |
| Colorant | Diaresin Blue K (mfd. by Mitsubishi Chemical Industries, Ltd. | 2 |

Figure 3:
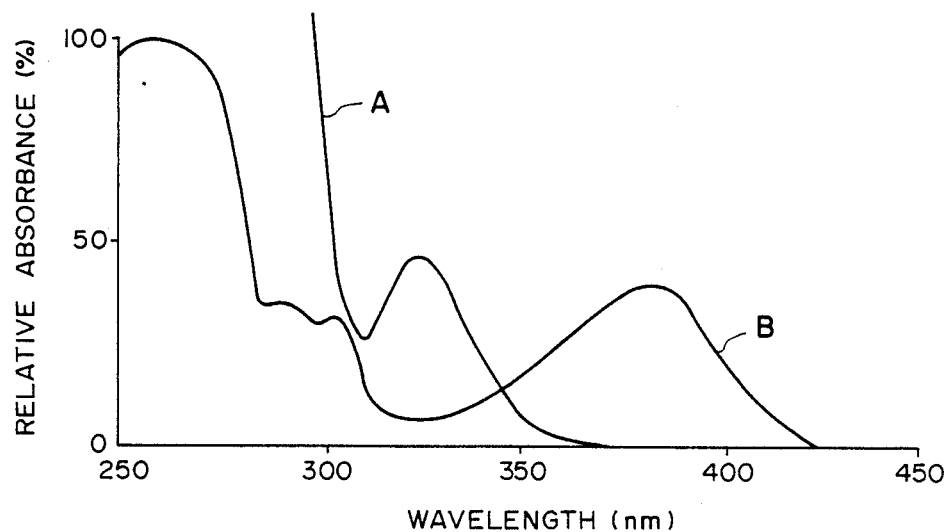
FIG. 3 is a diagram explaining the light absorption characteristics of reaction initiators contained in a transfer recording medium.

The reaction initiator shown in Table 1 starts reaction by absorbing light in the range of Curve A in the light absorbance characteristics shown in FIG. 3 and assumes a color of magenta at the time of image formation. Meanwhile, the reaction initiator shown in Table 2 starts reaction by absorbing light in the range of Curve B in FIG. 3 and assumes a color of blue at the time of image formation.

Next, description will be made of the recording section 3, which is comprised of a heating means and an irradiating means.

As for the heating means, an array of 8-dot/mm, A-4 size (209 mm × 297 mm) heating elements 3b of the line type each having a width of 0.2 mm and adapted to generate heat in response to image signals are arranged on the surface of the recording head 3a. The arrangement is such that the substrate 1a side of the transfer recording medium 1 is held in pressure contact with the array of heating elements 3b with a predetermined pressure by means of back tension as the transfer recording medium 1 is conveyed. Incidentally, the image signals are issued from a control section 24 of such as facsimile equipment, an image scanner, or an electronic blackboard.

Figure 4:
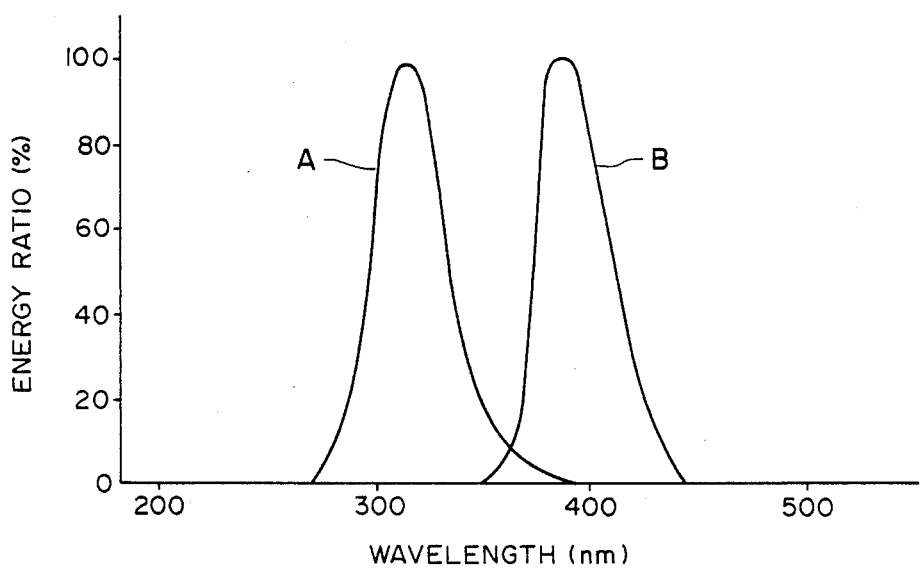
FIG. 4 is a diagram explaining the spectroscopic characteristics of an irradiating means.

Meanwhile, two 20-Watt fluorescent tubes 3c, 3d, i.e., an irradiating means having the spectroscopic characteristics as shown in FIG. 4 are disposed on the side of the transfer recording layer 1b opposing the recording head 3a such as to be about 25 mm apart from the transfer recording medium 1.

Furthermore, a slit plate 3e is arranged in such a manner that an about 0.5 mm clearance is maintained between the slit plate 3e and the transfer recording medium 1, and the width of its opening is set to 1.2 mm, so that direct rays from the fluorescent lamps 3c, 3d will be applied only to the area of the transfer recording medium 1 held in pressure contact with the recording head 3a immediately above the array of heating elements 3b.

Incidentally, in this embodiment, a 20-Watt healthray fluorescent tube FL20SE made by Toshiba Corporation is used as the fluorescent tube 3c having the spectroscopic characteristics of Curve A in FIG. 4, while a 20-Watt fluorescent tube FL10A70E 39 is used as the other fluorescent tube 3d having the spectroscopic characteristics of Curve B.

Description will now be made of the friction roller (scraping roller) 14 of this embodiment. This friction roller (scraping roller) 14 is installed on a frame of the main body M of the apparatus via a shaft 14a between the recording section 3 and the transfer section 4, which will be described below, in such a manner as to be brought into contact with the transfer recording layer 1b of the transfer recording medium 1 with a pressure of about 0.2 kg/cm².

Specifically, the peripheral surface of the scraping roller (friction roller) 14 is provided with very small protrusions by sandblasting a 14 mm-diameter stainless steel shaft, and its opposite ends are installed rotatably on a frame F of the main body M of the apparatus. Furthermore, a DC motor M3 is connected to the scraping roller 14 via gears G1, G2. As a result, the arrangement is such that, simultaneously as recording is commenced at the recording section 3, the scraping roller 14 rotates at a speed of about 1,000 rpm in the direction of the arrow c (clockwise), i.e., in a direction opposite to the advancing direction of the transfer recording medium 1, so as to scrape off a thin surface layer of the transfer recording layer 1b.

Description will now be made of the transfer section 4. The transfer section 4 is disposed downstream of the recording section 3 in the advancing direction of the transfer recording medium 1, and is constituted by the transfer roller 4a which is rotatively driven in the direction of the arrow b as well as the pressure roller 4b which is held in pressure contact with the transfer roller 4a, as show in FIG. 1. The transfer roller 4a is constituted by an aluminum roller with its surface coated with 1 mm-thick silicone rubber having a hardness of 70 degrees. The arrangement is such that its surface is held at 90°–100° C. by an incorporated 800-Watt halogen heater 4c. Meanwhile, the pressure roller 4b is constituted by aluminum roller coated with 1 mm-thick silicone rubber having a hardness of 70 degrees, and its pressing force against the transfer roller 4a is set to 6-7 kgf/cm² by means of a pressing means (not shown) such as a spring.

Recording sheets 8 constituting a recording medium are loaded in a cassette 7 and are arranged in such a manner as to be fed to the transfer section 4 by means of a feed roller 9 and a pair of registration rollers 10a, 10b in synchronization with an image area of the transfer recording medium 1 so as to overlap the same.

Next, description will be made of the operation when recording is effected using the image recording apparatus having the above-described arrangement.

Incidentally, in the embodiment which will be described below, an example is shown in which heat is applied in accordance with image signals and light is applied uniformly.

An image is formed if the transfer recording medium 1 is fed consecutively from the supply roll 2 by driving a motor (not shown) and light and heat. are applied to the transfer recording layer 1b of the transfer recording medium 1 in the recording section 3 in accordance with image signals.

Figure 5:
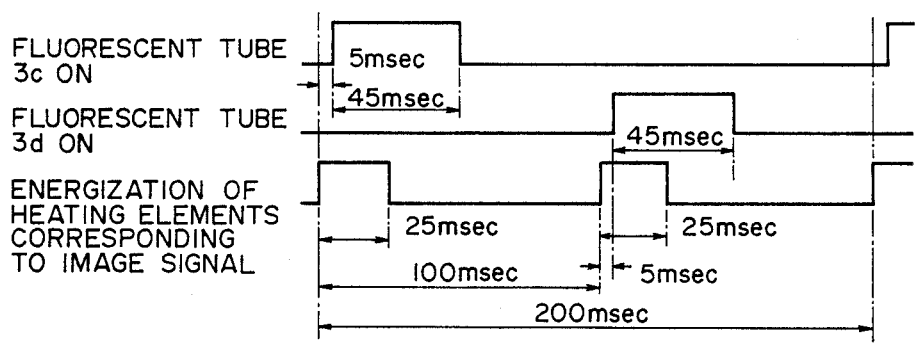
FIG. 5 is a timing chart for applying heat and light.
Figure 6:
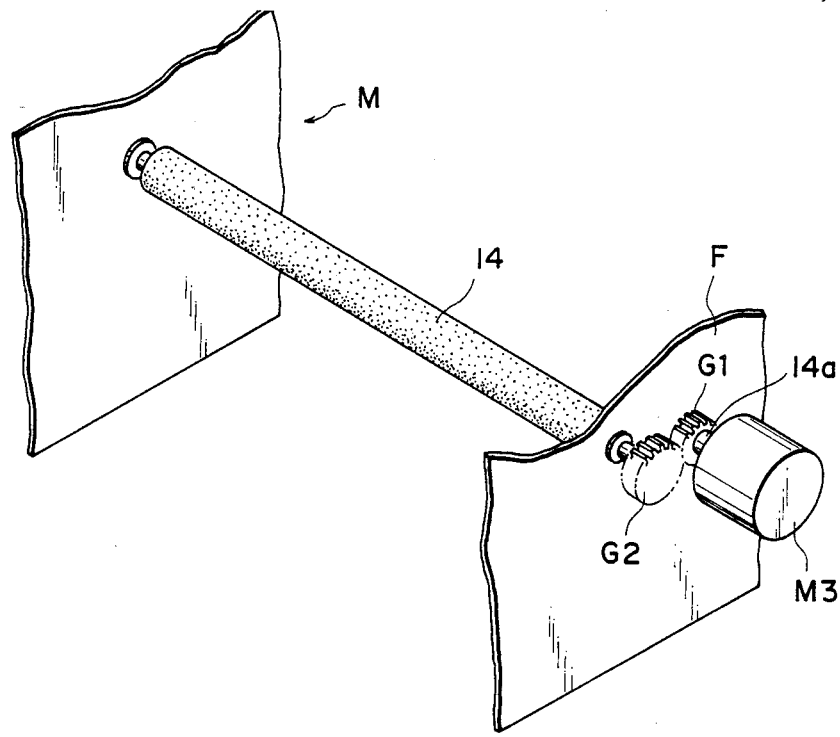
FIG. 6 is a diagram illustrating a scraping roller.

Namely, the transfer recording layer 1b has properties whereby, when light of a predetermined wavelength and heat are applied to it, its softening-point temperature increases and it fails to be transferred onto the recording sheet 8. Therefore, as shown in a timing chart of FIG. 5, at the time of magenta color recording, heating elements corresponding to image signals representing magenta in the array of heating elements 3b are not energized, and image signals representing white (the recording medium 8 is assumed to be white) are energized for 25 m.sec. Those portions are irradiated with the light of the fluorescent tube 3c with a time lag of 5 m.sec. At this juncture, the irradiation time is set to 45 m.sec.

Then, at the time of effecting blue color recording, after a lapse of 50 m.sec. upon completion of the irradiation, i.e., in 100 m.sec. from the time of starting energization, heating elements corresponding to image signals representing blue in the array of heating elements 3b are not energized, and those portions corresponding to image signals representing white are energized for 25 m.sec. and are irradiated uniformly with the light of the fluorescent tube 3d with a time lag of 5 m.sec. The irradiation time at this juncture is 45 m.sec. as in the above.

A negative image is formed on the transfer recording layer 1b by controlling the recording head 3a in correspondence with the image signals representing blue, magenta, and white in the procedure as described above. The transfer recording medium 1 is conveyed in synchronization with a repeated cycle of 200 m.sec./line.

As described above, the transfer recording layer 1b on which a negative image has been formed in the recording section 3 is brought into pressure contact with the scraping roller 14 whose peripheral surface is rough, and the surface of the transfer recording layer 1b is scraped and is made smooth. In other words, the shells 1e of microcapsules are scraped by the rough surface of the roller 14 and are destroyed, with the result that the surface of the recording layer 1b is made smooth.

It should be noted that, although the scraping roller 14 is installed on the frame F in such a manner as to come into contact with the transfer recording layer 1b, an arrangement may be alternatively provided such that the peripheral surface of the roller 14 is pressed against the transfer recording layer 1b by means of a spring or the like.

Subsequently, the transfer recording medium 1 with its surface smoothed and the recording sheet 8 which is conveyed in synchronization with the same are brought into pressure contact with each other in the transfer section 4, thereby transferring a transfer image of the two colors of blue and magenta onto the recording sheet 8. At this juncture, since the surface of the transfer recording layer 1b has been smoothed, the transfer recording layer 1b can be brought into close contact with the recording sheet 8, thereby allowing a sharp recorded image to be obtained. Subsequently, the transfer recording medium 1 and the recording sheet 8 are separated from each other, and the recording sheet 8 on which recording of an image of desired colors been effected is discharged onto a discharge tray 11 by means of a pair of discharge rollers 13a, 13b.

Two-color recording can thus be effected at one time in the manner described above.

Figure 7:
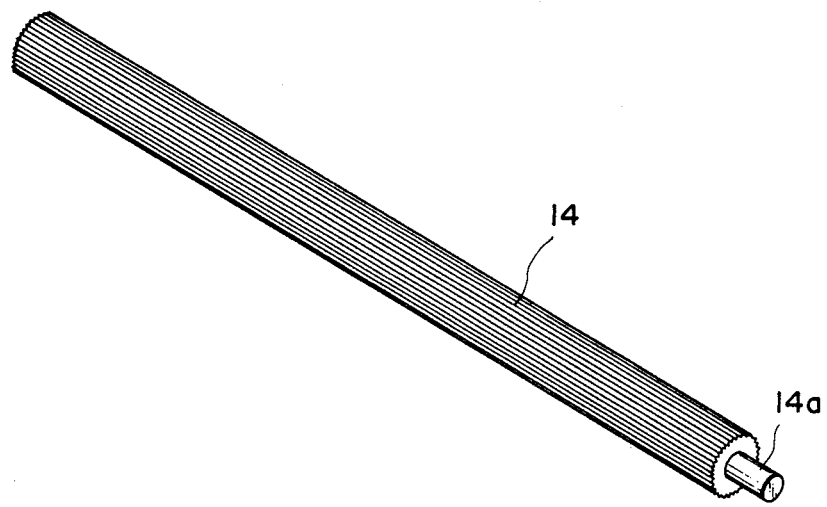
FIG. 7 is a diagram illustrating another example of the scraping roller.

Incidentally, although, as for the scraping roller 14, one having very small protrusions obtained by sandblasting its surface is used in the foregoing embodiment, it suffices if the roller 14 is capable of scraping off a thin surface layer of the transfer recording layer 1b. Thus, it is possible to use a stainless steel roller 14 whose peripheral surface is arranged in the form of a knurling tool, which is shown as another example in FIG. 7.

As described above, in accordance with the present invention, the surface of the transfer recording layer 1b of the transfer recording medium 1 is smoothed since its thin layer is scraped off, so that the contact between the transfer recording layer 1b and the recording medium 8 is improved and transfer can be effected on a stable basis, thereby making it possible to obtain a recording image with good image quality.

A block diagram, timing chart, and flowchart of a control section of this apparatus will be described with reference to FIGS. 8, 9A, 9B, and 10. As shown in the block diagram of FIG. 8, this apparatus is controlled by a microcomputer. A CPU 20 inputs via an interface 21 information (e.g., recording density, the number of sheets, and size) from an operation panel 22 as well as a signal from a resistration sensor 14 and a magenta synchronization signal produced by a latent image formation timing generator 23. In addition, the CPU 20 outputs via the interface 21 a sheet feed motor (M1) ON signal, a conveyance motor (M2) ON signal, a scraper motor (M3) ON signal for driving the scraping roller 14, and a page signal. Meanwhile, the latent image formation timing generator 23 generates various types of signal by the frequency division of clocks of an internal crystal oscillator. Then, as shown in FIG. 9A, a page signal which is sent from the CPU 20 via the interface 21 is latched at a rising edge of a magenta line synchronization signal so as to produce a synchronization signal. The magenta synchronization signal and a blue line synchronization signal are signals in which a period is 200 m.sec., the duty is 50%, and the phase is offset 180°. A video clock is a signal which generates clocks having a frequency of 25 kHz starting with the rise of the magenta line synchronization signal and the blue line synchronization signal and pauses after generating 1728 clocks (approx. 69 m.sec.). (Incidentally, this apparatus employs the recording head 3a which has 1728 picture elements per line.) An external image signal generator 24 (e.g., facsimile equipment, an image scanner, and electronic blackboard) receives a page synchronization signal, a magenta line synchronization signal, a blue line synchronization signal, and a video clock from the latent image formation timing generator 23. From the point of time when the page signal has become high, the external image signal generator 24 transmits 1728 image signals representing magenta when the magenta synchronization signal is high and 1728 image signals representing blue in synchronization with the video clock. In addition, as shown in FIG. 9A, the latent image formation timing generator 23 generates a strobe signal which is set to high when the video clock pauses while the magenta and blue line synchronization signals are high. Meanwhile, an enable signal begins with the rise of the blue line synchronization signal after the page synchronization signal is set to high. The enable signal repeats highs for 25 m.sec. each starting from the rising edges of the magenta and blue line synchronization signals and is completed upon the generation of a 25 m.sec. high during a high period of the first magenta synchronization signal after the page synchronization signal has become low. This enable signal corresponds to an signal for a heating elements-energizing signal corresponding to the image signal shown in FIG. 5. Furthermore, the latent image formation timing generator 23 generates a fluorescent tube (3c) ON signal which becomes high with a time lag of 5 m.sec. after the rise of the first enable signal and is set to low after a lapse of 45 m.sec to control the ON/OFF operation of the fluorescent tube 3c when every other pulse of the enable signal is issued, as well as a fluorescent tube (3d) ON signal which lags behind the fluorescent tube (3c) ON signal by 100 m.sec.

At this juncture, the recording head 3a fetches an image signal from the external image signal generator 24 into an internal shift register by means of a video clock from the latent image formation timing generator 23. The image signal which is fetched to the shift register is latched by a latch register in the recording head 3a by means of a strobe signal from the latent image formation timing generator 23. Subsequently, the heating elements 3b are energized in accordance with the image signal in the latch register by means of the enable signal issued from the latent image formation timing generator 23. At the same time, a next image signal is fetched to the shift register by means of the video clock In addition, upon receipt of a fluorescent tube 3c, 3d ON signal from the latent image formation timing generator 23, fluorescent tubes (3c, 3d) lighting devices 25, 26 turn ON the fluorescent tubes 3c, 3d when the fluorescent tube (3c, 3d) ON signal is high.

Furthermore, when a sheet feed motor (M1) ON signal from the CPU 20 via the interface 21 is high, a sheet feed motor driver 27 rotates the sheet feed motor M1. The arrangement is such that, when the sheet feed motor M1 rotates, the recording sheet 8 accommodated below the feed roller 9 as well as the recording sheet placed between the registration rollers 10a, 10b are fed at a speed of 0.625 mm/sec. In addition, when a conveyance motor (M2) ON signal from the CPU 20 via the interface 21 is high, a conveyance motor driver 28 rotates the conveyance motor M2 Similarly, a friction roller drive motor driver 29 rotates a scraper motor M3. Then, if the transfer recording medium 1 and the recording sheet 8 are present between the transfer rollers 4a, 4b, the conveyance motor M2 conveys the recording sheet 8 together with the transfer recording medium 1 at a speed of 0.625 mm/sec.

Figure 11:
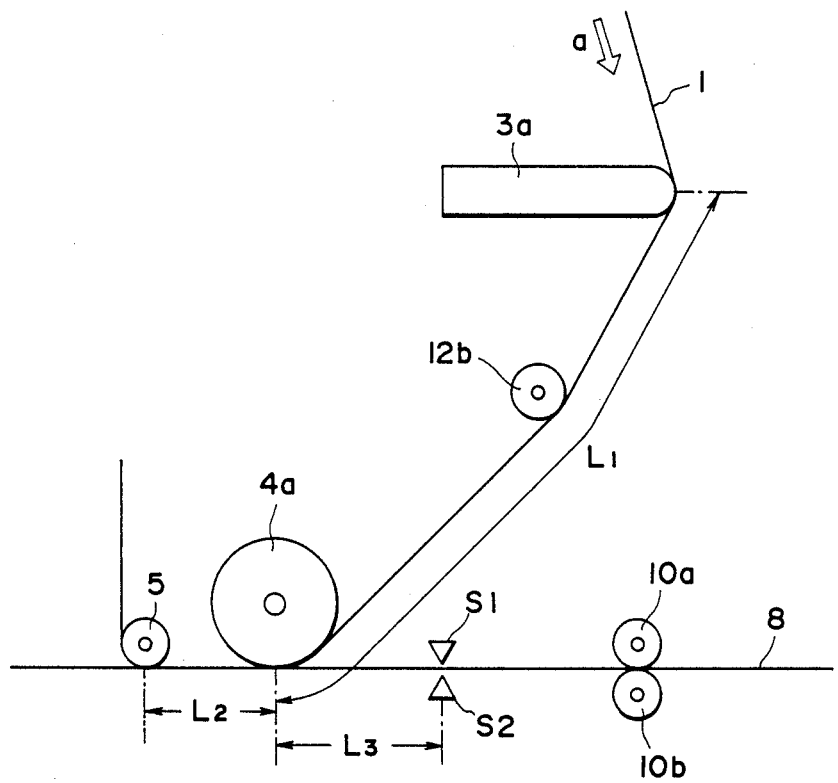
FIG. 11 is enlarged schematic diagram of a registration sensor portion.

Incidentally, a timing chart for each signal which is input and output by the CPU 20 via the interface 21 is shown in FIG. 9 B. $T_1$, $T_2$, $T_3$, and $T_4$ shown in FIG. 9 B are defined as follows:

First, in FIG. 11 which schematically illustrates portions of the recording section 3 and the transfer section 4, the respective distances between the recording head 3a, the transfer roller 4a, the release roller 5, and the registration sensor 14 are as follows:

$L_1$: distance between the recording head 3a and the transfer roller 4a (100 mm in this apparatus)

$L_2$ distance between the transfer roller 4a and the release roller 5 (30 mm in this apparatus)

$L_3$ distance between the registration sensor 14 and the transfer roller 4a (40 mm in this apparatus)

Meanwhile, $T_1$, $T_2$, $T_3$, and $T_4$ are as follows:

$T_1$: time duration required in conveying the distance of $L_1$–$L_3$ (92 sec. in this apparatus)

$T_2$: time duration required in conveying the distance of $L_3$ (64 sec. in this apparatus)

$T_3$: time duration required in conveying the length (297 mm) of the recording sheet 8 (475 sec. in this apparatus)

$T_4$: time duration required in conveying the distance of $L_1+L_2$ (205 sec. in this apparatus)

As shown in FIG. 9A, when the operator presses a start button (on an operation panel 22), the sheet feed motor M1 for rotating the feed roller 9 is driven to feed the recording sheet 8, and its drive pauses when the tip thereof is sensed by the registration sensor composed of a light-emitting device S1 and a light-receiving device S2. Simultaneously, the conveyance motor M2 for rotating the transfer roller 4a is driven to convey the transfer recording medium 1 in the direction of the arrow a, and the page signal is set to high during the time duration $T_3$ (during which the transfer recording medium 1 is conveyed a distance of 297 mm), and a transfer image forming process is carried out in the recording section 3. Thus, a transfer image of, for instance, A-4 size, is formed.

Subsequently, the conveyance motor M2 and the scraper motor M3 stop after a lapse of the time duration $T_4$ during which the rear end of the transferred image is conveyed a distance of $L_1+L_2$.

Incidentally, when the time duration $T_1$ during which the transfer recording medium 1 is conveyed a distance of $L_1$–$L_3$ from the start of conveyance lapses, the sheet feed motor M1 is driven only during the time duration $T_2$ (during which the recording sheet 8 is conveyed a distance of $L_3$) to convey the recording sheet 8 at the same speed as that for the transfer recording medium 1, and then stops. As a result, the tip of the recording sheet is aligned with the tip of the transfer image of the transfer recording medium 1 in the transfer section 4. Subsequently, the recording sheet 8 is conveyed by the rotation of the transfer roller 4a.

Figure 9A:
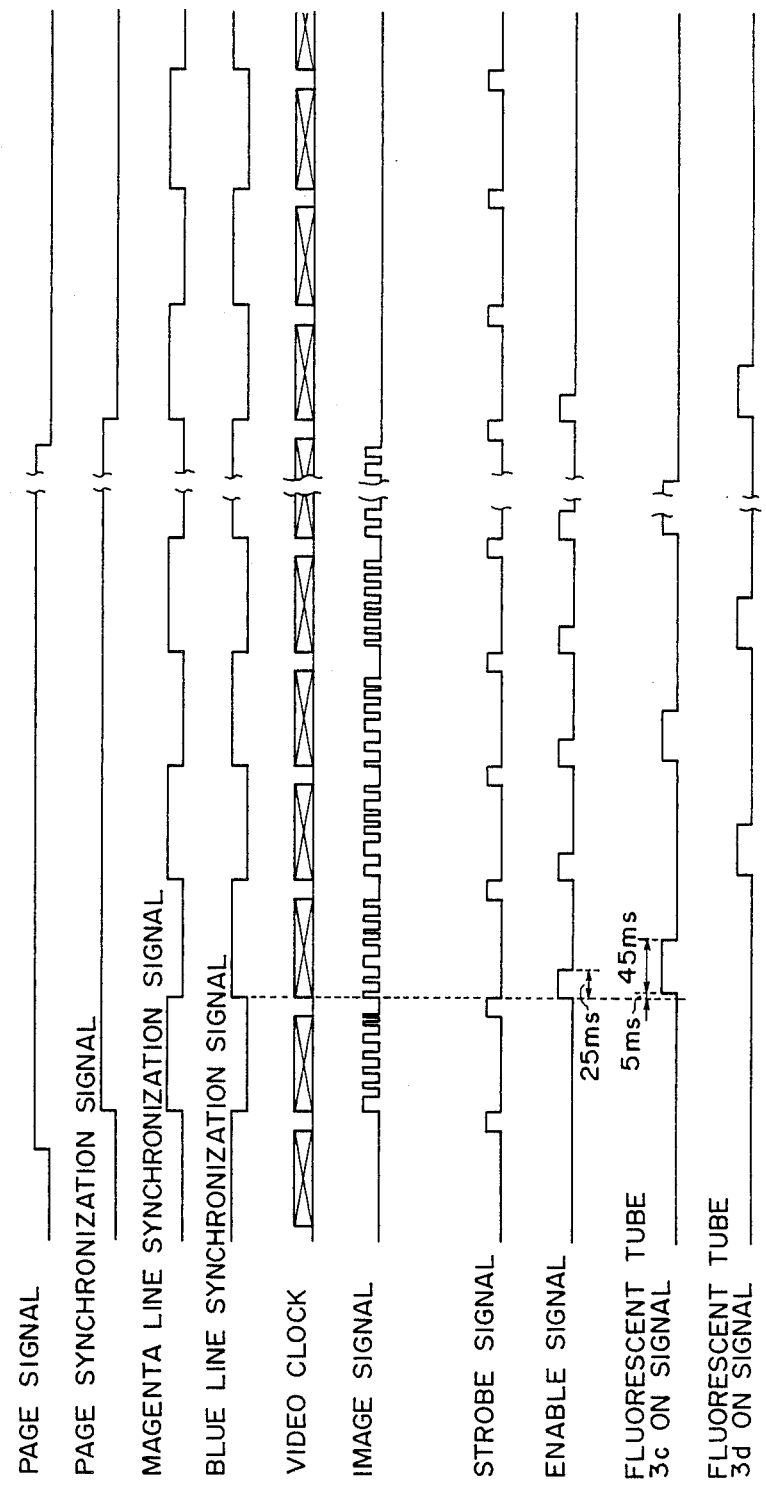
FIGS. 9A and 9B are timing charts thereof.
Figure 9B:
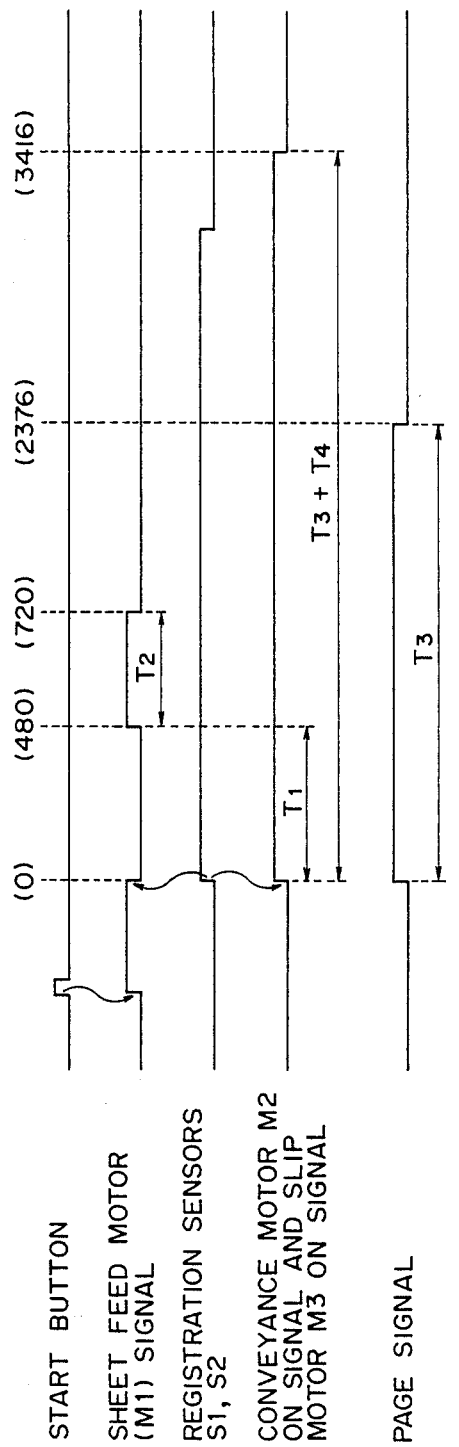

Next, description will be made of the operation of the CPU 20 which transmits the respective signals, as shown in FIG. 9B.

The CPU 20 receives an input of the magenta line synchronization signal via the interface 21, and counts its numbers by a software counter. Since the magenta line synchronization signal has a period of 200 m.sec., the CPU is able to control the time by counting the numbers.

The numbers in the upper parentheses shown in FIG. 9 B shows the numbers of the magenta line synchronization signal at each point of time when the magenta line synchronization signal at the time when the registration sensor is set to high is assumed to be a 0th number. The CPU 20 incorporates a sequence table which is described below, and transmits the sheet feed motor (M1) ON signal, the conveyance motor (M2) ON signal, the scraping motor (M3) ON signal, and the page signal consecutively by referring to the sequence table while counting the magenta line synchronization signal after signals of the registration sensors S1, S2 have become high.

Figure 12:
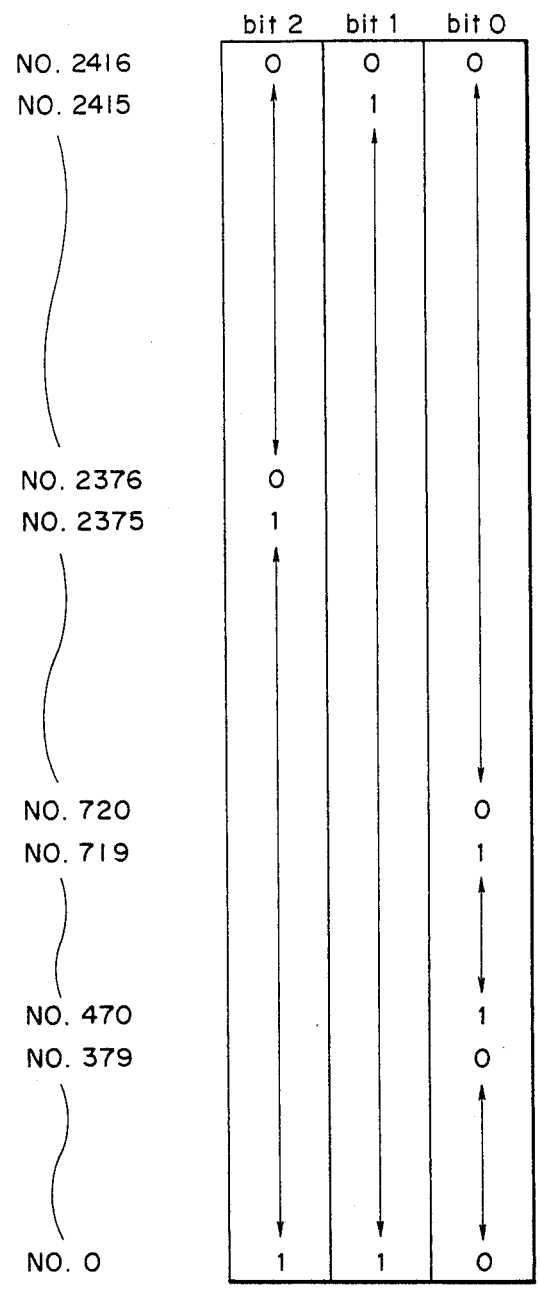
FIG. 12 is a sequence table.

Incidentally, as shown in FIG. 12, the sequence table has a three-bit configuration, and comprises a total of 2417 words from the 0th word to the 2416th word. Bit 0, bit 1, bit 2 respectively correspond with the sheet feed motor (M1) ON signal, the conveyance motor (M2) ON signal, and the scraper motor (M3) ON signal.

Figure 10:
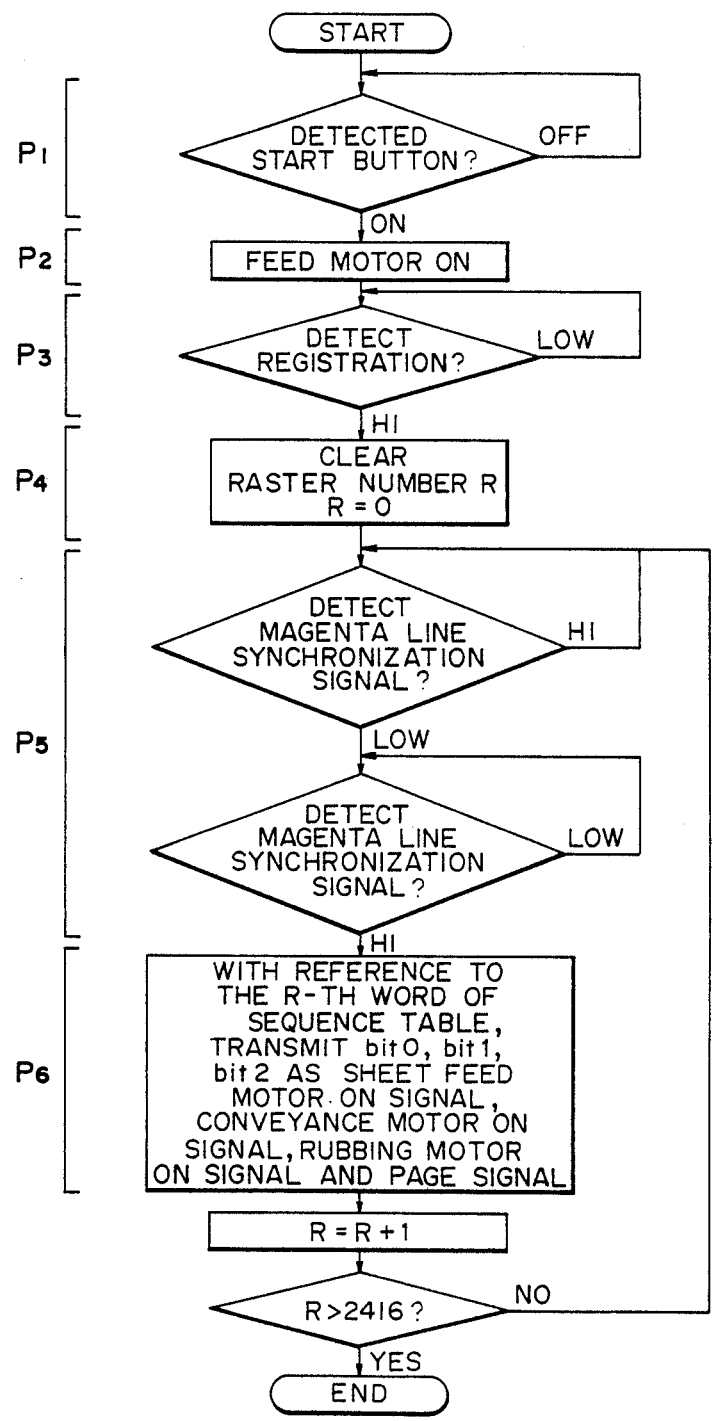
FIG. 10 is a flow chart thereof.

Description will now be made of a series of operations of the CPU 20 with reference to the flowchart of FIG. 10.

First, in $P_1$, detection is carried out as to whether or not the start button on the operation panel has been pressed. If Yes is the answer, the operation proceeds to Phd 2 to transmit the sheet feed motor (M1) ON signal. After waiting for the registration sensor to be set to high in $P_3$, the operation then proceeds to $P_4$. Since control is subsequently effected by referring to the sequence table, the ranster number to be referred to is shown in $P_4$. 0 is substituted for R. In $P_5$, after waiting for the magenta line synchronization signal to become low, the operation waits for said signal to become high. In other words, in $P_5$, the rising edge of the magenta line synchronization signal is detected, upon which the operation proceeds to $P_6$. In $P_6$, by referring to the Rth word in the sequence table, bits 0, 1 and 2 are transmitted as the sheet feed motor (M1) ON signal, the conveyance motor (M2) ON signal, the page signal, and the scraper motor (M3) ON signal, respectively. In $P_7$, 1 is added to the value of R, and determination is made in $P_8$ as to whether or not R is greater than 2416. If NO is the answer, the operation returns to $P_5$, while, if YES is the answer, the operation is completed.

The microcomputer controls the apparatus in the above-described procedure.

Another embodiment of the present invention will be described with reference to FIGS. 13 to 19. Incidentally, in the embodiment described below, the same components as those of the foregoing embodiment are denoted by the same reference numerals, and description thereof will be omitted.

In this embodiment, microcapsule-like image forming elements were formed by the same method as that of the foregoing embodiment by using the components shown in Tables 3 and 4 in place of the components shown in Tables 1 and 2.

TABLE 3

| Item | Component | wt. % |
| --- | --- | --- |
| Polymerizable prepolymer | $(CH_2=CHCOOCH_2.CH_2.O.\ CO.NH-\langle H \rangle-)_2-CH_2$ | 68 |
| Reaction initiator | Irgacure-184 (mfd. by Ciba-Geigy Corp.)/ethyl-p-dimethyl-amino-benzoate | 2/2 |
| Binder | Elvasite 2041 (mfd. by Du Pont) | 23 |
| Colorant | Sumitone Carmine (mfd. by Sumitomo Chemical Co., Ltd. | 5 |

TABLE 4

| Item | Component | wt. % |
| --- | --- | --- |
| Polymerizable prepolymer | $(CH_2=CHCOOCH_2.CH_2.O.\ CO.NH-\langle H \rangle-)_2-CH_2$ | 68 |
| Reaction initiator | 2-chlorothioxanthone/ ethyl-p-dimethyl-amino-benzoate | 1.4/2 |
| Binder | Elvasite 2041 (mfd. by Du Pont) | 23.6 |
| Colorant | Lionel Blue (mfd. by Toyo Ink Mfg. Co., Ltd. | 5 |

The transfer recording medium 1 is arranged by causing image forming elements, formed by the same manufacturing method as that of the foregoing embodiment, to be adhered to the substrate 1a by means of the adhesive 1f.

To describe this transfer recording medium 1 in greater detail, the adhesive 1f in which 1 g of a polyester adhesive Polyester SP-170 manufactured by The Nippon Synthetic Chemical Industry Co., Ltd. is dissolved in 5 cc of toluene is applied to the substrate 1a constituted by a 6 μm-thick polyethylene terephthalate film. Subsequently, when the solvent was removed by drying and its thickness was measured, the thickness was approximately 1 μm. Since this adhesive 1f had a glass transition point of $-20°$ C., slight tack remained even at room temperature, so that it was possible to cause the image forming elements thus formed to be readily adhered to the substrate 1a.

Subsequently, the transfer recording medium 1 was prepared by causing the image forming elements to be firmly fixed to the substrate 1a by applying a pressure of about 10 kg/cm$^2$ and a heat energy of about 80° C.

Figure 13:
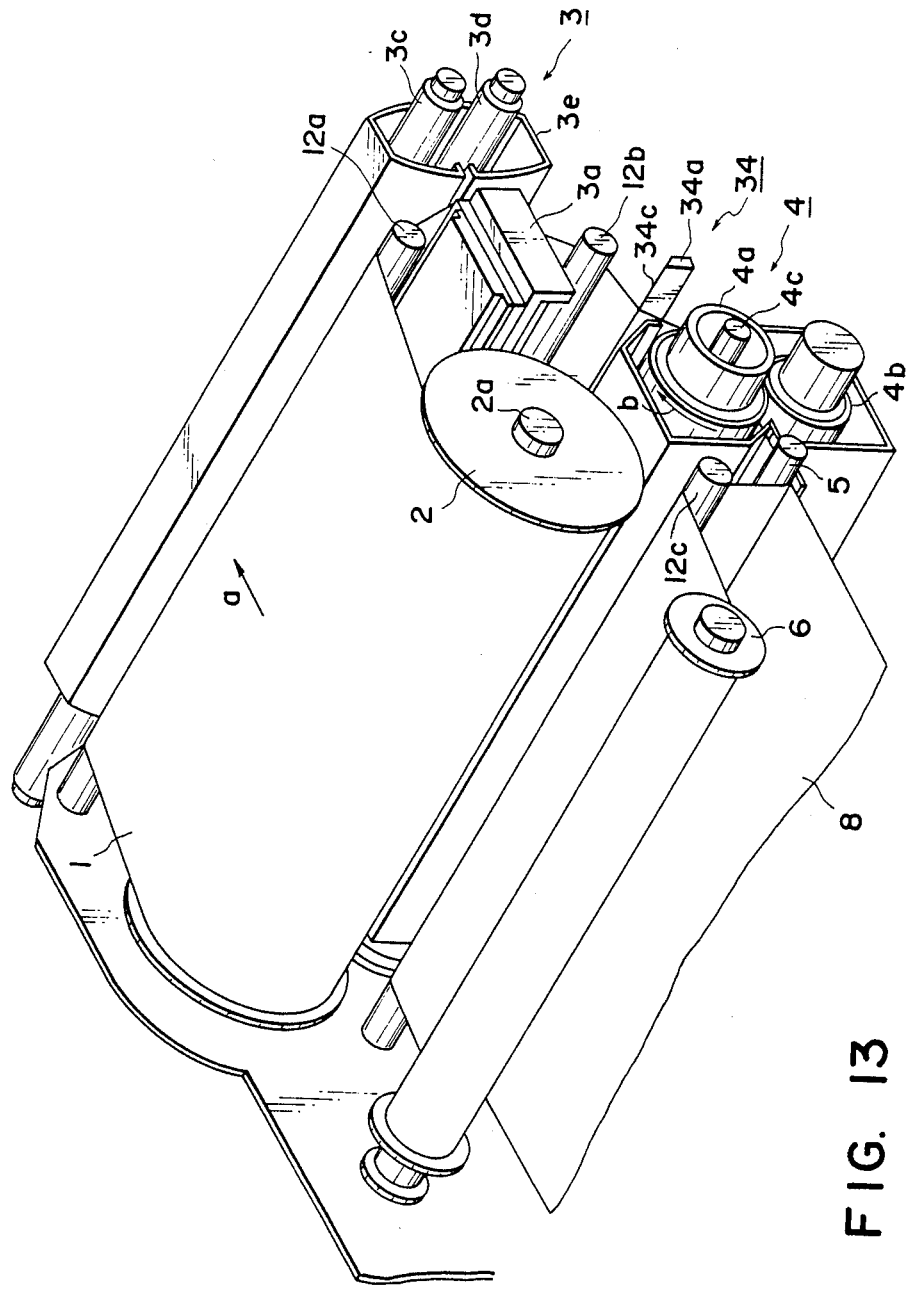
FIG. 13 is a schematic perspective view of an image recording apparatus to which another embodiment of the present invention is applied.
Figure 14:
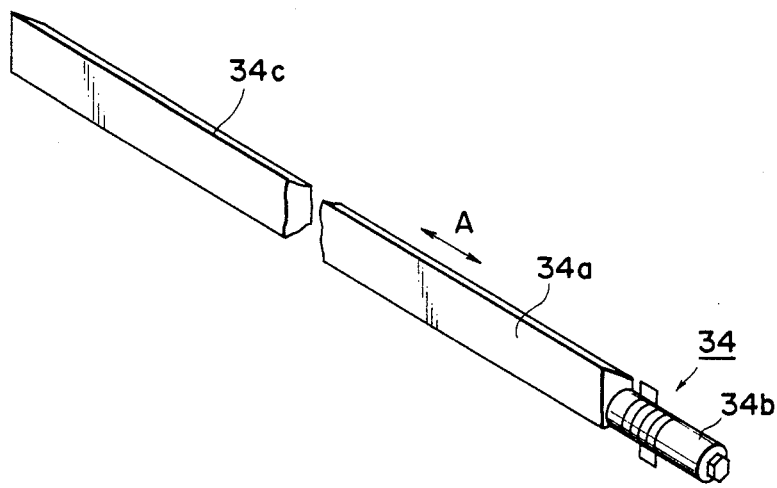
FIG. 14 is a diagram schematically illustrating a contacting member.

In this embodiment, as shown in FIGS. 13 and 14, a surface scraping means 34 is provided between the recording section 3 and the transfer section 4. This surface scraping means 34 comprises a contacting member 34a for contacting the transfer recording layer 1b as well as a vibrating means 34b for vibrating the contacting member 34a.

In this embodiment, the contacting member 34a is constituted by a stainless steel which is provided with a sharp edge 34c at a contacting side thereof, as shown in FIG. 14. The surface scraping means 34 is installed on the frame in such a manner that the edge 34c is brought into pressure contact with the transfer recording layer 1b and is capable of vibrating in the state of pressure contact. Incidentally, the pressure-contacting force is imparted by a winding angle between the transfer recording medium 1 and the contacting member 34a as well as the tension applied to the transfer recording medium 1. In this embodiment, this pressure-contacting force is set to approximately 30 kg/cm$^2$.

As shown in FIG. 14, the vibrating means 34b is arranged such that an about 10-Watt Langevin-type electrostriction vibrator tightened by a bolt is installed at an end portion of the contacting member 34a.

The arrangement is such that a thin surface layer of the transfer recording layer composed of the shells 1e and the cores 1c, 1d is scraped off as the vibrating means 34b is vibrated at a resonance frequency of 30 kHz, thereby causing the contacting member 34a to vibrate within a range of approximately 15 μm perpendicularly of the advancing direction of the transfer recording medium 1.

Description will now be made of the operation in cases where recording is effected by the image recording apparatus provided with the above-described surface scraping means 34.

Figure 15:
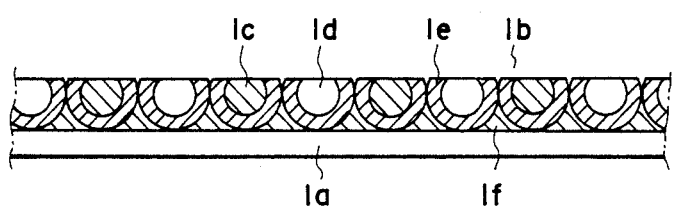
FIG. 15 is a diagram schematically illustrating a transfer recording layer whose this surface layer has been scraped off.

A thin surface layer of the transfer recording layer 1b of the transfer recording medium 1, on which an image has been formed in the same procedure as that of the foregoing embodiment, is scraped off by the surface scraping means 34. In other words, when the edge 34c of the contacting member 34a which has been brought into pressure contact with the transfer recording layer 1b vibrates by means of the vibrating means 34b, a thin surface layer of the transfer recording layer constituted by the image forming elements having the shells 1e and the cores 1c, 1d is scraped off, with the result that the cores 1c, 1d become exposed, as shown in FIG. 15.

If the transfer recording layer 1b in the aforementioned state is heated in the transfer section 4 while being held in pressure contact with the recording sheet 8, an image of the two colors of blue and magenta is transferred onto the recording sheet 8. At that juncture, since the cores 1c, 1d of the image forming elements are exposed, as described above, the difference between the cores 1c and 1d in which the transfer characteristics have undergone change in the recording section 3 appears more noticeably, with the result that the quality of the image transferred onto the recording sheet 8 becomes stable.

The transfer recording medium 1 and the recording sheet 8 which have passed through the transfer section 4 are separated from each other by the release roller 5. The recording sheet 8 on which recording of an image with desired colors has been effected is discharged onto the discharge tray 11 by means of the pair of discharge rollers 13a, 13b, while the transfer recording medium 1 is taken up by the takeup roll 6.

Figure 16:
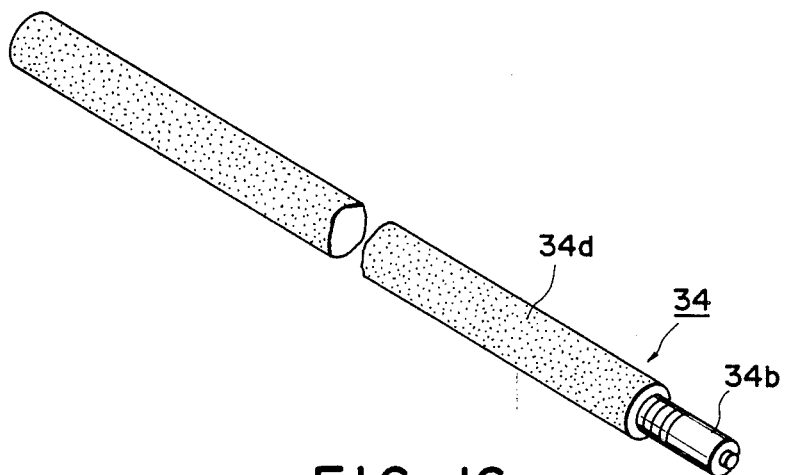
FIG. 16 is a diagram schematically illustrating another example of the contacting member.

In addition, although, in the above-described embodiment, the sharp edge-type contacting member 34a is used as the surface scraping means 34, a thin surface layer of the transfer recording layer 1b may be scraped off if a roller-shaped member 34d whose surface has very small protrusions of 1–5 S or thereabout, as shown in FIG. 16, is brought into contact with the transfer recording layer 1b and vibrated.

Figure 17:
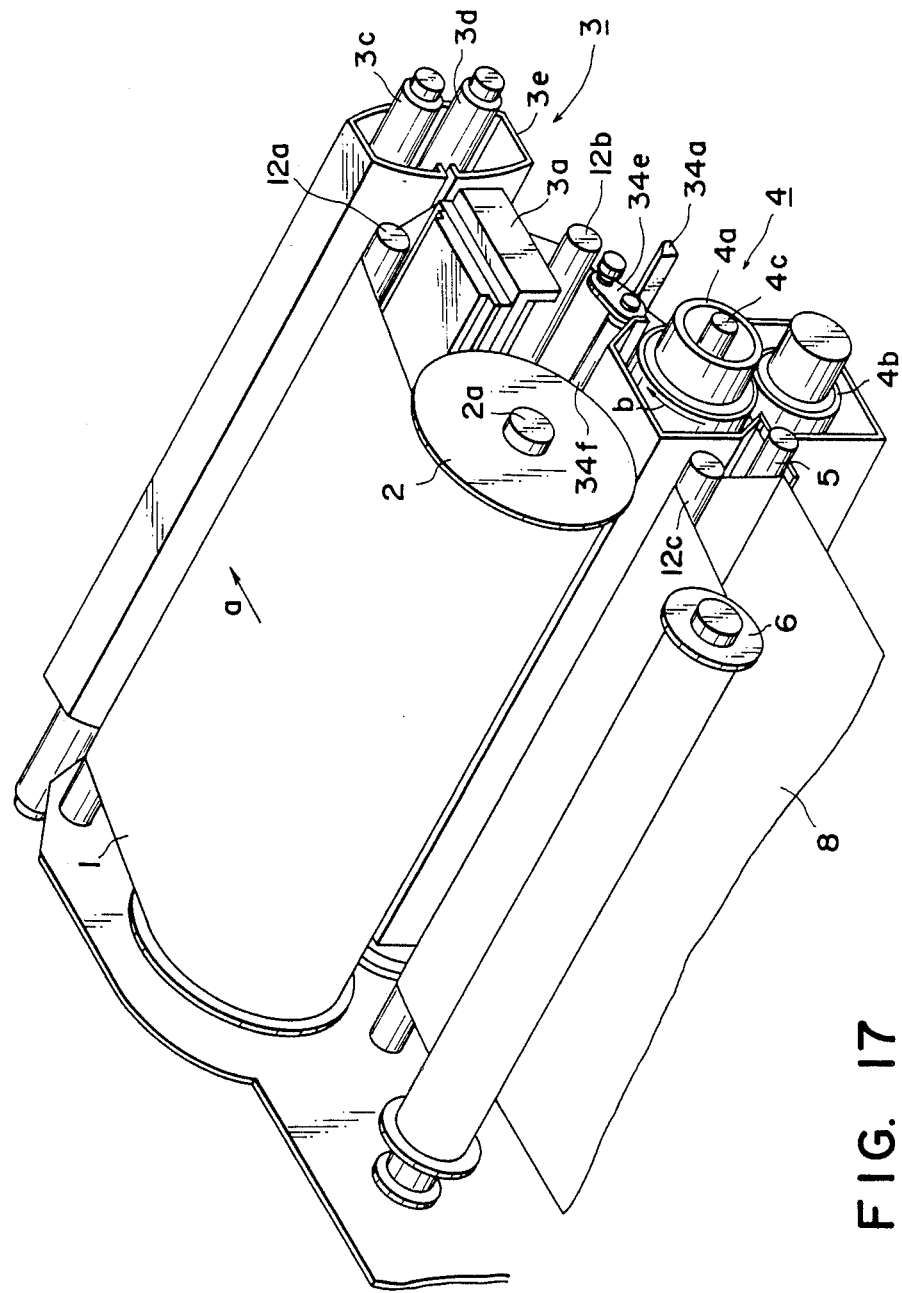
FIG. 17 is a diagram schematically illustrating another example of the present invention illustrating the pressing by the contacting member.

Furthermore, as for the method of bringing the contacting member 34a into pressure contact with the transfer recording layer 1b, in addition to the method based on the tension of the transfer recording medium 1 as in the aforementioned embodiment, an alternative arrangement may be adopted in which, as shown in FIG. 17, a rubber roller 34f is disposed on the substrate 1a side of the transfer recording medium 1, and the contacting member 34a is pressed against the roller 34f by means of a spring 34e or the like by clamping the transfer recording medium 1.

Moreover, as for the vibrating means 34b, in addition to the electrostrictive vibrator, an arrangement may alternatively be provided such that vibration is effected by the use of a magnetostrictive vibrator, the forward and reverse rotation of a voice-coil type actuator motor, or a cam.

Figure 18:
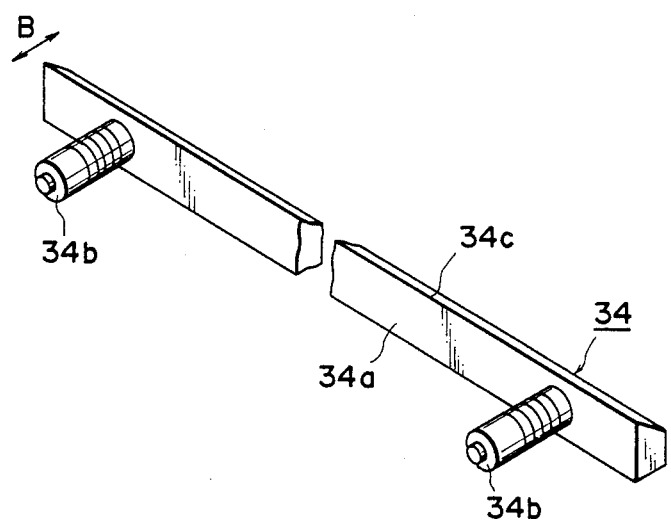
FIGS. 18 and 19 are explanatory diagrams of other examples of the contacting member illustrating its vibrating directions.

With respect to the vibrating direction as well, it is not necessary to restrict it to the direction perpendicular to the conveying direction of the transfer recording medium 1 as in the above-described embodiment, and the vibration may be effected in the advancing direction (in the direction of the arrow B), as shown in FIG. 18.

Figure 19:
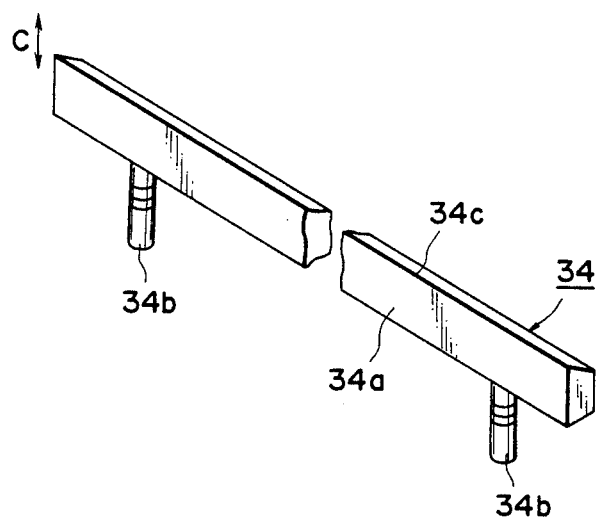
Figure 20:
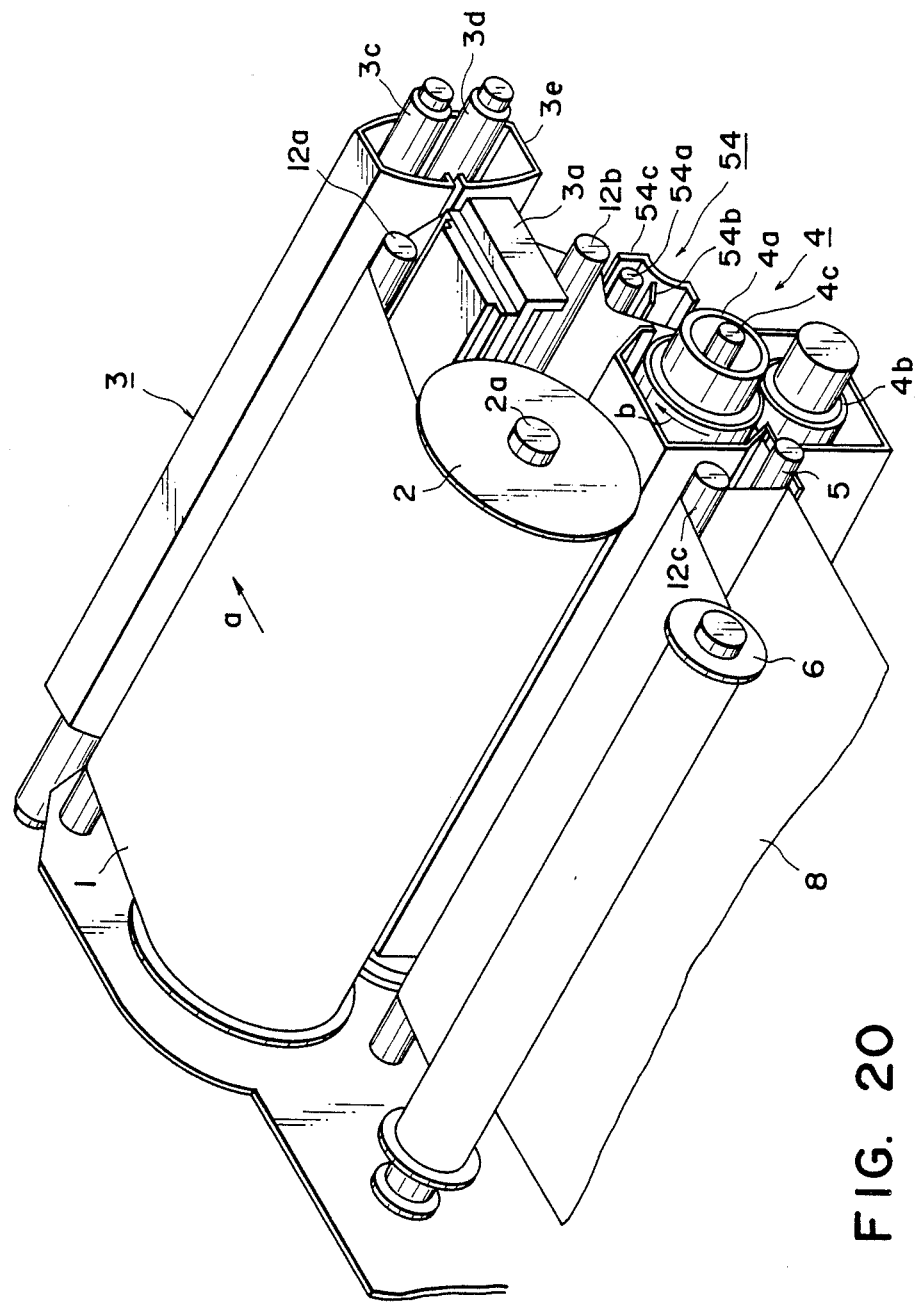
FIG. 20 is a schematic diagram of an image recording apparatus to which still another embodiment of the present invention is applied.

Similarly, the transfer recording medium 1 may be vibrated in the vertical direction (in the direction of the arrow C), as shown in FIG. 19. It is also possible for the vibration to be effected by combining the vibrating directions shown in FIGS. 14, 18, and 19, e.g., a circular or a elliptical shape.

As described above, in accordance with the present invention, since a thin surface layer of the transfer recording layer is scraped off by vibrating the contacting member before an image formed on the transfer recording medium in the recording section is transferred onto the recording medium, there are advantages in that the transfer of the transfer image onto the recording medium is facilitated, and that a stable transferred image can be obtained.

A still another embodiment of the present invention will be made hereafter with reference to FIGS. 20 to 23.

In the embodiment which is described below, a scraping means 54 for scraping off and removing a surface layer of the image forming elements of the transfer recording medium 1 is disposed between the recording section 3 and the transfer section 4. The scraping means 54 comprises a scraping means 54a for scraping off the surfaces of the image forming elements as well as a removing means for removing the cores or walls of the image forming elements from the transfer recording layer 1b. In this embodiment, a stainless steel roller with its surface sandblasted is arranged as the scraping means 54a in contact with the transfer recording layer 1b such as to be rotatable. As for the removing means 54b, a soft brush, such as a de-electrifying brush, is lightly pressed against the transfer recording layer 1b. Incidentally, a pan in which the removed substances are accumulated is provided below the brush 54b.

Description will be made hereafter of the operation in cases where recording is effected using the image recording apparatus having the above-described scraping means 54.

Figure 21:
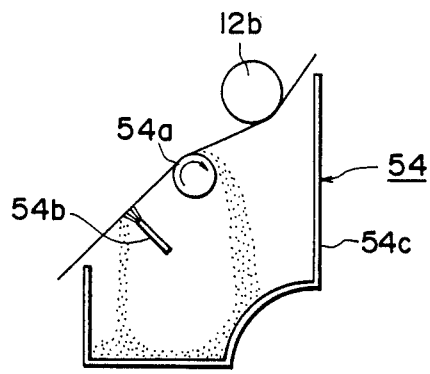
FIG. 21 is a diagram explaining an arrangement in which the surface layer of image forming elements are scraped and removed.
Figure 22:
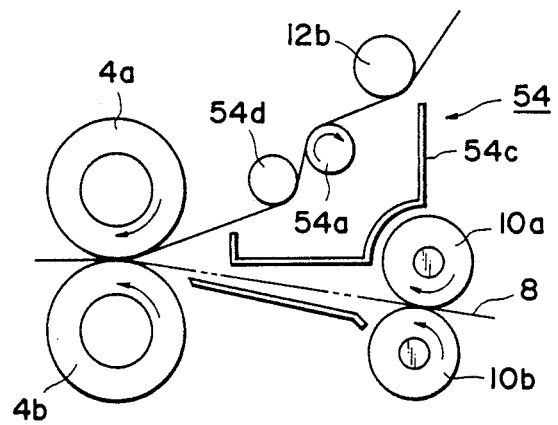
FIGS. 22 and 23 are diagrams illustrating other examples of removing means.

When the transfer recording medium 1 reaches the scraping means 54 after passing through the recording section 3, the surface of the image forming elements are scraped by the steel roller 54 with its surface sandblasted, as shown in FIG. 21, and its thin surface layer (approx. 2 to 3 μm) is scraped off, thereby causing the cores 1c, 1d to be exposed. Even if the scraped-off portions of the cores 1c, 1d and the shells 1e of the image forming elements remain on the transfer recording medium 1, they are removed completely by the removing brush 54b, so that the transfer recording layer 1b is conveyed to the transfer section 4 with the cores 1c, 1d completely exposed.

When the transfer recording medium 1 is conveyed to the transfer section together with the recording sheet 8, the transfer recording layer 1b and the recording sheet 8 are heated in a pressure-contacted state, thereby transferring the image of the two colors of blue and magenta onto the recording sheet 8. At this juncture, since the cores 1c, 1d of the image forming elements are exposed, as described above, the difference of the cores 1c, 1d whose transfer characteristics formed in the recording section 3 appears more noticeably, with the result that the quality of the image transferred onto the recording sheet 8 is stabilized.

The transfer recording medium 1 and the recording sheet which have passed through the transfer section 4 are separated from each other by the release roller 5. The recording sheet 8 on which recording of an image with desired colors has been effected is discharged onto the discharge tray 11 by means of the pair of discharge rollers 13a, 13b, while the transfer recording medium 1 is taken up by the takeup roll 6.

As described above, two-color recording is effected at one time.

Incidentally, although, in the foregoing embodiment, an example is shown in which the brush 54b is used as the removing means, an arrangement may alternatively be provided such that a deflection bar 54d is used in place of the brush 54b to deflect the transfer recording medium 1 downwardly If this arrangement is made, the residual substances scraped off by the steel roller 54a drop onto the pan 54c by the gravity.

Figure 23:
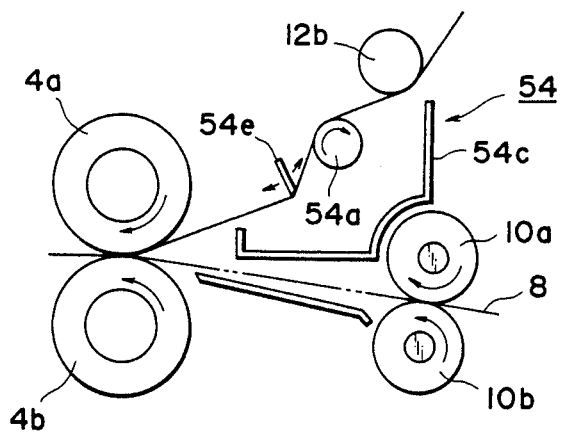

In addition, the removing means may alternatively be arranged in such a manner that the vibrating member 54e is brought into contact with the transfer recording medium 1, as shown in FIG. 23. Namely, an arrangement may be provided such that the residual substances are caused to drop by vibrating the vibrating member 54e by means of a driving means (not shown) (e.g., a piezoelectric element) in the direction of the arrow or in the direction perpendicular to the advancing direction of the transfer recording medium 1.

Furthermore, as for the means 54 for removing the residual substances, the following alternative arrangements may be adopted: one in which an air flow is used (e.g., one in which air is blown to the transfer recording layer 1b or air is sucked therefrom); one in which a member having an electrostatic force is disposed adjacent to the transfer recording layer 1b; and one in which a viscose member is lightly brought into contact with the transfer recording layer 1b.

As described above, since a thin surface layer of the transfer recording layer is scraped off before an image formed on the transfer recording medium has been formed in the recording section is transferred onto the recording medium, it is possible to positively transfer the transfer image onto the recording medium, with the result that a high-quality image free of image noise can be obtained.

Figure 24:
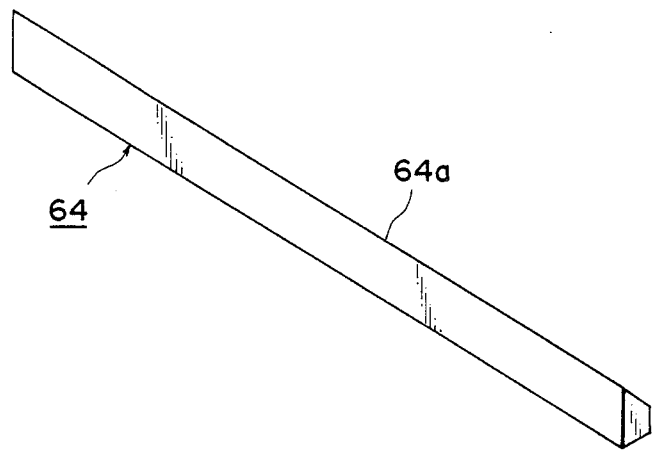
FIGS. 24 and 25 are perspective views of other examples of the scraping member.
Figure 25:
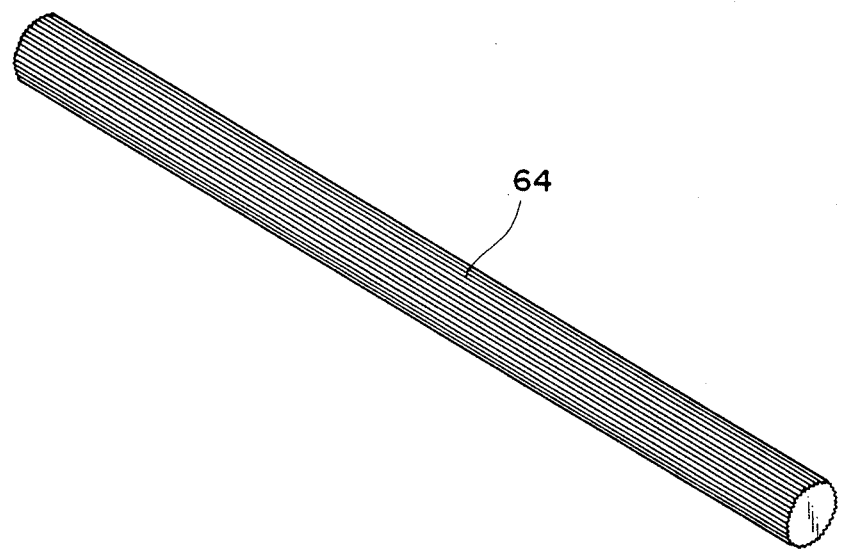

A still further embodiment of the present invention will be described with reference to FIGS. 24 and 25.

In this embodiment, microcapsule-like image forming elements are formed using the components shown in Tables 3 and 4. The process employed in adhering these image forming elements to the substrate 1a is described below.

Specifically, the adhesive 1f in which polyester adhesive Polyester LP-022 (solid content: 50%) manufactured by The Nippon Synthetic Chemical Industry Co., Ltd. is dissolved in toluene at a mixing ratio of 1 cc to 3 cc is applied to the substrate 1a constituted by a 6 μm-thick polyethylene terephthalate. Subsequently, the solvent is removed by drying. When its thickness was measured, it was approximately 1 μm. Since this adhesive 1f has a glass transition point of −15° C., slight tack remains at room temperature, so that the image forming elements formed as described above can be adhered readily to the substrate 1a.

Next, microcapsule-like image forming elements having as cores the components obtained in the above-described procedure and shown in Tables 3 and 4 were mixed at a ratio of 1:1, and they were sprayed onto the substrate 1a so as to be adhered thereto. Subsequently, when surplus image forming elements were brushed off, the remaining 90% of the image forming elements were disposed on the adhesive layer as a substantially single layer thereof.

Subsequently, a pressure of approximately 1 kg/cm$^2$ and heat energy of approximately 80° C. were applied to the image forming elements so as to cause them to be firmly secured to the substrate 1a, thereby obtaining the transfer recording medium 1.

Figure 26:
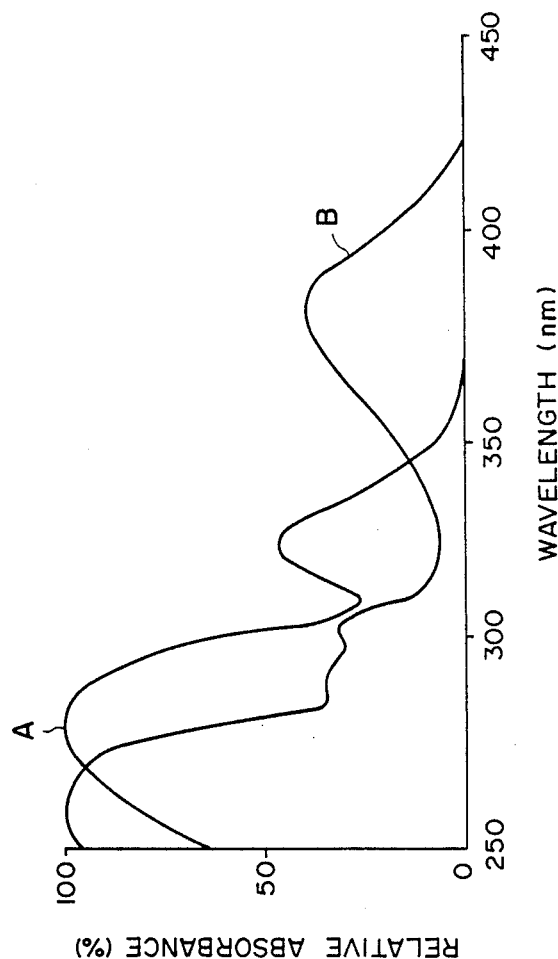
FIG. 26 is a diagram explaining the light absorption characteristics of reaction initiators contained in the transfer recording medium.

The reaction initiator contained in the image forming elements and shown in Table 3 starts reaction by absorbing light in the range of Curve A in the light absorbing characteristics shown in FIG. 26 and assumes a color of magenta at the time of image formation. Meanwhile, the reaction initiator contained in the image forming elements and shown in Table 4 starts reaction by absorbing light in the range of Curve B of FIG. 26 and assumes a color of blue at the time of image formation.

To describe a scraping bar 64 which constitutes the scraping member in this example, the scraping bar 64 is installed between the recording section 3 and the transfer section 4 in the advancing route of the transfer recording medium 1, as shown in FIG. 13, in such a manner as to be brought into pressure contact with the transfer recording layer 1b of the transfer recording medium 1 with a pressure of approximately 0.2 kg/cm$^2$.

In addition, the scraping bar 64 is constituted by a stainless steel, and is arranged such that its edge portion 64a is formed as a sharp knife and the edge portion 64a is held in pressure contact with the transfer recording layer 1b, thereby scraping off a thin surface layer thereof The transfer recording layer 1b on which a negative image is formed in the same manner as that described above is brought into pressure contact with the scraping bar 64, and its thin surface layer is scraped off by the knife-like edge portion 64a of the bar 64, thereby smoothing the surface of the transfer recording layer 1b.

To describe another example of the scraping member 14, in the foregoing embodiment, an example has been shown in which one scraping member 64 is disposed in the advancing route of the transfer recording medium 1, a plurality of the members 64 may be provided along the advancing route.

In addition, the scraping member 64 need not be restricted to the one described in the foregoing embodiment, and it suffices if it is capable of scraping off a thin surface layer of the transfer recording layer 1b. For instance, one arranged into the form of a knurling tool, as shown in FIG. 25, may be used.

A further embodiment of the present invention will be described with reference to FIGS. 27 to 31. An embodiment which will be described below makes it possible to divide and open the main body of the apparatus.

Figure 27:
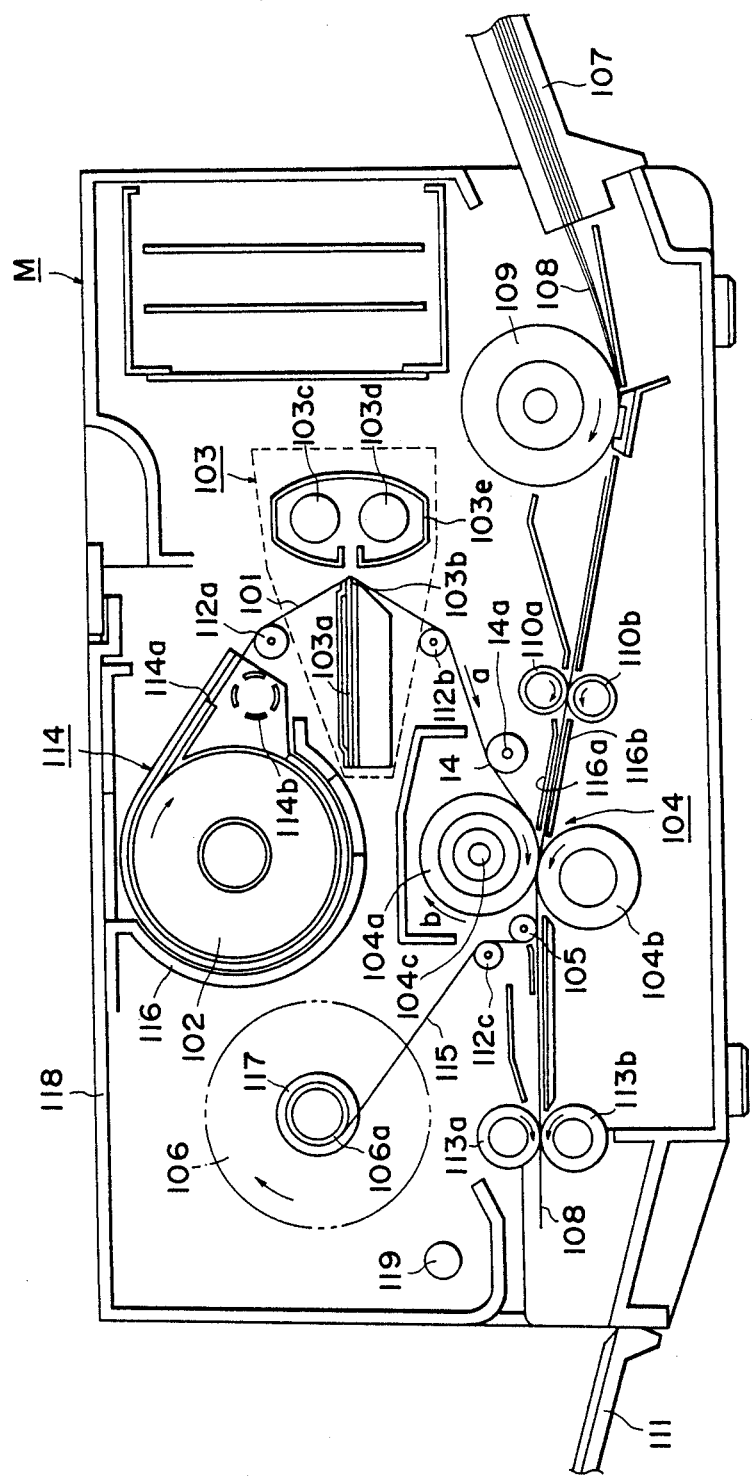
FIGS. 27 and 28 are overall schematic diagrams illustrating a further embodiment of the present invention.
Figure 28:
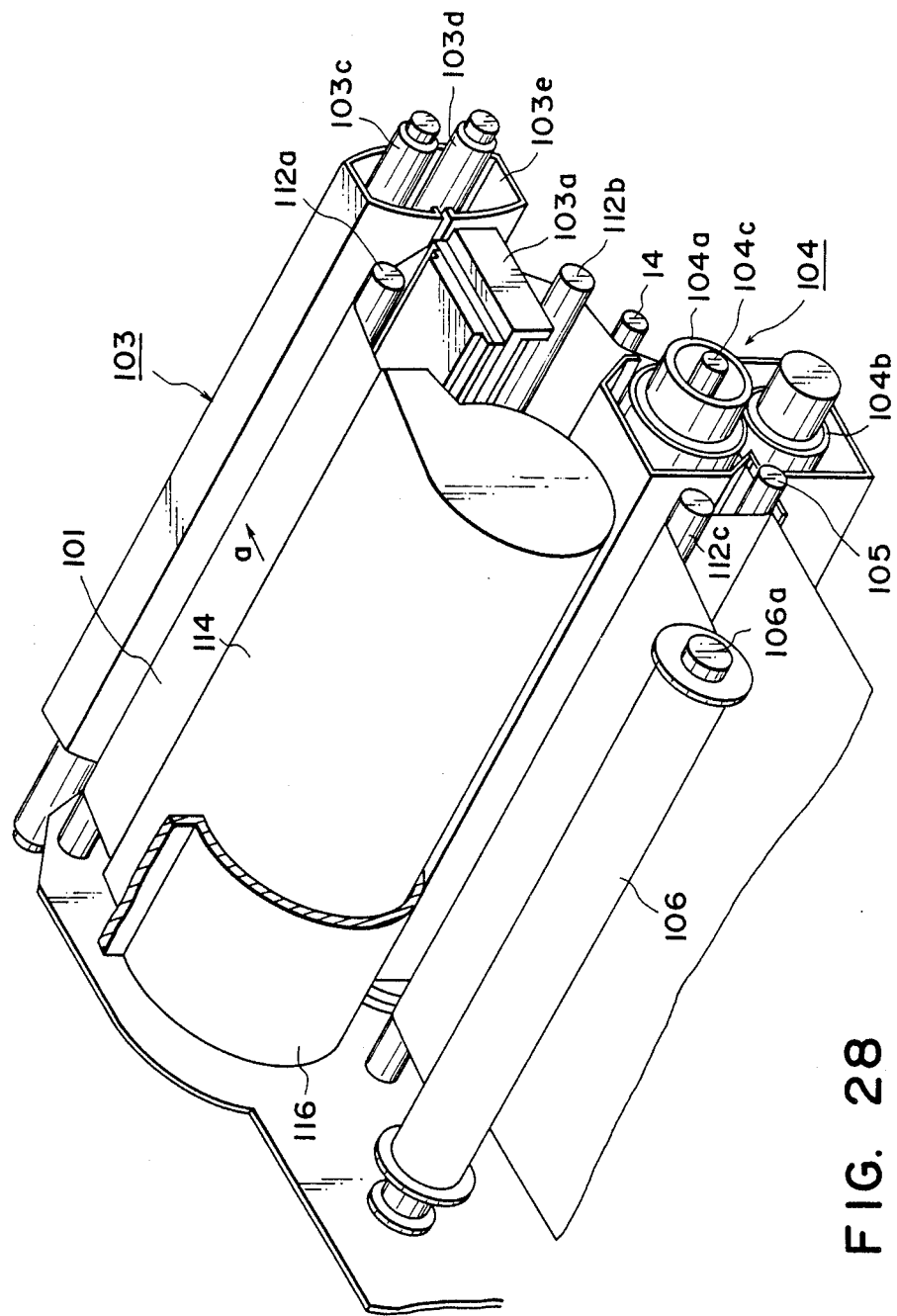
Figure 29:
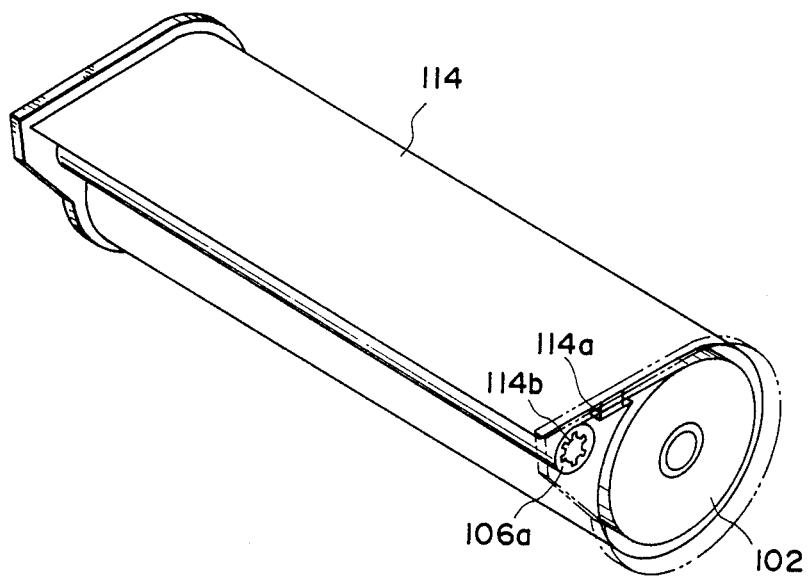
FIG. 29 is perspective view of a cassette.

FIG. 27 is a schematic cross-sectional view illustrating the image recording apparatus, FIG. 28 is an explanatory perspective view thereof, and FIG. 29 is a perspective view of a cassette.

In the drawings, reference numeral 101 denotes an elongated sheet-like transfer recording medium which is wound up into the form of a roll and is accommodated as a supply roll 102 in a transfer recording medium accommodating cassette 114, such as the one shown in FIG. 29, the cassette 114 being detachably incorporated in the main body M of the apparatus.

A leader 115 is connected to an end portion of the transfer recording medium 101 which is paid out from an outlet 114a of the cassette M14, and an end portion of the leader 115 is connected to a takeup shaft 106a. A boss 114b which is capable of detachably holding the takeup shaft 106a is disposed in the vicinity of the outlet 114a of the cassette 114.

Accordingly, if the takeup shaft 106a is removed from the boss 114b and is pulled out, the leader 115 and the transfer recording medium 101 can also be withdrawn. The leader 115 and the transfer recording medium 101 thus withdrawn are made to pass along a recording head 103 and a guide roller 112b, further pass between a transfer roller 104a and a pressure roller 104b, and are then redirected by a release roller 105 and a guide roller 112c. Then, the takeup shaft 106a is secured to a takeup joint 117. Subsequently, by rotatively driving the takeup joint 117 by means of a known driving means, the transfer recording medium 101 is paid out in the direction of the arrow a, and is taken up consecutively around the peripheral surface of the takeup shaft 106a.

Incidentally, a predetermined back tension is applied to the supply roll 102 by, for example, a hysteresis brake (not shown) during the taking-up operation. The arrangement is such that the transfer recording medium 101 is conveyed while being brought into pressure contact with the recording head 103a with a predetermined pressure and at a fixed angle with respect to the same.

Incidentally, since the arrangement of the respective parts is the same as that of the foregoing embodiments, description thereof will be omitted.

Recording sheets 108 constituting the recording medium are loaded in a cassette 107, and the arrangement is such that each of them is fed to the transfer section 104 in synchronization with the image area of the transfer recording medium 101 in such a manner as to overlap the same. A one-way clutch is provided to the shaft of the registration roller 110a so that the roller will be rotatable in the direction toward the transfer section 104.

Here, description will be made of a unit 118 for loading the transfer recording medium 101.

The unit 118 is provided with members constituting a advancing route of the transfer recording medium 101, i.e., a cassette loading section 116 for loading the cassette 114, the recording head 103a, the guide rollers 112a, 112b, the transfer roller 104a, the release roller 105, and the takeup joint 117. This unit 118 is pivotally secured to the main body M of the apparatus by means of a shaft 119, and is adapted such as to be pivoted 95 degrees in the direction of the arrow c openably with respect to the main body M of the apparatus, as shown in FIG. 30.

Description will now be made of cases where an image recording apparatus having the above-described arrangement is used.

Figure 30:
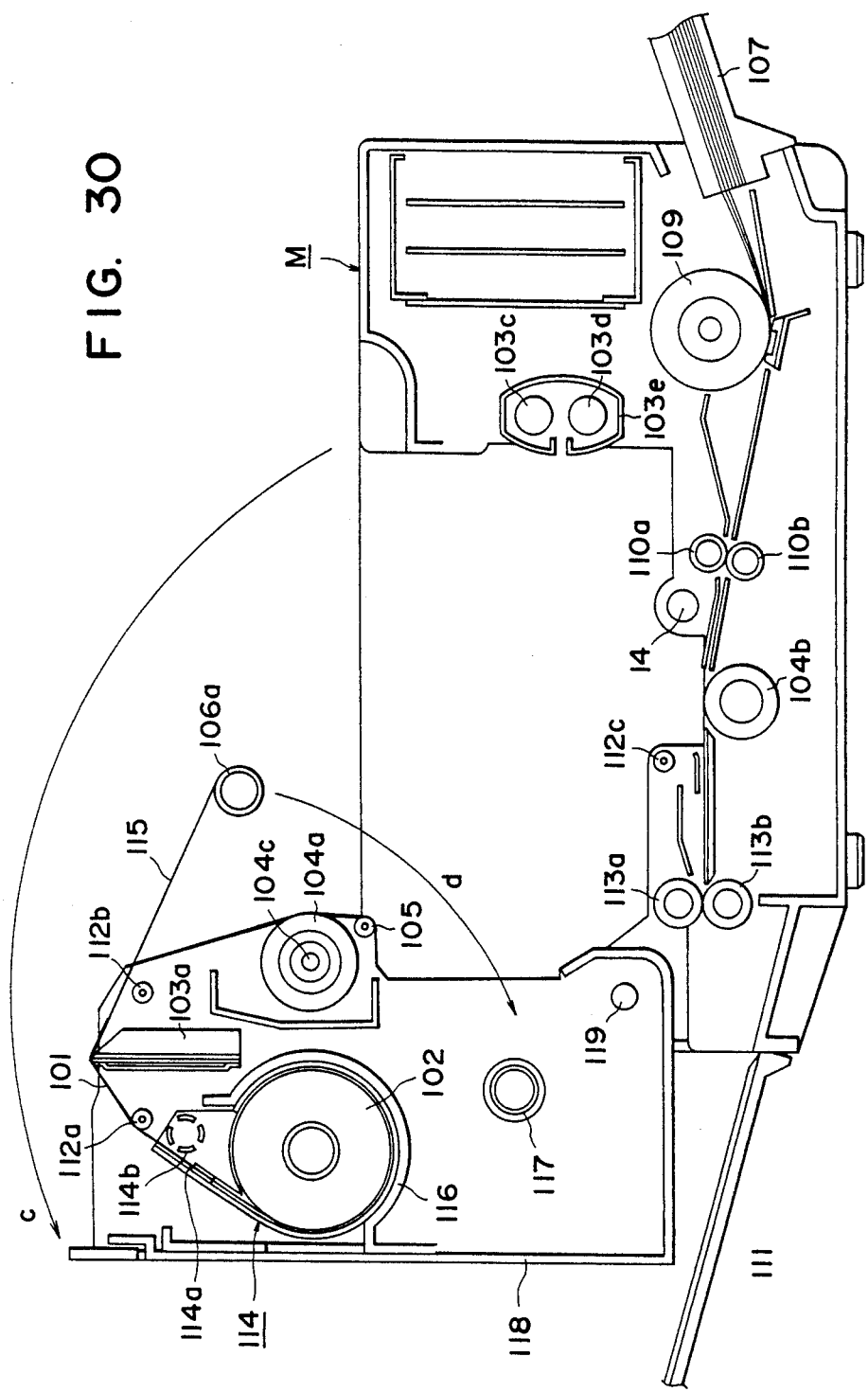
FIGS. 30 and 31 are explanatory cross-sectional views of the image recording apparatus with a unit opened with respect to a main body of the apparatus.
Figure 31:
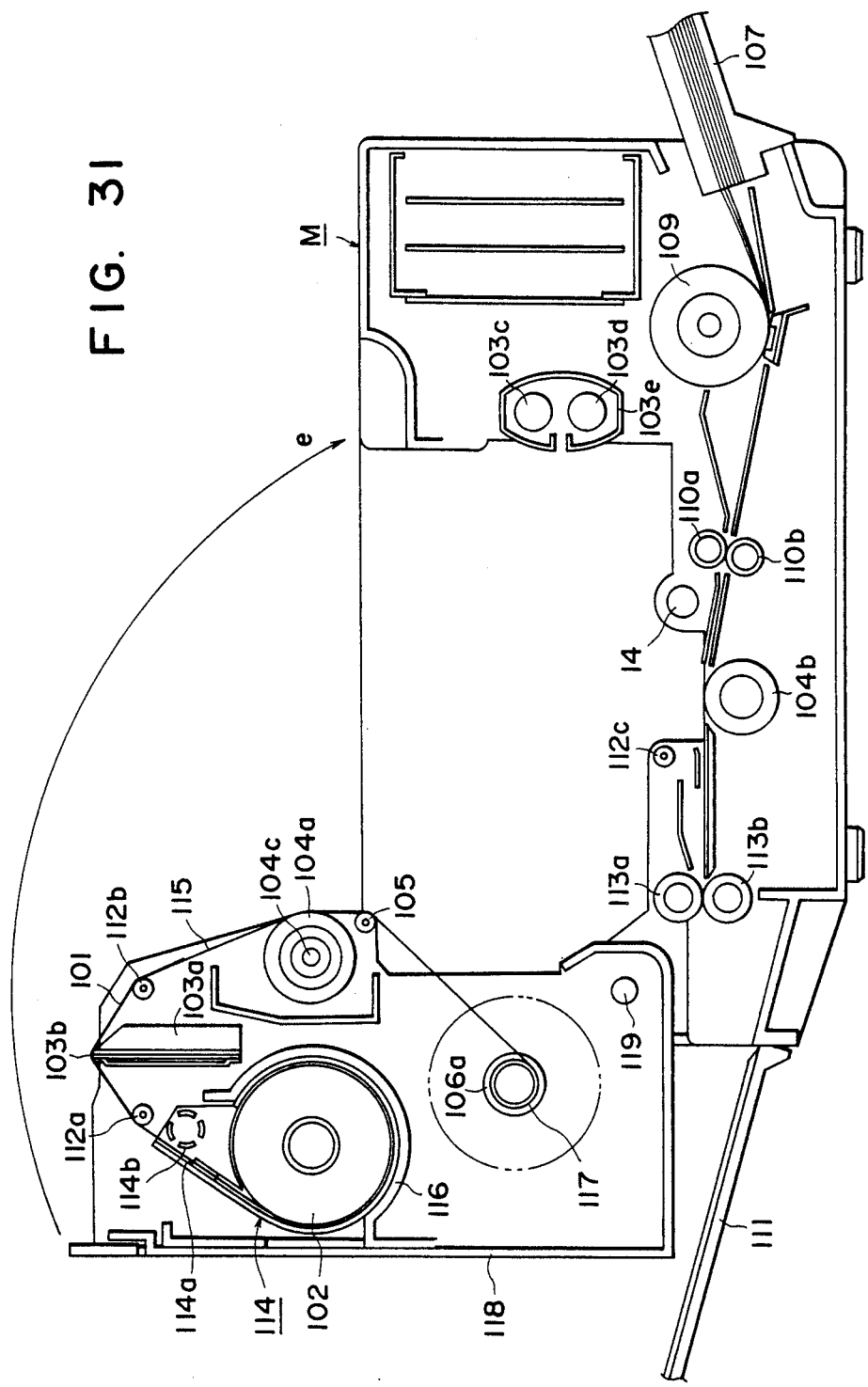
Figure 32:
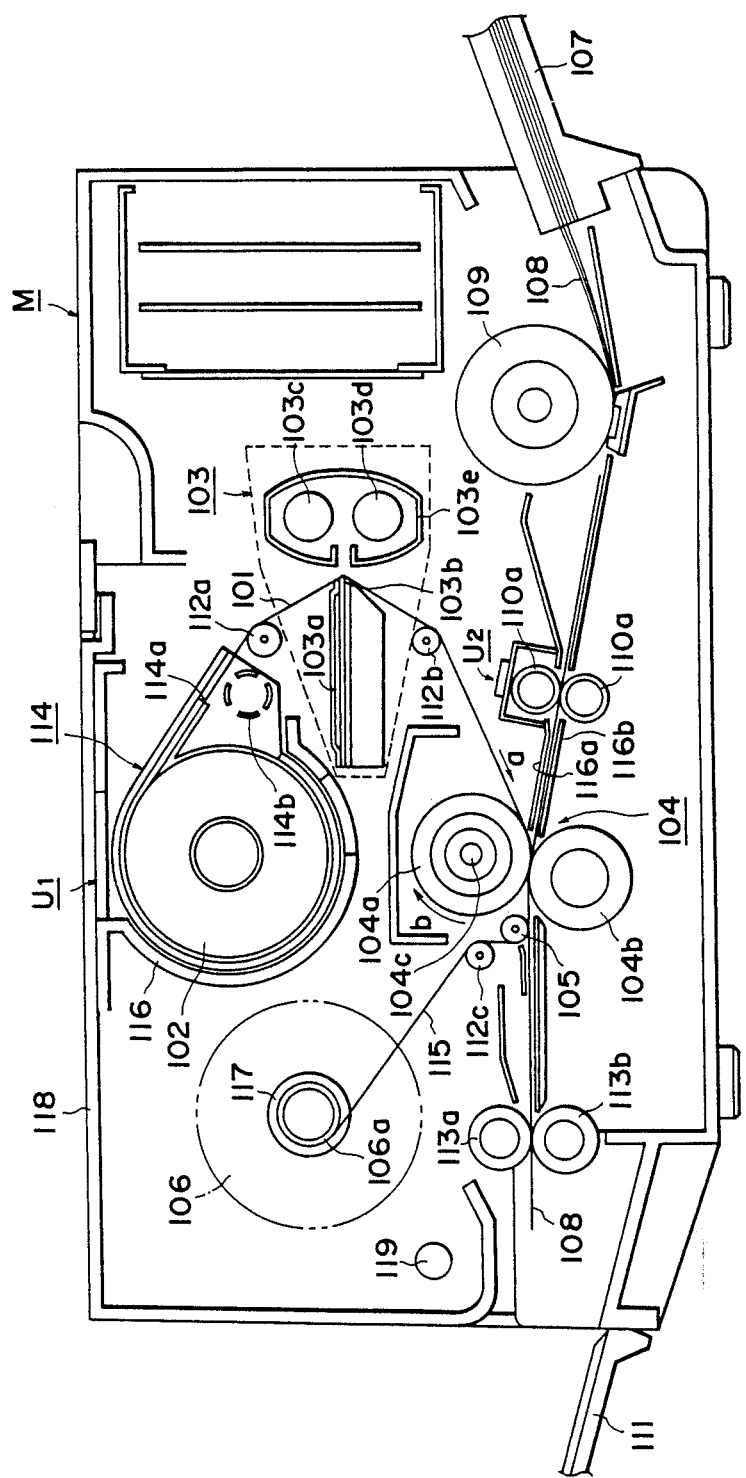
FIG. 32 is an overall schematic diagram of a still further embodiment of the present invention.

First, when the transfer recording medium 101 is loaded in the main body M of the apparatus, the unit 118 is rotated in the direction of the arrow c and is opened, as shown in FIG. 30. In this state, the interval between the recording head 103a and a housing 103e in the recording section 103 and the interval between the transfer roller 104a and the pressure roller 104b in the transfer section 104 are opened wide. In this state, if the cassette 14 in which the transfer recording medium 101 is accommodated is inserted into a cassette loading section 116 as viewed in FIG. 30 so as to effect loading, and if the takeup shaft 106a is removed from the boss 114b and is pulled out, the leader 115 and the transfer recording medium 101 can be pulled out. The leader 115 and the transfer recording medium 101 are made to pass along the guide roller 112a, the recording head 103a, the guide roller 112b, the transfer roller 104a, and the release roller 105, and the takeup shaft 106a is secured to the takeup joint 117. Next, as shown in FIG. 31, the unit 118 is rotated in the direction of the arrow e so as to be closed. If the unit 118 and the main body M of the apparatus are latched by means of a latching mechanism (not shown), the transfer recording medium 101 assumes a loaded state, a shown in FIG. 27.

As described above, if the unit 118 is separated from the main body M of the apparatus, the advancing route of the transfer recording medium 101 is opened wide apart from the main body M of the apparatus, and since a sufficient working space can be secured, the loading of the transfer recording medium 101 can be extremely facilitated.

Incidentally, although, in this embodiment, an example has been shown in which the scraping roller 14 is provided, it goes without saying that this embodiment can be applied to an image recording system which is not provided with the scraping roller.

As described above, according to the present invention, since the members constituting the advancing route of the transfer recording medium are made separable from the main body of the apparatus, the advancing route is opened wide at the time of loading the transfer recording medium, so that it is possible to secure a sufficiently large working space. Accordingly, the loading and replacing of the transfer recording medium can be extremely facilitated.

Another embodiment of the present invention will be described with reference to FIGS. 32 to 35.

This embodiment is arranged such that the members constituting an advancing route of the transfer recording medium 1 and a guide member for guiding the conveyance of the recording sheet 8 are respectively made separable from the main body M of the apparatus as a conveying unit $U_1$ and a guide unit $U_2$. Description will be made of this arrangement hereafter.

First of all, the members constituting the advancing route of the transfer recording medium 101, i.e., the cassette loading section for loading the cassette 114, the recording head 103a, the guide rollers 112a, 112b, the transfer roller 104a, the release roller 105, and the takeup joint 117, are made into a unit as a conveying unit $U_1$. The conveying unit Ul is pivotally secured to the main body M of the apparatus by means of the shaft 119 and so as to be pivoted approximately 95 degrees in the direction of the arrow c, as shown in FIG. 33A, and is thereby adapted to be openable with respect to the main body M of the apparatus.

Of the guide members 116a, 116b, the guide member 116a which guides the upper surface of the recording sheet 108 is made into a unit as the guide unit $U_2$, and is adapted to be detachable with respect to the conveying unit $U_1$ and the main body M of the apparatus.

An engaging/disengaging mechanism 120 for the guide unit $U_2$ is so arranged that an engaging projection 120a is provided on both sides of the lower end of the guide unit $U_2$, as shown in FIG. 33, a retaining lever 120b which is provided in the main body M of the apparatus is disposed on the retaining projection 120a such as to be retainable thereby. The guide unit U adapted to be retainable by the main body M of the apparatus by virtue of this retention. Furthermore, this retaining lever 120b is adapted to be pivotable with a shaft 120c as a center, as shown in FIG. 34, and an arm 120d is secured to the shaft 120c. If a latch lever 120f which pivots with a shaft 120e, fixed to the main body M of the apparatus, as a center is pivoted in the direction of the arrow d, the retaining lever 120b pivots in the direction of the arrow e, thereby canceling the state of retention by the retaining projection 120a.

In addition, a latch magnet 120g is fixed to an upper end of the guide unit $U_2$, the units $U_1$, $U_2$ are adapted to be detachable from each other as the magnet 120g is attached to or detached from the conveying unit $U_1$.

Incidentally, the conveying unit $U_1$ is provided with a latch lever 121b which is pivotable with a shaft 121a as a center, as shown in FIG. 34. The arrangement is such that the latch lever 121b can be latched with the main body M of the apparatus, and if the latch lever 121b is pivoted in the direction of the arrow f, the latch between the lever 121b and the main body M of the apparatus is canceled.

Description will now be made of a case where the image recording apparatus thus constructed is used.

First, when the transfer recording medium 1 is loaded in the main body M of the apparatus, the latch with the main body M of the apparatus is canceled by pivoting the latch lever 121b shown in FIG. 34 in the direction of the arrow f, and the conveying unit U pivoted in the direction of the arrow c, as shown in FIG. 33A, so as to open the same. At that juncture, as for the guide unit $U_2$, since the retaining projection 120a is engaged with the retaining lever 120b, the latch magnet 120g is separated from the conveying unit $U_1$, and the conveying unit $U_1$ alone is separated from the main body M of the apparatus.

Figure 33B:
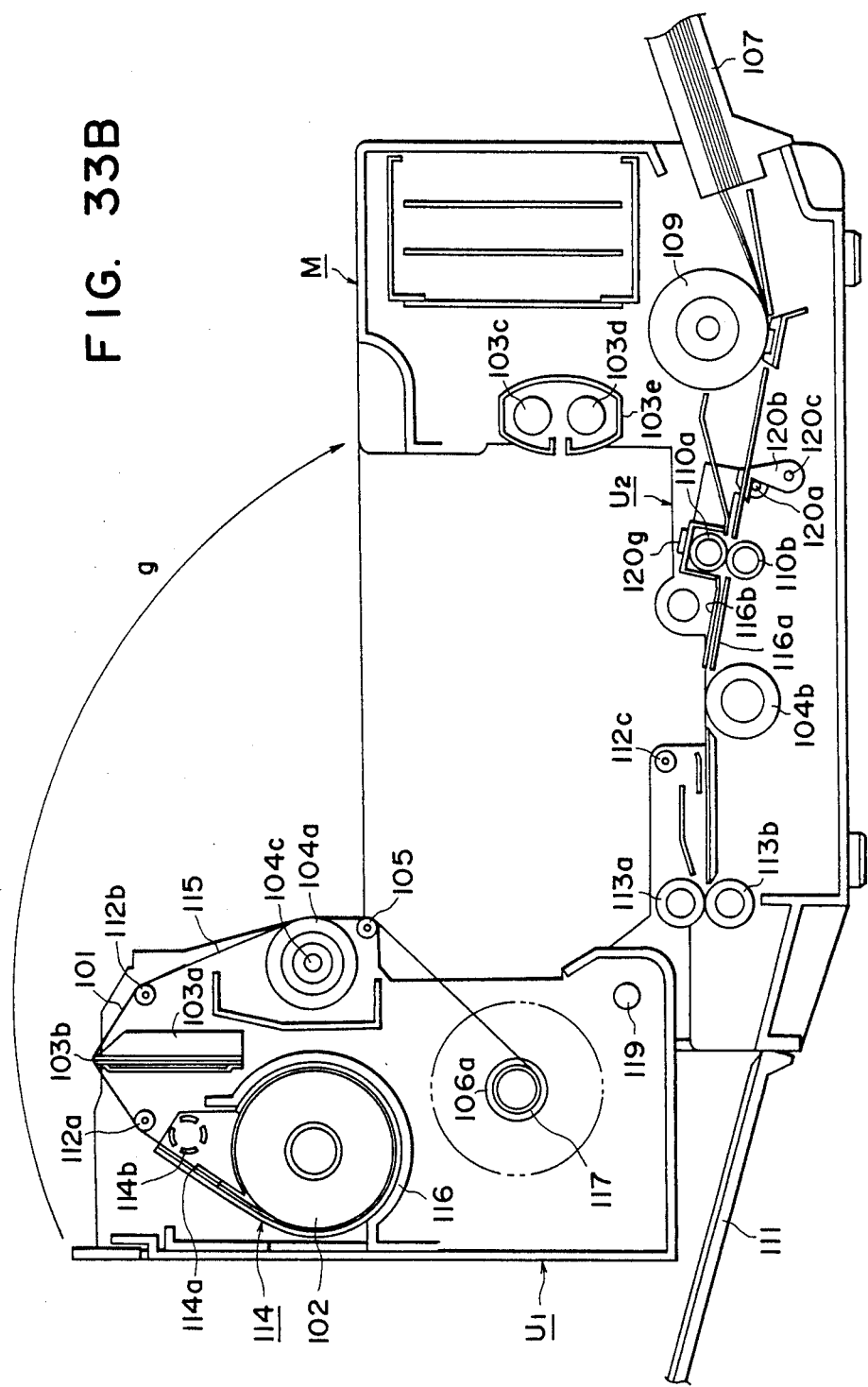
Figure 34:
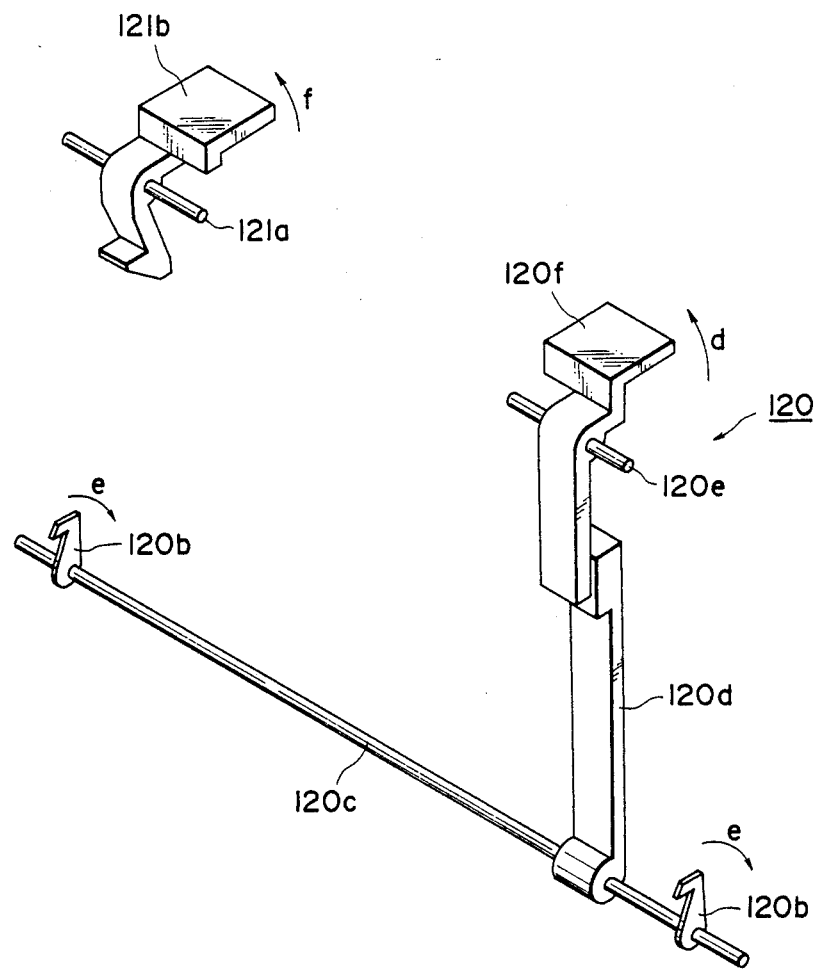
FIG. 34 is a perspective view of a latching mechanism.

In this state, the interval between the recording head 103a and the housing 103e in the recording section 103 as well as the interval between the transfer roller 104a and the pressure roller 104b in the transfer section 104 are opened wide In this sate, if the cassette 114 in which the transfer recording medium 101 has been accommodated is inserted into the cassette loading section 116 as shown in FIG. 33 A to effect loading, and if the takeup shaft 106a is disengaged from the boss 114b and is pulled out, the leader 115 and the transfer recording medium 101 can be out. The leader 115 and the transfer recording medium 101 are then made to pass along the guide roller 112a, the recording head 103a, the guide roller 112b, the transfer roller 104a, and the release roller 105, and the takeup shaft 106a is secured to the takeup joint 117. Subsequently, if the conveying unit $U_1$ is pivoted in the direction of the arrow g, as shown in FIG. 33B, and is thereby closed, the latch lever 121b is latched with the main body M of the apparatus, and the latch magnet 120g is secured to the conveying unit $U_1$.

The loading of the transfer recording medium 101 is effected as described above, and when the conveying unit $U_1$ is separated from the main body M of the apparatus, as described above, the advancing route of the transfer recording medium 1 is opened wide with respect to the main body M of the apparatus, and a sufficient working space can be secured, so that the loading of the transfer recording medium 101 is extremely facilitated.

Description will now be made of cases where the recording sheet 108 is jammed at the time of the above-described recording.

Figure 35:
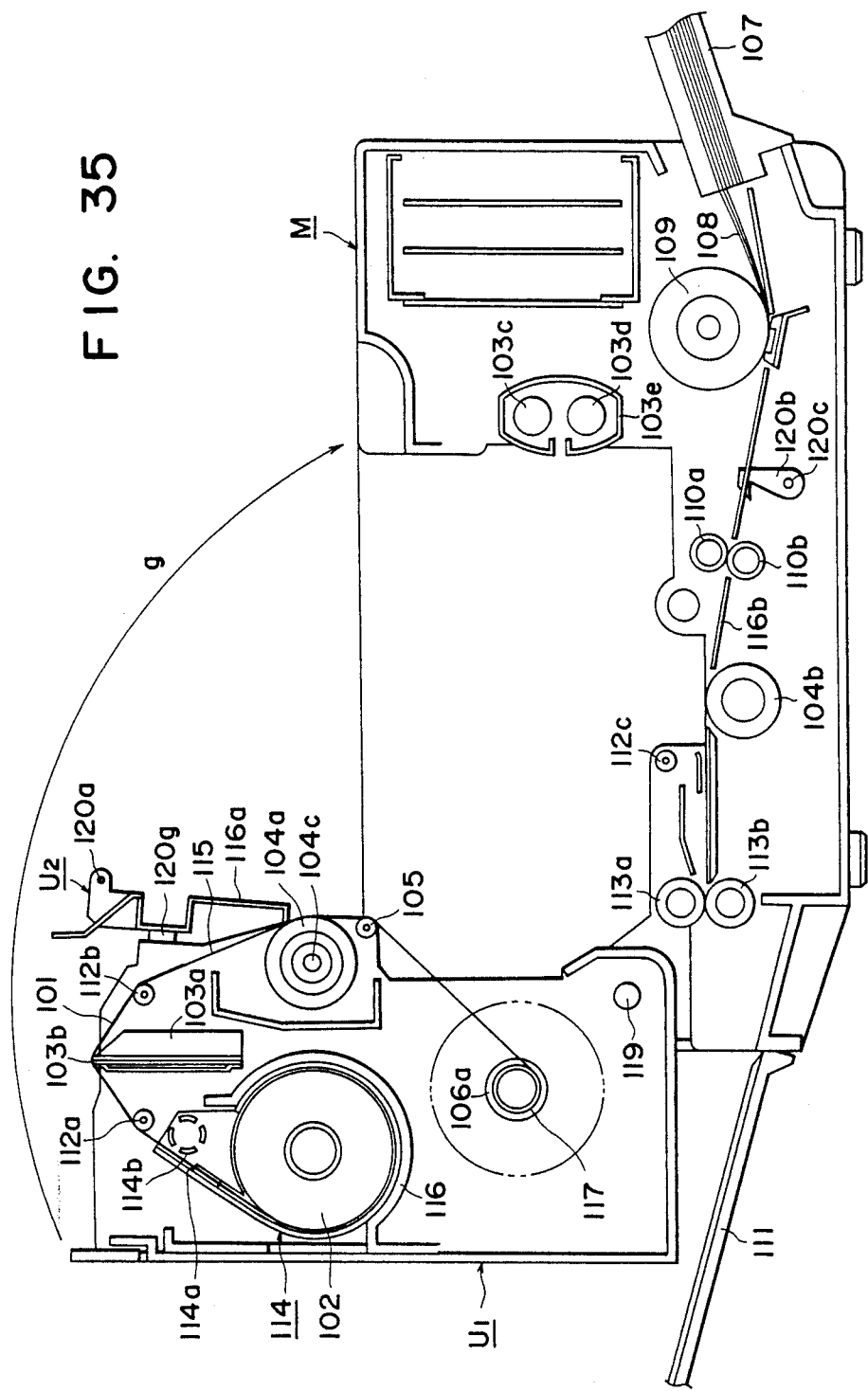
FIG. 35 is a cross-sectional view illustrating the image recording apparatus with a guide unit separated from the main body of the apparatus.

As shown in FIG. 34, the latch lever 120f of the engaging/disengaging mechanism 120 is pivoted in the direction of the arrow d to cancel the engagement between the retaining projection 120a and the retaining lever 120b, and the latch lever 121b is pivoted in the direction of the arrow f to cancel the engagement between the conveying unit $U_1$ and the main body M of the apparatus. Then, if the conveying unit $U_1$ is opened, as shown in FIG. 35, the guide unit $U_2$ opened integrally with the conveying unit unit $U_1$ while being attached to the unit $U_1$ by means of the latch magnet 120g Accordingly, the advancing route of the recording sheet 108 is opened wide, so that the jammed recording sheet 108 can be removed readily.

Subsequently after the handling of jamming, if the Unit $U_1$ is pivoted in the direction of g to close, the retaining projection 102a and the retaining lever 120b as well as the latch lever 121b and the main body M of the apparatus are latched automatically.

As described, since the conveying unit $U_1$ and the guide unit $U_2$ are made separable from the main body M of the apparatus, the replacement of the transfer recording medium 1 and the handling of jamming of the recording sheet 108.

A still further embodiment of the present invention will be described with reference to FIGS. 36 to 39.

The embodiment which is described below is provided with a position determining means for fixing at least one of the relative positions of the heating means or the irradiating means with respect to the transfer recording medium. This embodiment is arranged such that, if a unit 118 is opened with respect to the main body M of the apparatus, the heating means and the irradiating means in the recording section 103 are separated, as shown in FIG. 37, and a fixed interval can be maintained between the two relative positions by means of a position determining means 120 when the unit 118 is closed.

Figure 38B:
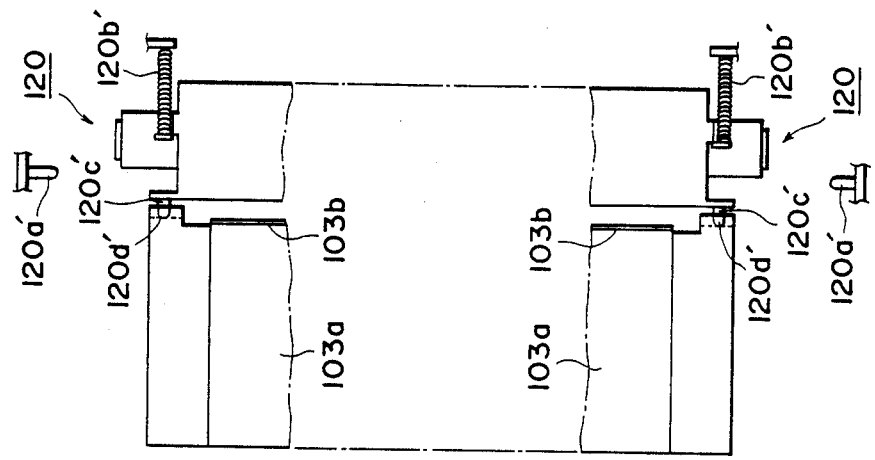
FIG. 38B is an explanatory top plan view thereof.
Figure 38A:
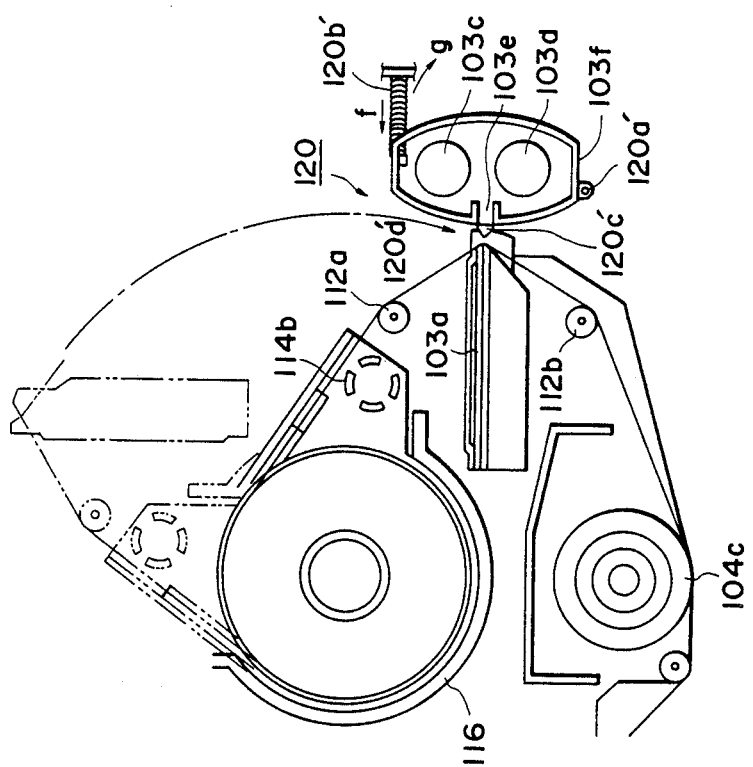
FIG. 38A is an explanatory diagram of a positioning means.

This position determining means 120 is arranged as shown in FIGS. 38 A and 38B. FIG. 38B is a top plan view of FIG. 38A. To describe the arrangement, the housing 103f which is fixed to the sides of the main body M of the apparatus is adapted to be pivotable with a pin disposed at a lower side thereof as a center, and is urged in the direction of the arrow f by means of a spring 120b' which presses the vicinity of an upper portion thereof. Furthermore, positioning pins 120c' are respectively installed in the vicinity of longitudinally opposite ends of a slit 103e.

In addition, V-shaped grooves 120d' are respectively provided at the positions opposing the positioning pins 120c', and the positioning pins 120c' are fitted with the V-shaped grooves 120d'.

Since the positioning pins 120c' are fitted with the V-shaped grooves 120d'; a fixed interval can be maintained between an array of heating elements 103b and the slit 103e of the housing 103f.

Description will now be made of cases where the image recording apparatus thus constructed is used.

Figure 36A:
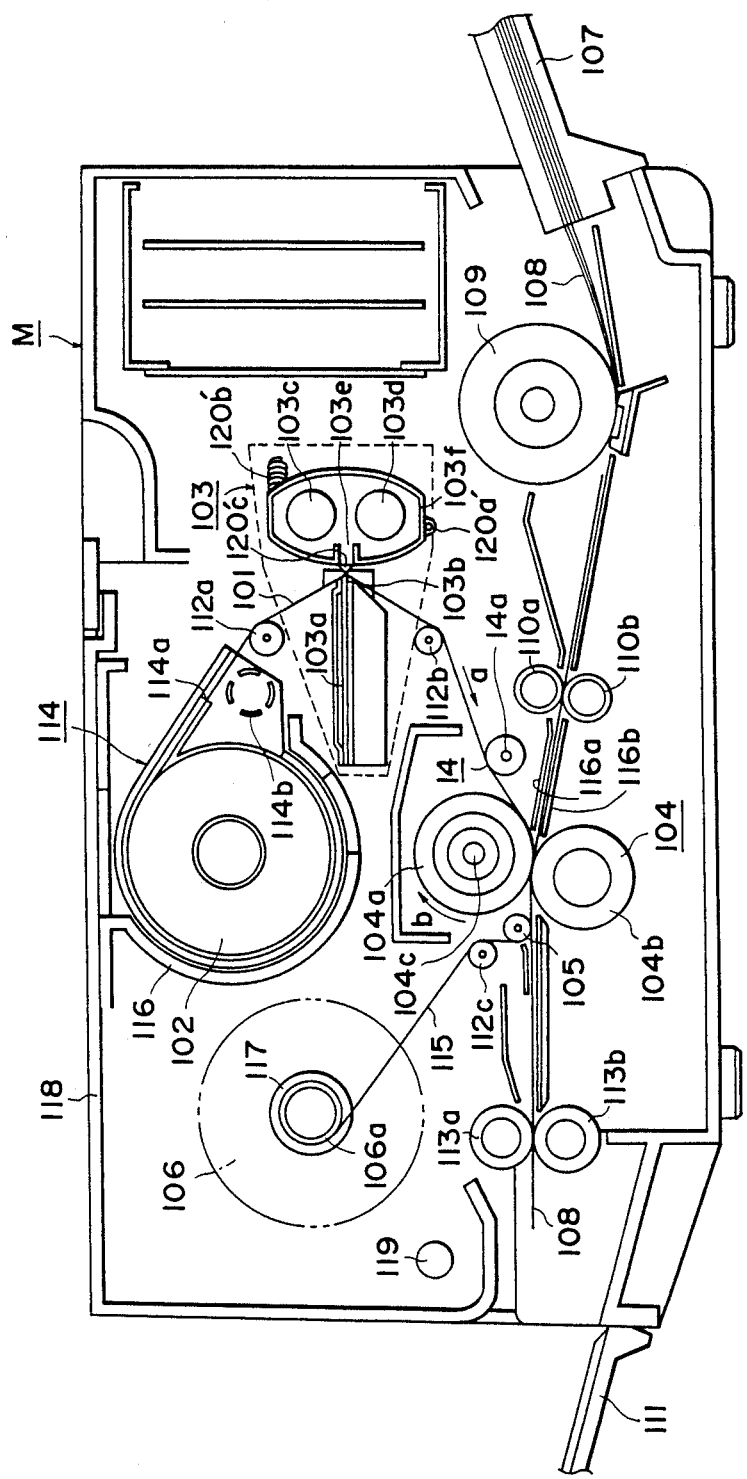
FIG. 36A is a schematic cross-sectional view of the image recording apparatus.
Figure 36B:
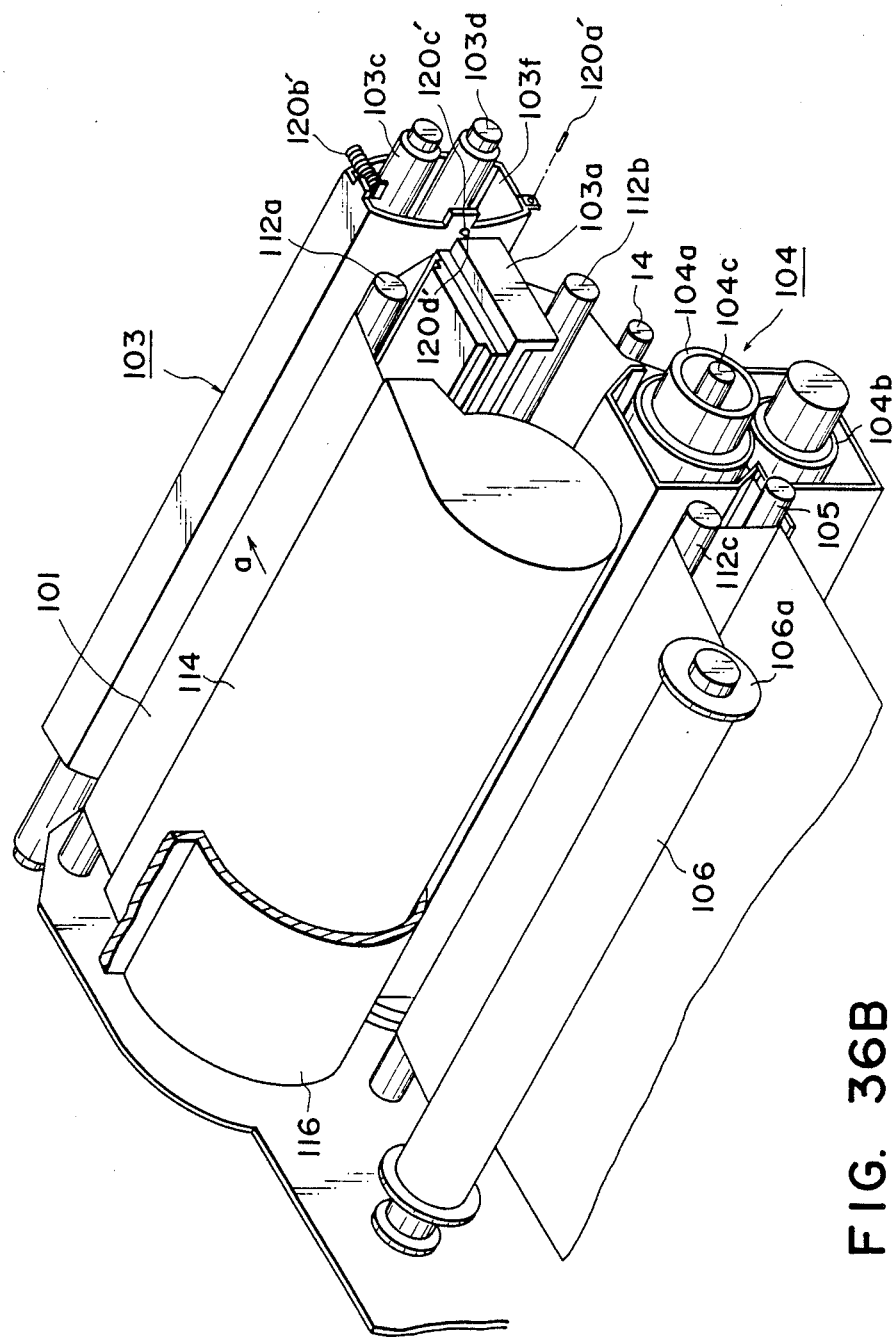
FIG. 36B is a perspective view thereof.
Figure 37B:
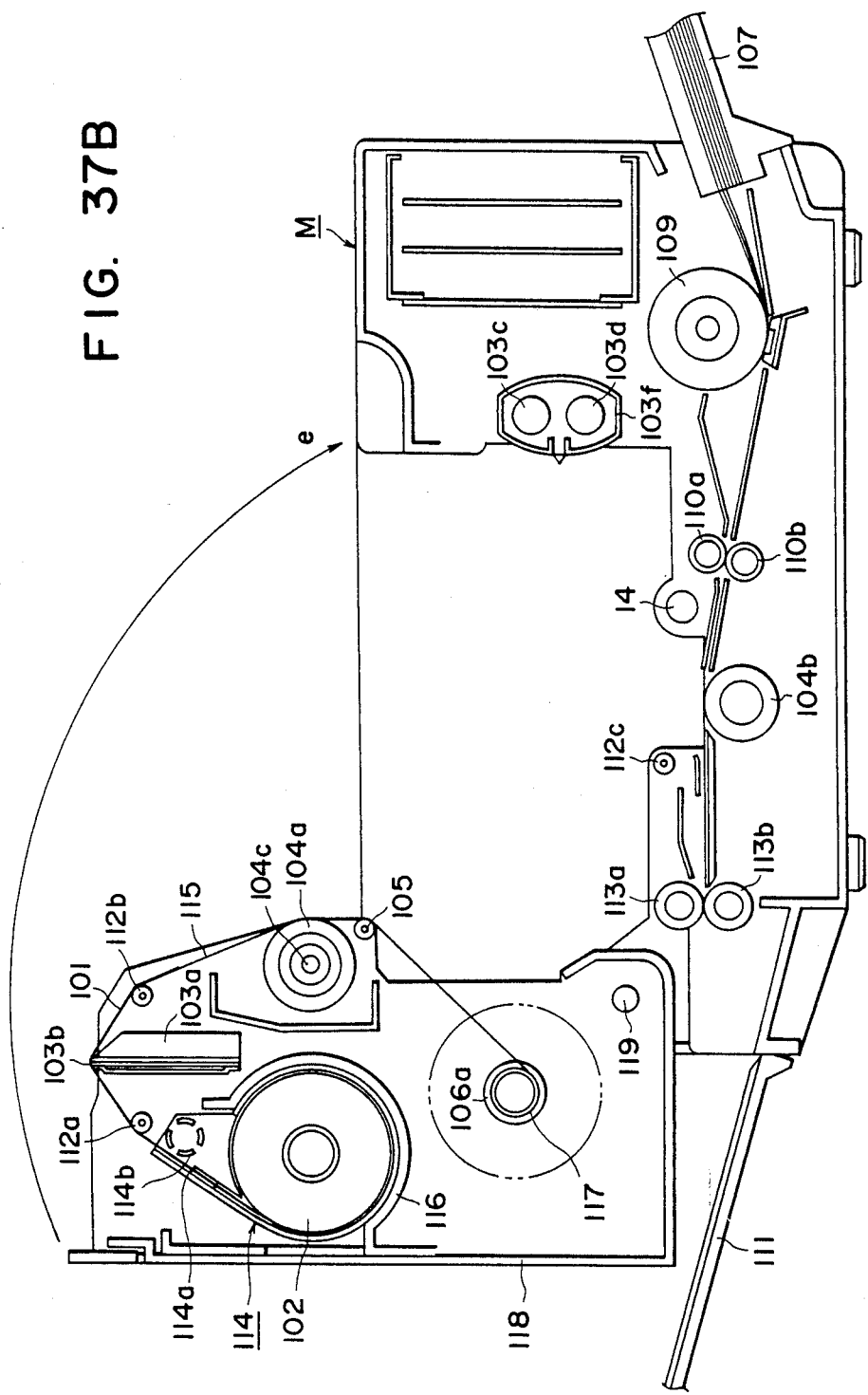

First, when the transfer recording medium 1 is loaded in the main body M of the apparatus, the unit 118 is pivoted in the direction of c, as shown in FIG. 37A, so as to be opened. In this state, the interval between the recording head 103a and the housing 103e in the recording section 103 as well as the interval between the transfer roller 104a and the pressure roller 104b in the transfer section 104 are opened wide. In this state, if the cassette 114 in which the transfer recording medium 101 has been accommodated is inserted into the cassette loading section 116 as shown in FIG. 37A to effect loading, and if the takeup shaft 106a is disengaged from the boss 114b and is pulled out, the leader 115 and the transfer recording medium 101 can be pulled out. The leader 115 and the transfer recording medium 101 are then made to pass along the guide roller 112a, the recording head 103a, the guide roller 112b, the transfer roller 104a, and the release roller 105, and the takeup shaft 106a is secured to the takeup joint 117, as shown by the arrow d. Subsequently, if the unit 118 is pivoted in the direction of the arrow e, as shown in FIG. 37B, so as to be closed, and if the unit 118 is latched with the main body M of the apparatus by means of a latching mechanism (not shown), the transfer recording medium 101 assumes a loaded state, as shown in FIG. 36A.

When the conveying unit 118 is separated from the main body M of the apparatus, as described above, the advancing route of the transfer recording medium 101 is opened wide from the main body M of the apparatus, and a sufficient working space can be secured, so that the loading of the transfer recording medium 101 is extremely facilitated.

In addition, when the unit 118 is moved to the latching position, the housing 103f escapes in the direction of the arrow g, as shown in FIG. 38A. when the unit 118 is latched, the positioning pins 120c' are fitted with the V-shaped grooves 120d', with the result that the relative positional relationship between the array of heating elements 103b and the slit 103e is maintained in a fixed state. Consequently, the heating position and the irradiating position with respect to the transfer recording medium 101 being conveyed along the array of heating elements 103d can be maintained in a fixed state.

Figure 39:
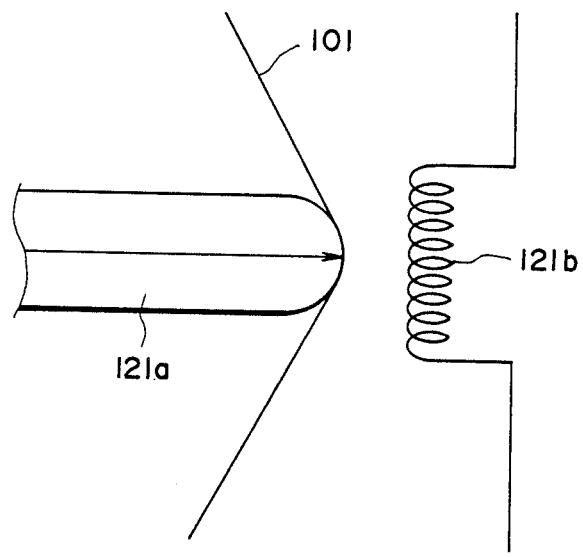
FIG. 39 is diagram schematically illustrating another example of a recording section.
Figure 40:
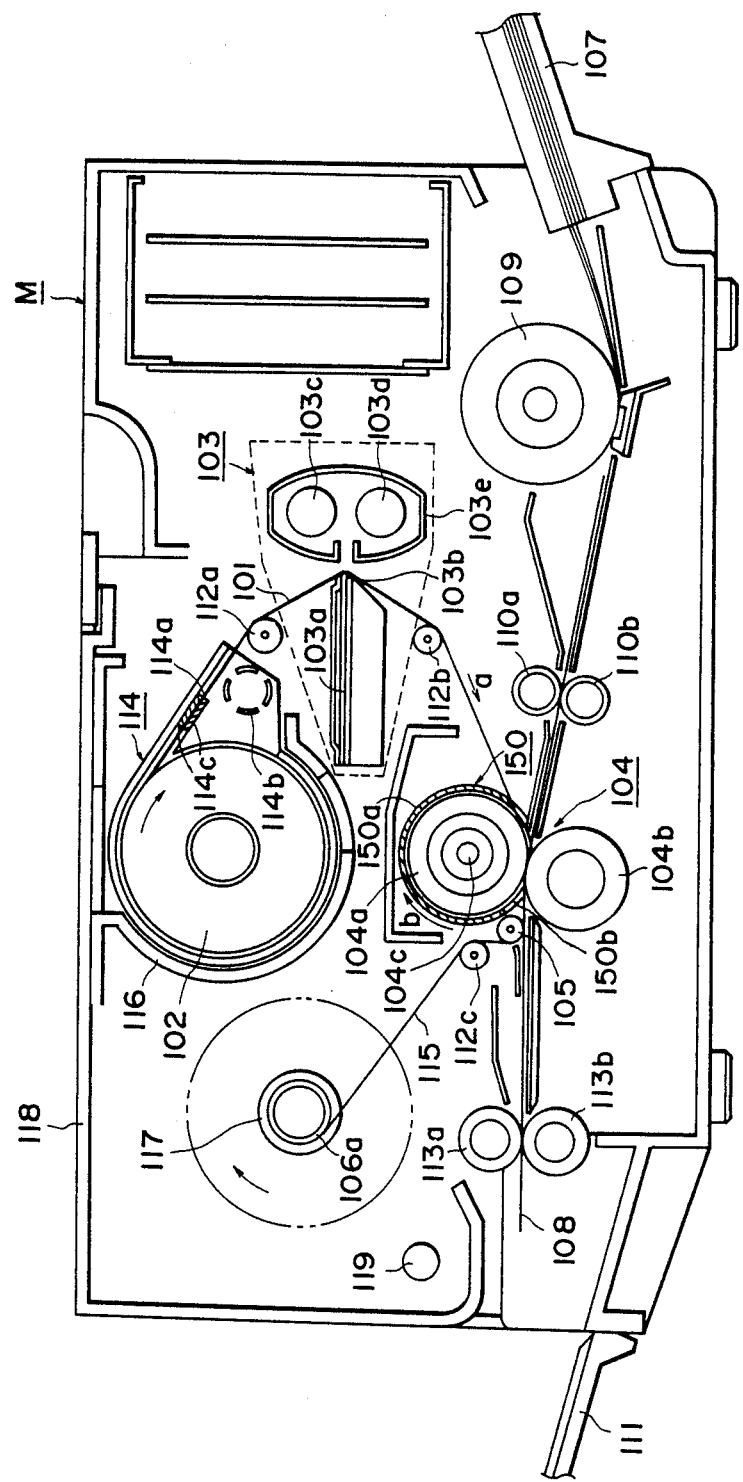
FIG. 40 is an overall schematic diagram illustrating the image recording apparatus in accordance with a further embodiment.

Furthermore, as shown in FIG. 39, if an arrangement is provided such that light energy is applied to the transfer recording medium 101 by means of an optical head 121a using optical fibers in accordance with an image signal and heat energy is uniformly applied to the transfer recording medium 101 by means of a heater 121b so as to form an image, insofar as at least the position of the irradiating means (optical head 121a) with respect to the transfer recording medium 101 is determined, the position of the heating means (heater 121b) with respect to the transfer recording medium 101 may not necessarily be determined, and the heating means may be located at such a position that allows a fixed level of heat energy to be applied to the irradiated portion of the transfer recording medium 1.

A further embodiment of the present invention will be described hereafter with reference to FIGS. 40 to 45.

In this embodiment, a light shielding material 114c constituted by a nonwoven fabric is provided at the outlet 114a of the cassette 114, and bosses 114b which are capable of detachably retaining the takeup shaft 106a are provided in the vicinity of the outlet 114a.

Figure 41A:
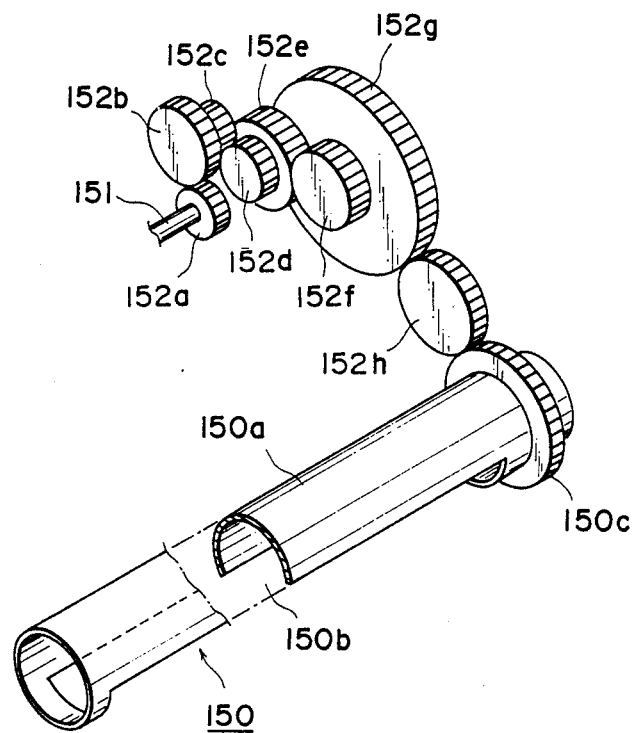
FIGS. 41A and 41B are diagrams explaining the arrangement of a heat-shielding member and a gear train.

Furthermore, in this embodiment, the transfer roller 104a is covered with a heat insulating member 150 which is poor in thermal conductivity. As shown in FIG. 41 (A), this heat insulating member 150 is arranged such that a notch 150b is formed lontitudinally in a cylindrical portion 150a whose inner diameter is greater than the outer diameter of the transfer roller 104a. A gear 150c is provided at one end of the cylindrical portion 150a, and the heat insulating member 150 is adapted to be rotatable by torque which is transmitted to the gear 150c.

Description will now be made of the unit for loading the transfer recording medium 101.

The unit 118 is provided with members constituting the advancing route of the transfer recording medium 101, i.e., the cassette loading section 116 for loading the transfer recording medium 101, the recording head 103a, the guide rollers 112a, 112b, the transfer roller 104a, the release roller 105, and the takeup joint 117. This unit 118 is pivotally secured to the main body M of the apparatus, and is thereby arranged so arranged as to be pivoted 95 degrees or thereabout in the direction of the arrow c, as shown in FIG. 42, so as to be openable with respect to the main body M of the apparatus.

In addition, a gear 152a is fixed to a shaft 151 which is secured to the unit 118, and gears 152b to 152h mesh consecutively directly or indirectly with the gear 152a so as to constitute a gear train, the gear 152h meshing with the gear 150c of the heat insulating member 150. Accordingly, if the unit 118 is rotated in the direction of the arrow c and is opened from the main body M of the apparatus, the gears 152b–152h rotate respectively in the directions of the arrows shown in FIG. 41B, and the heat insulating member 150 is thereby rotated in the direction of the arrow f. Incidentally, as for the amount of rotation of the heat insulating member 150, the gear ratio is set in such a manner that the heat insulating member 150 rotates about 195° in the direction of the arrow f.

Figure 42:
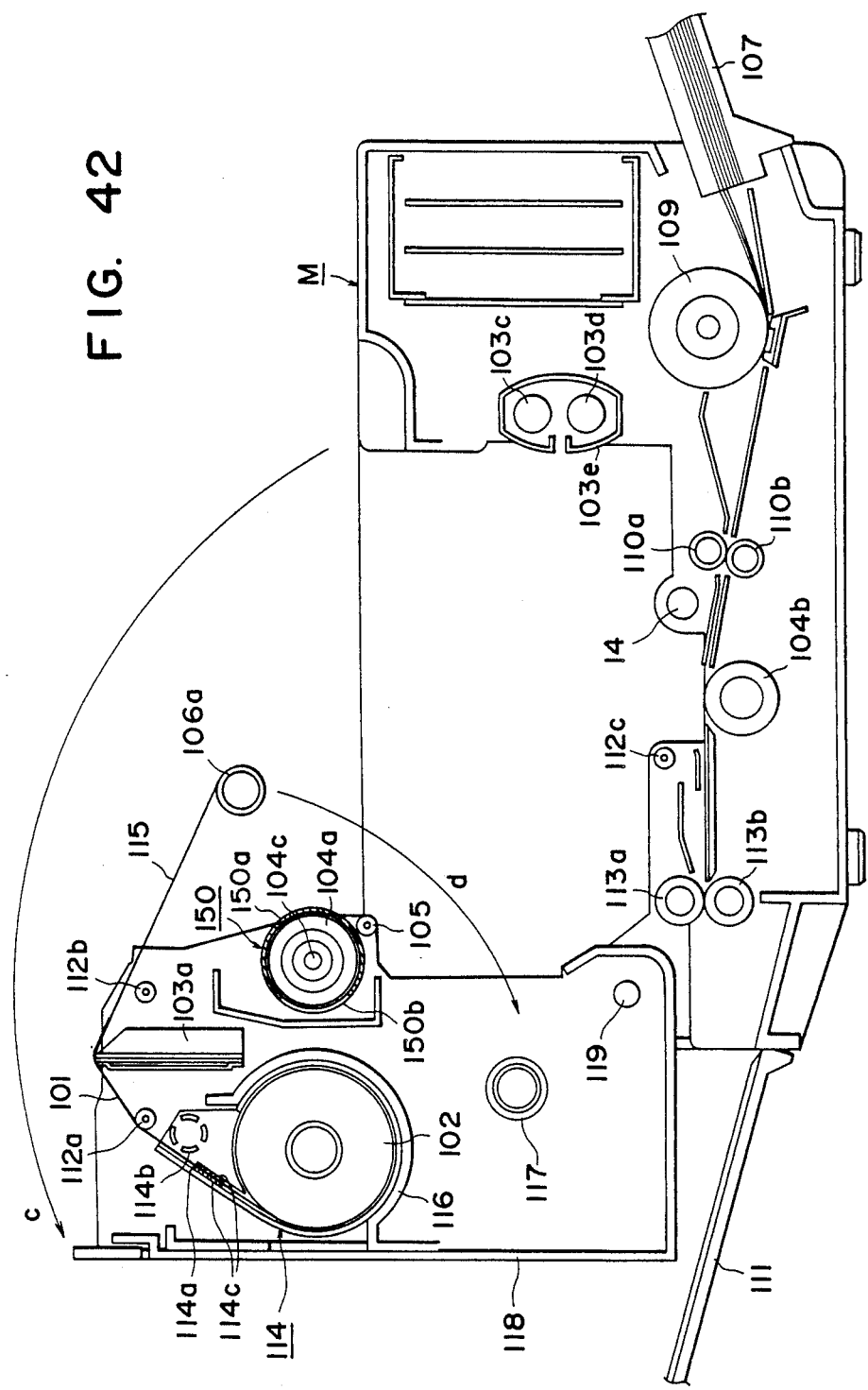
FIGS. 42 and 43 are cross-sectional views of the image recording apparatus with the unit opened with respect to the main body of the apparatus.

Next, when the transfer recording medium 1 is replaced, the unit 118 is pivoted 95° in the direction of the arrow c, as shown in FIG. 42, so as to be opened. In this state, the interval between the recording head 103a and the housing 103e in the recording section 103 as well as the interval between the transfer roller 104a and the pressure roller 104b in the transfer section 104 are opened wide.

In the above-described state, the cassette 114 and the transfer recording medium 101 already used are removed, and the cassette 114 with a new transfer recording medium 101 is loaded therein is inserted into the cassette loading section 116 as shown in FIG. 42. Subsequently, the takeup shaft 106a is removed from the boss 114b, and the leader 115 and the transfer recording medium 101 are pulled out and are passed along the guide roller 112a, the recording head 103a, the guide roller 112b, the transfer roller 104a, and the release roller 105, and the takeup shaft 106a is secured to the takeup joint 117.

Figure 41B:
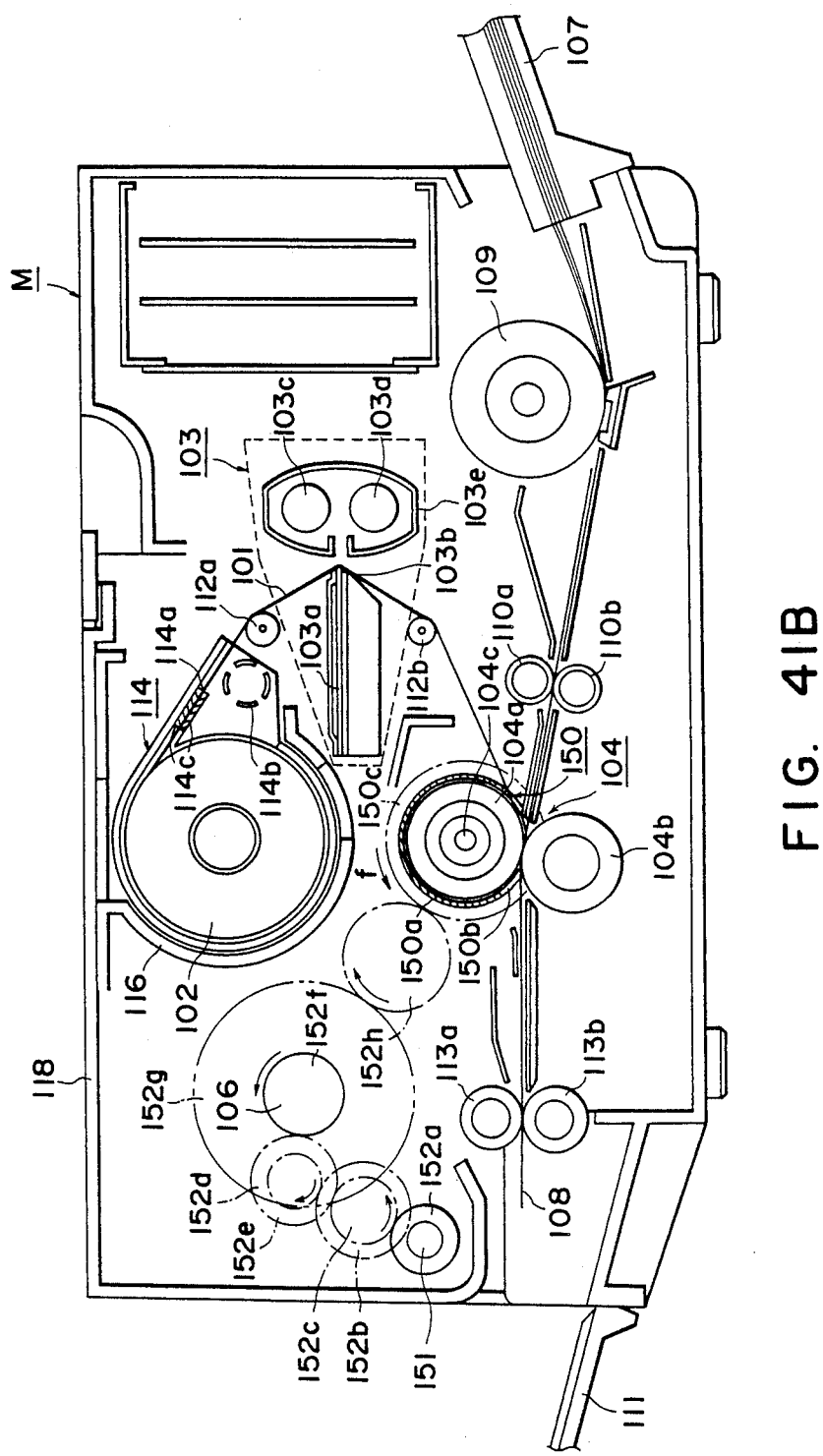

In addition, when the unit 118 is opened, the gears 152b–152h respectively rotate in the direction of the arrows shown in FIG. 41B, and the heat insulating member 150 rotates 195° in the direction of the arrow f, with the result that the heat insulating member 150 covers the transfer roller 104a, as shown in FIG. 42. Accordingly, since the transfer roller 104a whose surface temperature has reached 90–100° C. or thereabout is not exposed, the operator who is engaged in the replacing operation of the transfer recording medium 101 is able to undertake the work safely without touching the high-temperature transfer roller 104.

Figure 43:
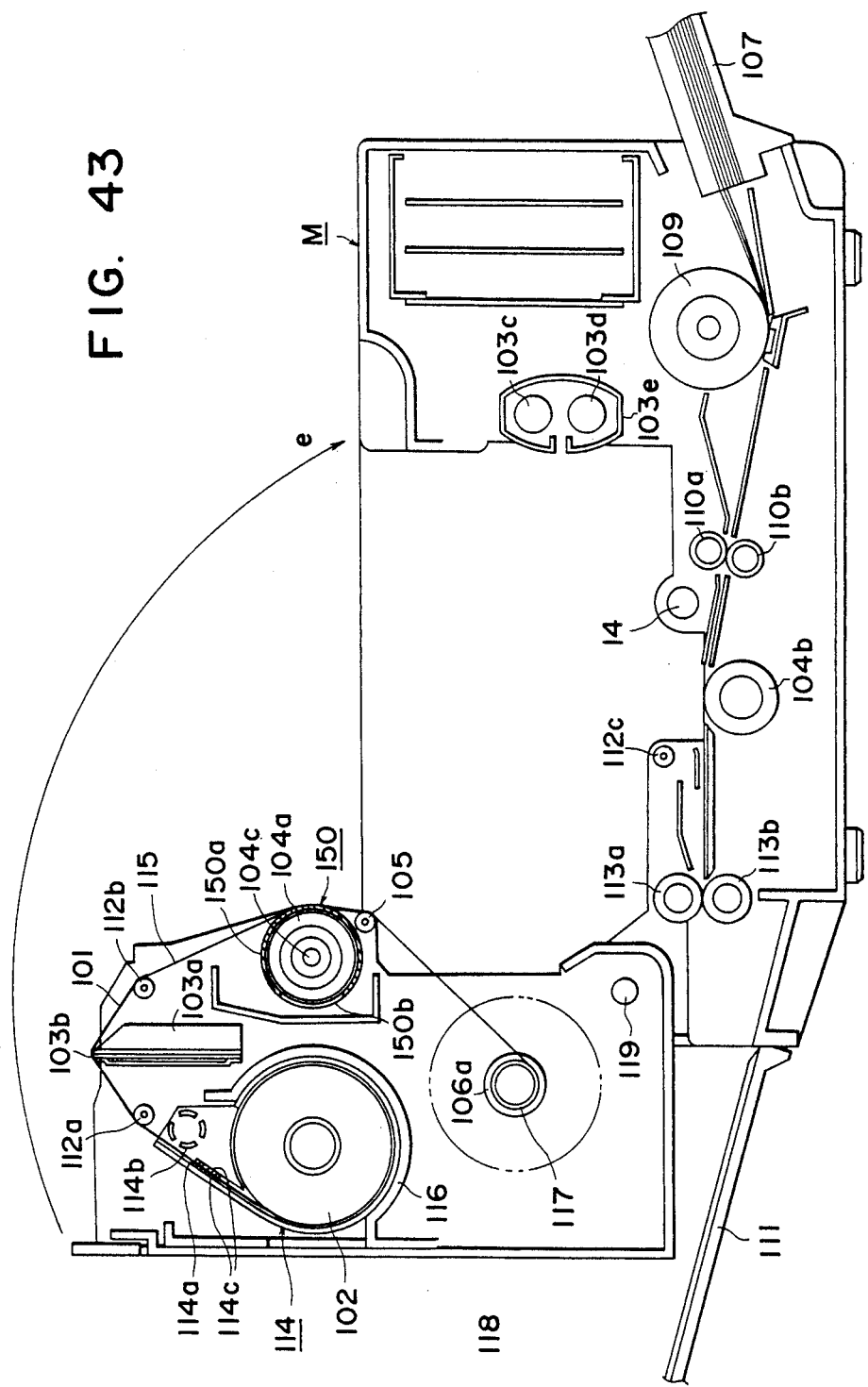

As shown in FIG. 43, when the unit 118 is pivoted in the direction of the arrow e so as to be closed, the gears 152b–152h rotate in the directions opposite to those of the arrows shown in FIG. 41B. Consequently, the heat insulating member 150 rotates 195° in the opposite direction to that of the arrow f, with the result that the notch 150b faces the pressure roller 104b, and the transfer roller 104a exposed from the notch 150b is brought into pressure contact with the pressure roller 104b. Furthermore, if the unit 118 is latched with the main body M of the apparatus by means of a latching mechanism (not shown), the transfer recording medium 1 assumes a loaded state, as shown in FIG. 40A.

As described above, when the unit 118 is separated from the main body M of the apparatus, the advancing route of the transfer recording medium 101 is opened wide from the main body M of the apparatus, so that a sufficient working space can be secured, thereby extremely facilitating the loading of the transfer recording medium 101. In addition, since the transfer roller 104a which is in a high-temperature state during replacement is covered with the heat insulating member 150, the replacement work can be effected safely.

Figure 44:
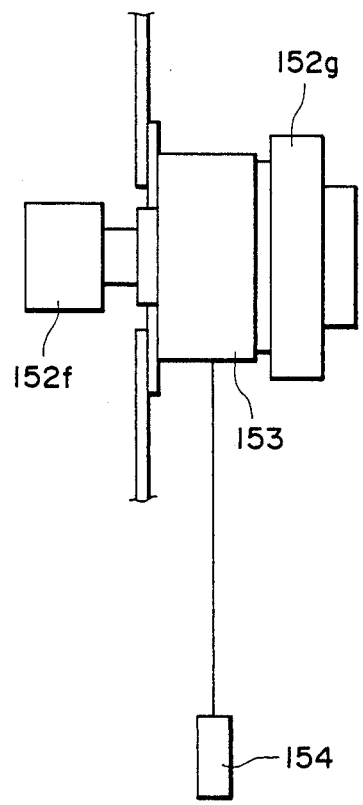
FIG. 44 is an explanatory diagram of an embodiment in which an electromagnetic clutch is provided midway in the gear train.

In addition, although, in the foregoing embodiment, the heat insulating member 150 is rotated by being driven by the rotation of the unit 118, an arrangement may be alternatively provided such that an electromagnetic clutch 153 is provided midway in the gear train for rotating the heat insulating member 150 between, for instance, the gear 152f and the gear 152g, as shown in FIG. 44, and the light shielding member 150 is rotated when the gears 152f and 152g are connected to each other by the electromagnetic clutch 153 in accordance with a signal from a thermistor 154 provided in the vicinity of the surface of the transfer roller 104a only when the surface temperature of the transfer roller 104a is high.

Figure 45:
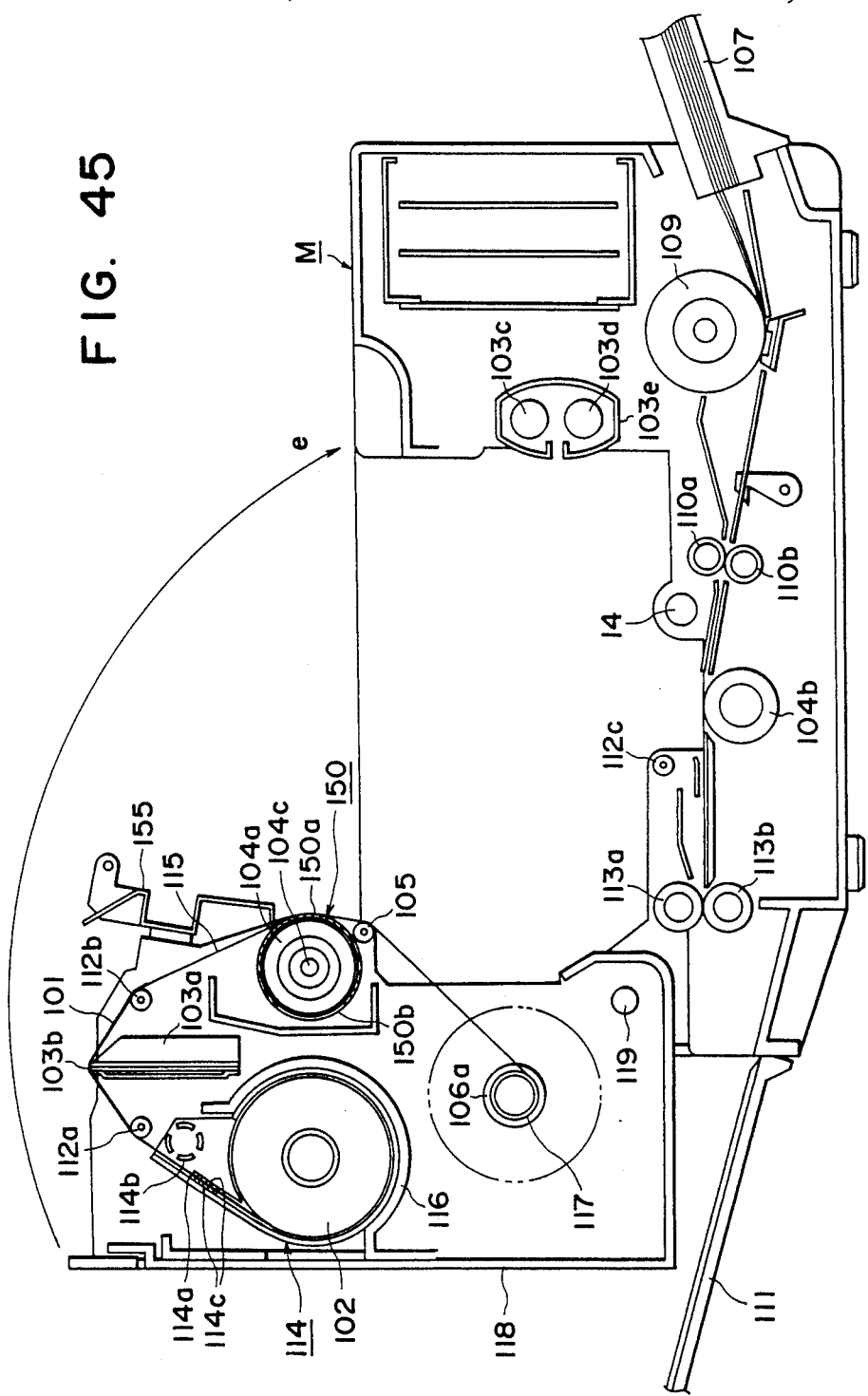
FIG. 45 is an explanatory diagram of an embodiment in which a recording sheet guide is made rotatable together with the unit.

Furthermore, as shown in FIG. 45, an arrangement may alternatively be provided such that a guide member 155 for guiding the recording sheet 108 is rotated integrally in conjunction with the pivotal motion of the unit 118. If this arrangement is adopted, the sheet removing work can be facilitated when jamming has occurred to the recording sheet 108.

Moreover, a fixing means for fixing the image on the recording medium transferred in the transfer section 104 may be provided, as necessary, downstream of the release roller 105 in the advancing direction of the recording medium.

Although, in the foregoing embodiment, an example has been given of the image recording apparatus which is provided with the scraping roller 14, it goes without saying that this embodiment can be applied to an image recording apparatus which is not provided with the scraping roller and the like.

A further embodiment of the present invention will be described hereafter with reference to FIGS. 46 to 51.

The embodiment which will be described below is related to the embodiments shown in FIGS. 1 to 26, and a tension imparting means for imparting tension to the transfer recording medium in the direction perpendicular to the advancing direction thereof is disposed between the recording section and the transfer section so as to scrape off a thin surface layer of the transfer recording layer.

Description will be made of the means for imparting tension in the widthwise direction of the transfer recording medium 1.

Figure 47:
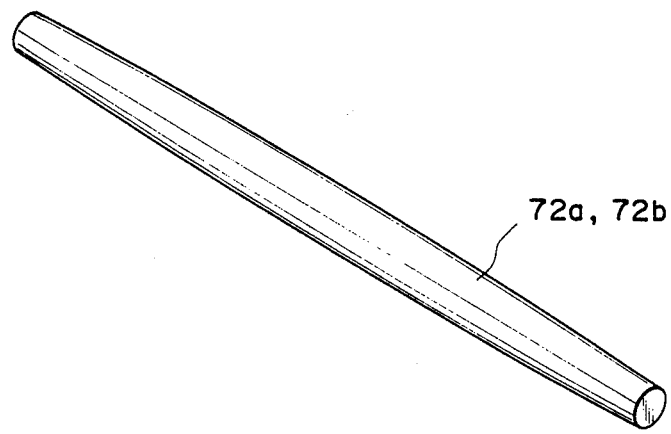
FIG. 47 is a schematic diagram illustrating a guide roller.

This means is constituted by guide rollers 72a, 72b or a scraping roller 74. In other words, as shown in FIG. 47, the guide rollers 72a, 72b are arranged such that their length is longer than the width of the transfer recording medium 1, the diameter of their central portions is 12 mm, and the diameter of opposite ends thereof is 8 mm. Thus, the guide rollers 72a, 72b are tapered gradually from their central portions toward their opposite ends.

Accordingly, the transfer recording medium 1 which is conveyed while being guided by the guide rollers 72a, 72b is pulled in directions toward the sides of the transfer recording medium 1, i.e., in directions perpendicular to the advancing direction. For this reason, even if there are creases formed upstream of the guide rollers 72a, 72b in the advancing direction of the transfer recording medium 1, when the transfer recording medium 1 is conveyed to the positions of the guide rollers 72a, 72b, tension is applied thereto in the width-wise direction, thereby causing the creases to disappear.

Figure 48:
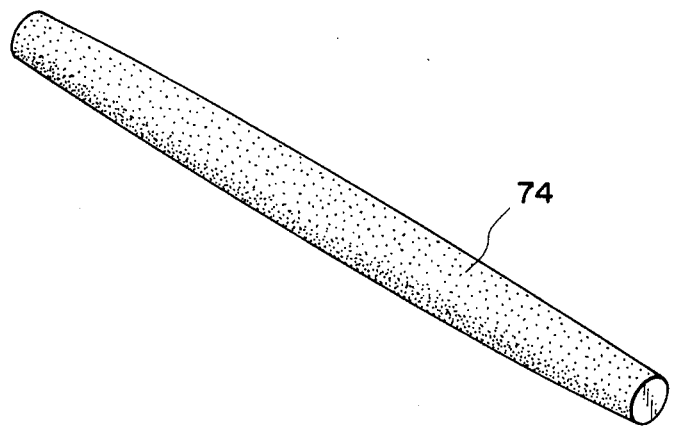
FIG. 48 is a schematic diagram illustrating the scraping roller.

In the same manner as that for the guide rollers 72a, 72b, the scraping roller 74 is also arranged to have a configuration in which its central portion is larger than the remaining portions, as shown in FIG. 48. Specifically, the diameter of the central portion is set at 14 mm, and the diameter of the opposite end portions is set at 10 mm. Accordingly, tension is applied to the transfer recording medium 1 by the scraping roller 74 as well in the width-wise direction thereof, thereby causing creases to dissapear.

Figure 46:
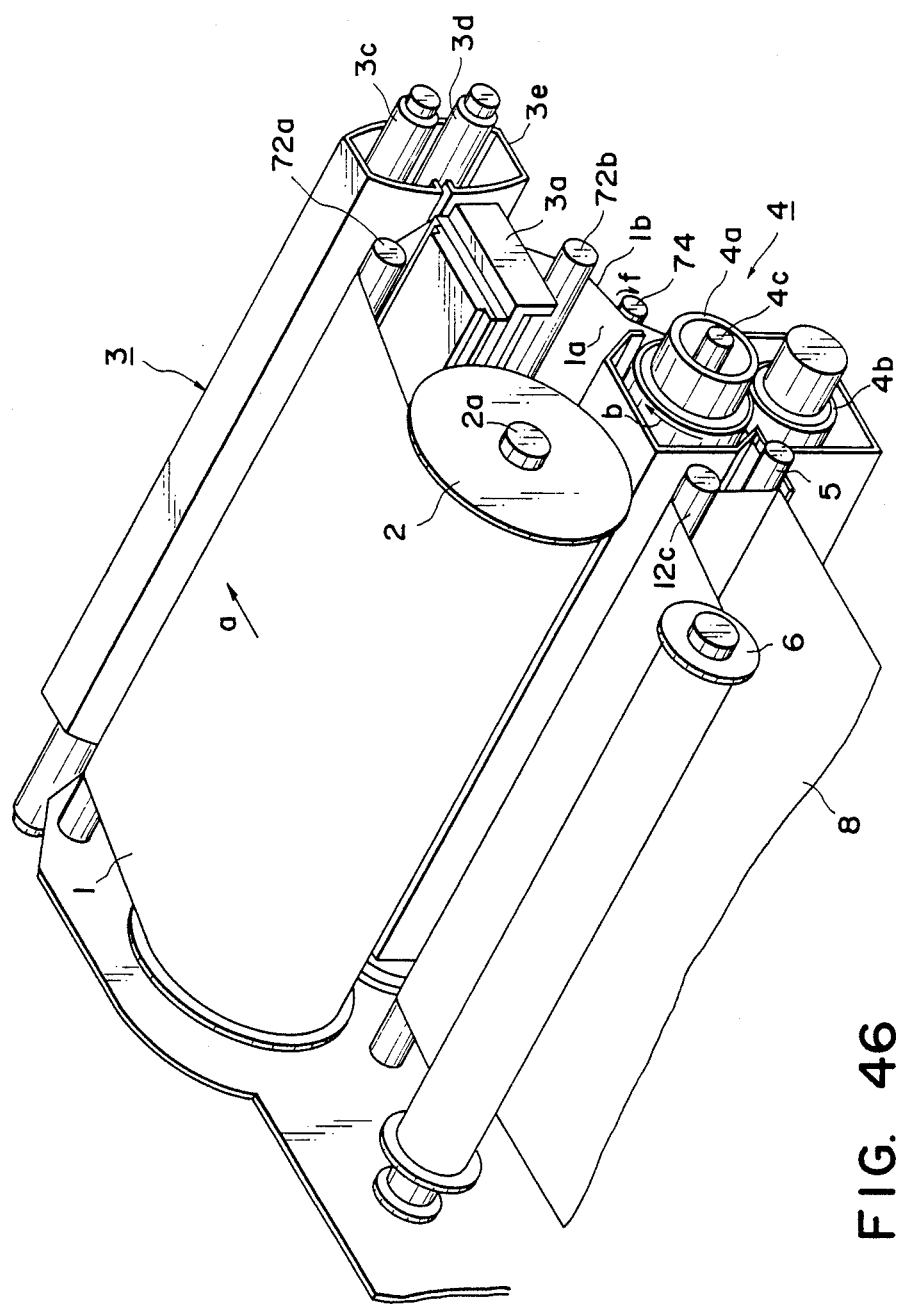
FIG. 46 is an overall perspective view of the image recording apparatus in accordance with another embodiment of the present invention.

Furthermore, this scraping roller 74 is formed to have very small protrusions by sandblasting the surface of a stainless steel shaft, and is installed between the recording section 3 and the transfer section 4, as shown in FIG. 46, in such a manner as to be brought into contact with the transfer recording layer 1b of the transfer recording medium 1 with a pressure of approximately 0.2 kg/cm$^2$. Moreover, this scraping roller 74 is adapted to be rotated by a DC motor (not shown) in the direction of the arrow f, i.e., in the direction opposite to the conveying direction of the transfer recording medium 1 simultaneously as recording is commenced, thereby scraping off a thin layer of the surface of the transfer recording layer 1b.

Description will now be given of cases where recording is effected using the image recording apparatus having the above-described arrangement.

Incidentally, in the embodiment which is described below, an example is shown in which heat is applied in correspondence with image signals, and light is applied uniformly.

The transfer recording medium 1 is paid out consecutively from the supply roll 2 when a motor (not shown) is driven. Since the transfer recording medium 1, when conveyed, is subjected to tension by the guide rollers 72a, 72b and the scraping roller 14 in directions perpendicular to the advancing direction, even if creases occur upstream of, for instance, the guide roller 72a, in the advancing direction, creases are made to disappear by the aforementioned tension, so that the transfer recording medium 1 is conveyed positively in contact with the array of heating elements 3b in the recording section 3.

An image is formed if light and heat corresponding to image signals are applied selectively to the transfer recording medium 1 conveyed to the recording section 3.

Subsequently, the transfer recording layer 1b on which a negative image has been formed is brought into pressure contact with the scraping roller 74 before reaching the transfer section 4, and a thin layer of its surface is scraped off by the rotation of the roller 74 so as to be smoothed.

The transfer recording medium 1 whose surface has been smoothed, as described above, is sent to the transfer section together with the recording sheet 8 which is conveyed in synchronization with the same. Pressurization and heating are effected in the transfer section 4 with the transfer recording layer 1b and the recording sheet 8 adhered together, with the result that an image of the two colors of blue and magenta is transferred onto the recording sheet 8.

Subsequently, the transfer recording medium 1 and the recording sheet 8 are separated from each other by the release roller 5, and the transfer recording medium 1 is taken up by the takeup roll 6, while the recording sheet 8 on which recording of a desired image has been effected is discharged onto the discharge tray 11 by means of the pair of discharge rollers 13a, 13b.

As described above, two-color recording is effected by one shot.

In the foregoing embodiment, although, in providing the guide rollers 72a, 72b and the scraping roller 74 with a centrally raised shape, they were formed into a conical or trapezoidal shape constituted by straight lines, they may be formed into a curve based on a function of higher order.

Figure 49:
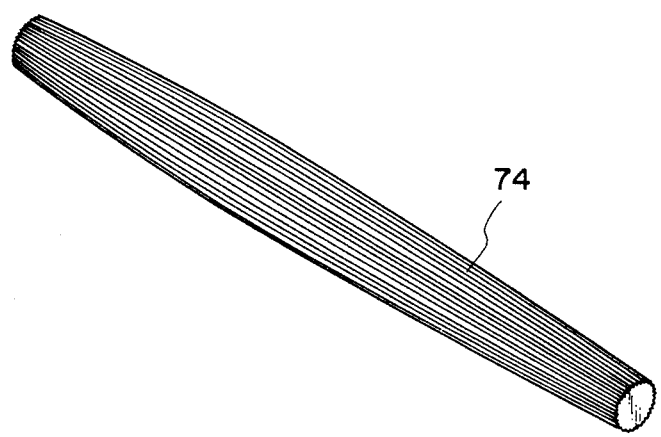
FIGS. 49 and 50 are diagrams illustrating other examples of the scraping member.

Although, in the foregoing embodiment, the scraping roller 74 is sandblasted to have very small protrusions on its surface, the scraping roller 74 as an arrangement for scraping off a thin surface layer of the transfer recording layer 1b may be arranged in the form of a knurling tool, as shown in FIG. 49.

Figure 50:
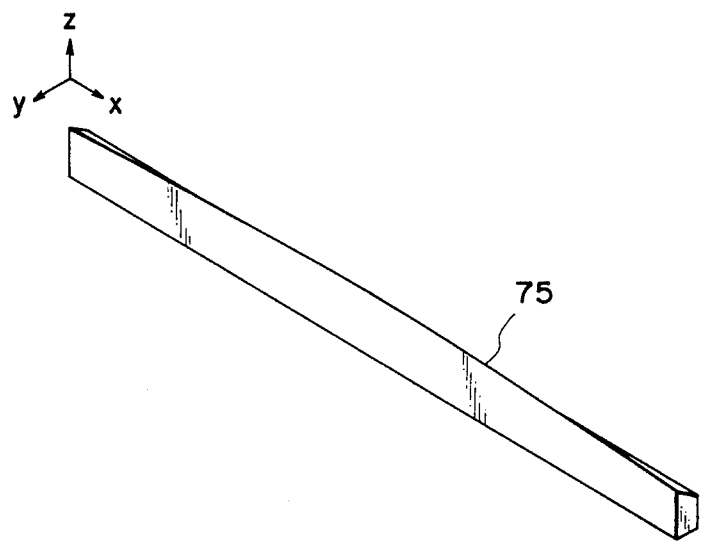

Furthermore, this scraping member may not necessarily be formed as a roller, and may be formed as a scraping member 75 which is a bar-like member in which the diameter of its central portion is larger than that of opposite end portions and which has a sharp edge, as shown in FIG. 50. Moreover, this scraping member 75 may be caused to generate very small vibrations in any of directions x, y, and z shown in FIG. 50 or through a combination thereof.

Figure 51A:
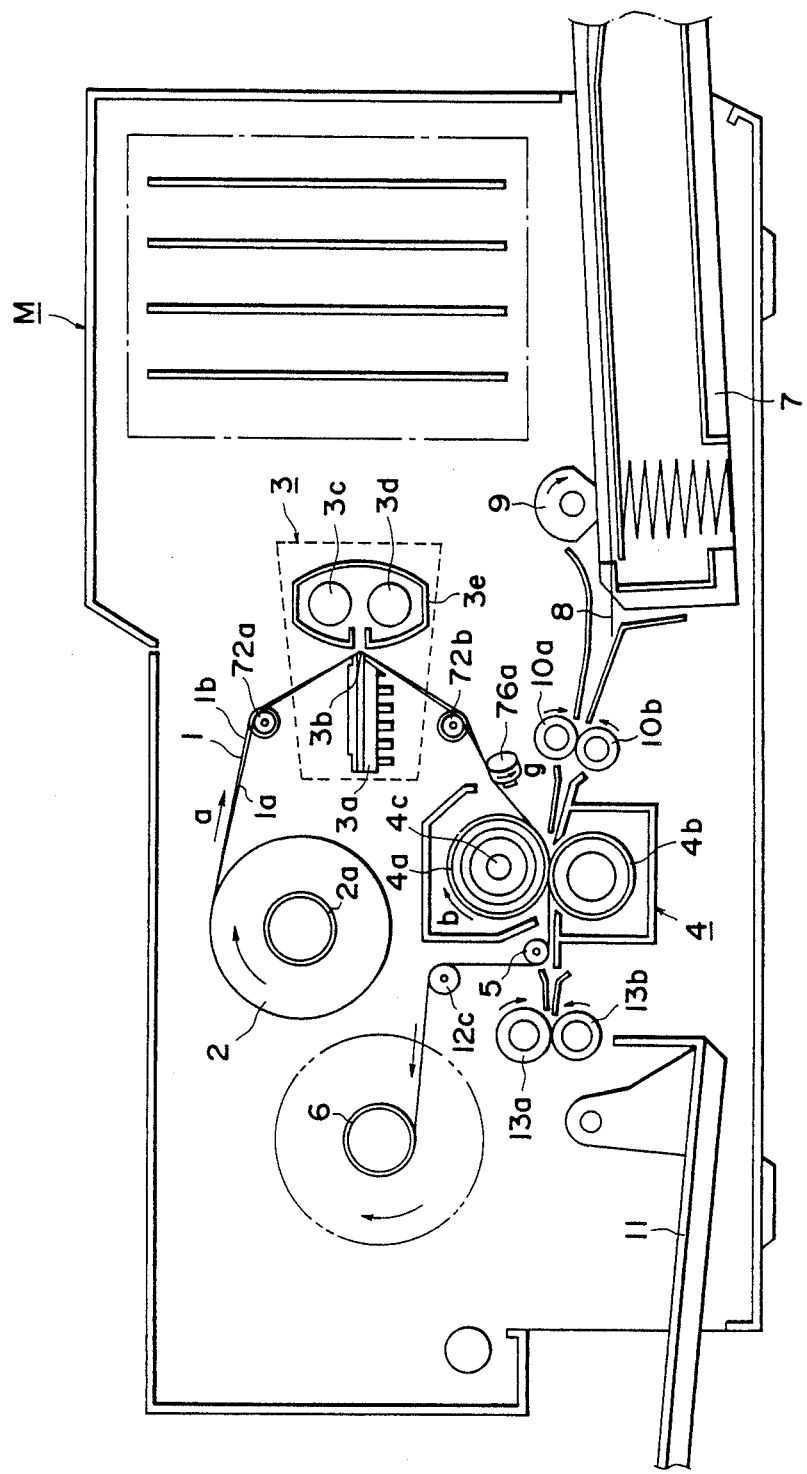
FIG. 51A is a cross-sectional view of the image recording apparatus incorporating another example of the scraping member.
Figure 51B:
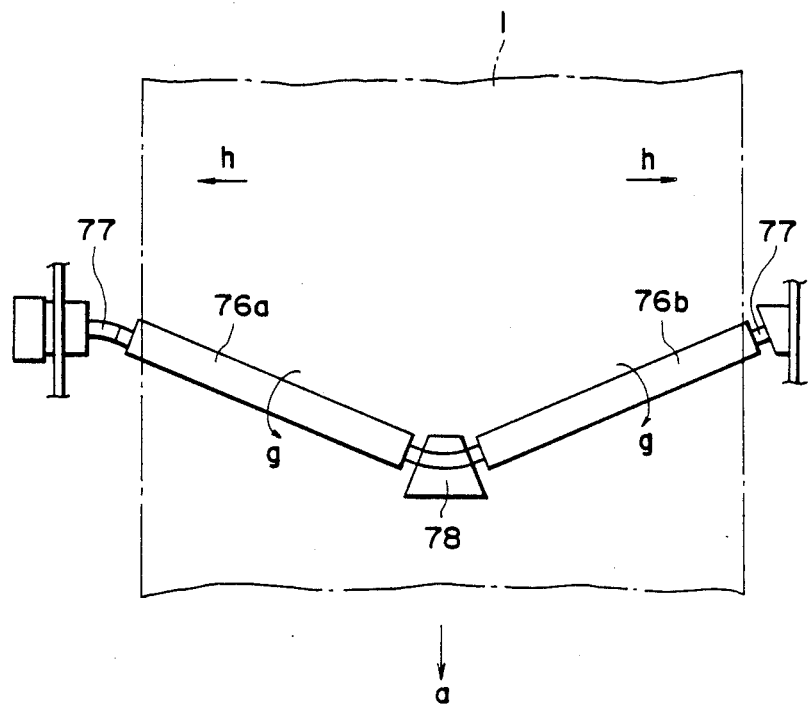
FIG. 51B is a top plan view of the scraping member as viewed from the side of a heat transfer recording medium.

In addition, the scraping roller may be arranged as shown in FIGS. 51A and 51B in which tension is applied in directions perpendicular to the advancing direction of the transfer recording medium 1.

FIG. 51B is an explanatory to plan view in which the scraping member is viewed from the side of the transfer recording medium 1. In this embodiment, rubber rollers 76a, 76b coated with chloroprene rubber or the like are disposed in the form of " ", and are coupled to each other by means of flexible joints 77 and a coupling unit 78, the rollers 76a, 76b being rotated respectively in the direction of the arrow g. In this arrangement, if the rubber rollers 76a, 76b are rotated in the direction of g, tension is applied to the transfer recording medium 1 in the width-wise directions h, thereby making it possible to remove creases and the like.

According to this embodiment, since tension is applied to the transfer recording medium being conveyed, in directions perpendicular to the advancing direction, it is possible to prevent creases and the like formed in the transfer recording medium causing deterioration in the image quality.

Incidentally, in each of the foregoing embodiments, the arrangement is such that light of predetermined wavelengths according to desired colors is applied uniformly from the transfer recording layer 1b side of the transfer recording medium 1, and heat corresponding to image signals is applied from the substrate 1a side. However, an arrangement may be provided as an alternative embodiment such that heat is applied uniformly, and predetermined light is applied in correspondence with image signals.

If the substrate 1a is formed by a light-transmissive material, an arrangement may be provided such that light is applied from the substrate 1a side, and heat is applied from the transfer recording layer 1b side.

Furthermore, although in the foregoing embodiments irradiation and heating are carried out with the substrate 1a placed in between, it is also possible to effect image formation by conducting both irradiation and heating from one side of the substrate 1a.

As for the heating means, in addition to the method of using the aforementioned recording head 3a, it is also possible to employ a method in which heating is carried out selectively using a YAG laser and a polygon mirror.

As for the irradiating means, in addition to the aforementioned method of using the fluorescent tubes 3c, 3d, it is also possible to employ, for instance, a method in which an LED array is used, or one in which a xenon lamp and a filter which has light absorption characteristics matching therewith in terms of its material are used.

Incidentally, in the above-described embodiments, light energy and heat energy are applied simultaneously to the transfer recording layer 1b, an arrangement may be alternatively provided such that light energy and heat energy are applied separately, insofar as both energies are applied ultimately.

Although, in the foregoing embodiments, description has been given of the example of two-color recording, it is also possible to effect transfer recording of a single- or full-color image by selecting, as required, the kinds of colorant and reaction initiator constituting the image forming elements and by selecting a light source of a wavelength necessary for the reaction of the reaction initiator.

In the foregoing embodiments, an example has been shown in which transfer recording is effected by forming a transfer image based on a change in the softening temperature of the transfer recording layer 1b of a high molecular material containing colorants by using light energy and heat energy. However, transfer recording may be effected on the basis of a difference in bond properties or the sublimation characteristics in respect of the recording medium. Alternatively, an arrangement may be provided such that an image formed on the transfer recording medium is transferred onto the recording sheet by providing the recording sheet with coloring properties and by providing the transfer recording medium with such a layer that will cause a change in the coloring properties of the recording sheet.

In addition, the plurality of kinds of energy applied to the transfer recording layer 1b need not be confined to heat and light energies, and images may be formed by the use of other energies, such as pressure energy.

As for the material of the substrate 1a, for instance, polyamide, polyimide, condenser paper, cellophane paper, etc. may be used in addition to the aforementioned polyethylene tetraphthalate.

As the transfer recording layer 1b, an appropriate one may be selected for use from among those having heat-fusible properties, heat softening properties, or heat sublimation properties.

Furthermore, the recording medium need not be restricted to the above-described recording sheet and, for instance, a plastic sheet for an overhead projector (OHP) may naturally be used.

The members constituting the transfer section 4 need not be restricted to roller-shaped ones such as the transfer roller 4a and the pressure roller 4b, and an arrangement may be used in which a rotary belt or the like is employed, insofar as a desired pressure is obtainable.

A fixing means for fixing an image transferred onto the recording medium in the transfer section 4 may be provided, as necessary, downstream of the release roller 5 in the advancing direction of the recording medium.

The transfer recording medium used in the present invention may be any one which is capable of forming a transfer image by virtue of a change in its physical properties when provided with plural kinds of energies. For instance, a transfer image can be formed if a transfer recording layer is used whose physical properties, such as the melting temperature, softening point, glass transition point, and viscosity, change on application of plural kinds of energies thereto.

The image forming elements constituting the transfer recording layer contain a functional component and a colorant. The functional component may preferably be a substance which can initiate a reaction leading to the physical property change or can abruptly change the velocity of such a reaction when provided or irradiated with plural energies such as light and heat.

A polymerizing component is a component which causes polymerization reaction or crosslinking reaction, and a monomer, oligomer, or polymer may be cited as such a component.

Specific examples of the monomer or polymer include those compounds having a reactive group at a terminal or in a side chain such as polyvinyl cinnmate, p-methoxycinnamic acid-succinic acid half ester copolymer, polyvinylstyrylpyridinium, polymethyl vinyl ketone, polyethylene glycol acrylate, polyethylene glycol acrylate, polyethylene glycol dimethacrylate, polypropylene glycol diacrylate; or epoxy resins, unsaturated polyester resins, polyurethane resins, polyvinyl alcohol resins, polyamide resins, polyacrylic acid type resins, polymaleic acid type resins, and silicone type resins. Further specific examples include acrylic acid esters, acrylic acid amides, methacrylic acid esters, and methacrylic acid amides.

Examples of the polymerizable monomer include ethylene glycol diacrylate, propylene glycol diacrylate, ethylene glycol dimethacrylate, 1,4-butanediol diacrylate, N,N'-methylenebisacrylamide, methyl acrylate, methyl methacrylate, cyclohexyl acrylate, benzyl acrylate, acrylamide, methacrylamide, N-methylolacrylamide, N-diacetonacrylamide, styrene, acrylnitrile, vinyl acetal, ethylene glycol diacrylate, butylene glycol dimethacrylate, 1,4-bitanediol diacrylate, 1,6-hexanediol dimethacrylate, diethylene glycol diacrylate, and triethylene glycol diacrylate. When a polymerizable monomer or oligomer is used, a polymer such as a cellulose acetate succinate, methyl methacrylate, or hydroxy ethyl methacrelate copolymer, may be contained to improve the layer forming properties.

In order to initiate or promote the reaction of the polymerizing component, a reaction initiator may be added as desired. The reaction initiator may preferably be a radical generator such as azo compounds, organic sulfur compounds, carbonyl compounds, and halogen compounds. Specific examples of the reaction initiator for this purpose include: carbonyl compounds such as benzophenone, benzyl, benzoiin ethyl ether, and 4-N,N-dimethylamino-4'-methoxybenzophe-none; organic sulfur compounds such as dibutyl sulfide, benzyl disulfide, and decyl phenyl sulfide; peroxides such as di-tert-butyl peroxide, and benzoyl peroxide; halogen compounds such as carbon tetrachloride, silver bromide, and 2-naphthalenesulfonyl chloride; nitrogen compounds such as azobisisobutyronitrile, and benzenediazonium chloride.

Further, in order to produce a transfer recording layer particularly adapted to use for formation of a latent image under the combination of light and heat energies, the reaction initiator and the polymerizing component may be selected from the respective groups so as to provide a combination having a large temperature dependence of reaction velocity with respect to the reaction between a reaction initiator which is caused to have an activity when provided with light energy and a polymerizing component.

For instance, a combination of a polymerizable prepolymer having a functional group such as methacrylate ester or acrylic ester, a photosensitive crosslinking agent such as tetraethylene glycol diacrylate, and benzophenone or Michler's ketone as the reaction initiator may be cited.

The coloring component or colorant is a component to provide an optically recognizable image and may be appropriately selected from various pigments and dyes. Specific examples of the colorant include: inorganic pigments such as carbon black, lead- yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

In addition, the transfer recording layer may also contain a stabilizer such as hydroquinone, p-methoxyphenol, p-tert-butylcatechol, and 2,2'-methylene-bis(4-ethyl-6-tert-butylphenol).

In order to enhance the activation of the reaction initiator, the transfer recording layer may further contain a sensitizer such as p-nitroaniline, 1,2-benzanthraquinone, p,p'-dimethylaminobenzophenol, anthraquinone, 2,6-dinitroaniline, and Michler's ketone.

The transfer recording medium in accordance with the present invention may further contain a binder component such as a resin, wax, or a mesomorphic compound in addition to the colorant and the functional component.

Resins that may be used as the binder include homopolymers or copolymers of polyester type, polyamide-type, polyurethane-type, polyurea-type, polyvinyl-type, silicone-type, polyacetylene-type, and polyether-type. One or a combination of two or more kinds of these resins may be used after mixing.

Waxes that may be used as the binder include vegetable waxes such as candelilla wax and carnauba wax; animal waxes such as beeswax and whale wax; mineral waxes such as ceresine wax and montan wax; petroleum wax such as paraffin wax; and synthetic waxes including polyethylene wax, sasol wax, montan wax derivatives, paraffin wax derivatives, hardened castor oil, hardened castor oil derivative, fatty acids such as stearic acid, and fatty acid amide esters. In the present invention, one or a combination of two or more kinds of these waxes may be used after mixing.

Specific examples of mesomorphic compounds are cholesterol hexanoate, cholesterol decanoate, cholesterol m-alumicarbonate, cholesterol methylcarbonate, 4'-methoxy-benzylidene-4-acetoxyaniline, 4'-methoxy-benzyl-idene-4-methylaniline, 4'-ethoxybenzylidene-4-cyano-aniline, and N,N'-bisbenzylidene-3,3'-dimethoxybenzidine.

When the image forming elements constituting the transfer recording layer are provided in the form of microcapsules, the cores of the capsules may be formed of the above-mentioned materials for the transfer recording layer. On the other hand, the walls of the microcapsules may, for example, be formed of a material including gelatine, gum arabic, cellulosic resins such as ethyl cellulose and nitrocellulose, polymers such as nylon, Tetoron, polyurethane, polycarbonate, maleic anhydride copolymers, polyvinylidene chloride, polyvinyl chloride, polyethylene, polystyrene, and polyethylene terephthalate.

As has been described above, the present invention provides an image recording apparatus which is capable of obtaining clearly recorded images.

We claim:
1. A recording apparatus for recording an image onto a medium to be recorded comprising:
   (a) conveying means for conveying a transfer recording medium having a transfer recording layer the transfer characteristics of which vary upon application of a plurality of kinds of energy;
   (b) a recording section disposed along an advancing route of said transfer recording medium conveyed by said conveying means and having energy application means for selectively applying said plurality of kinds of energy to said transfer recording medium;
   (c) a transfer section for transferring an image formed on said transfer recording medium in said recording section onto said recording medium;
   (d) a contacting member for contacting and effecting said transfer recording layer of said transfer recording medium downstream of said recording section and upstream of said transfer section with respect to a conveyance direction of said transfer recording medium conveyed by said conveying means, said contacting member being a rotatable roller having projections on the peripheral surface thereof for contacting the transfer recording layer to scrape it by rotation and
   (e) rotating means for rotating the contacting member.

2. An image recording apparatus according to claim 1, wherein said contacting member is a roller whose peripheral surface is formed into the shape of a knurling tool.

3. An image recording apparatus according to claim 1, further comprising removing means for removing substances scraped off said transfer recording layer by said contacting member by coming into contact with said transfer recording layer.

4. An image recording apparatus according to claim 3, wherein said removing means has a brush.

5. An image recording apparatus according to claim 1, wherein said contacting member imparts tension to said transfer recording medium in a direction perpendicular to the advancing direction thereof.

6. A recording apparatus for recording an image onto a medium to be recorded, comprising:
   a first housing having conveying means for conveying transfer recording medium having a transfer recording layer the transfer characteristics of which vary upon application of a plurality of kinds of energy and a first energy applying means for applying a first energy to said transfer recording medium; and
   a second housing openable relatively to said first housing, said second housing having a second energy applying means for applying a second energy, different in kind from said first energy, to said transfer recording medium and a contacting member for contacting and effecting and transfer recording layer of said transfer recording medium; said contacting member being a rotatable roller having projections on the peripheral surface thereof for contacting the transfer recording layer to scrape it by rotation and said contacting member being downstream of both the first energy applying means and the second energy applying means with respect to the conveying direction of the transfer recording medium.

7. A recording apparatus for recording an image onto a medium to be recorded, comprising:
   (a) conveying means for conveying a transfer recording medium having a transfer recording layer the transfer characteristics of which vary upon application of optical energy and thermal energy and which has microcapsule-like image forming elements;
   (b) a recording section disposed along an advancing route of said transfer recording medium conveyed by said conveying means having energy application means for selectively applying said optical energy and said thermal energy to said transfer recording medium;
   (c) a transfer section for transferring an image formed on said transfer recording medium in said recording section onto said recording medium;
   (d) a contacting member for contacting and scraping said transfer recording layer of said transfer recording medium downstream of said recording section and upstream of said transfer section with respect to a conveyance direction of said transfer recording medium conveyed by said conveying means, said contacting member being a rotatable roller having projections on the peripheral surface thereof for contacting the transfer recording layer to scrape it by rotation and
   (e) rotating means for rotating the contacting member.

8. An image recording apparatus for recording an image onto a medium to be recorded, said apparatus comprising:
   (a) conveying means for conveying a transfer recording medium having transfer recording layer characteristics of which vary upon application of energy;
   (b) a first image forming portion provided along a conveyance route of said transfer recording medium conveyed by said conveying means for applying said energy to said transfer recording medium so as to form a first image onto said transfer recording medium;
   (c) a second image forming portion onto said recording medium a second image in accordance with said first image;
   (d) a contacting member for contacting and effecting said transfer recording layer of said transfer recording medium upstream of said second image forming portion and downstream of said first image forming portion in the conveying direction of said transfer recording medium conveyed by said conveying means, and contacting member being a rotatable roller having projections on the peripheral surface thereof for contacting the transfer recording layer to scrape it by rotation and
   (e) rotating means for rotating the contacting member.

9. An image recording apparatus according to claim 8, wherein said energy is optical energy.

10. An image recording apparatus according to claim 8, wherein said energy is thermal energy.

11. An image recording apparatus according to claim 8, wherein said transfer recording medium and said recording medium are in contact with each other and heated at said second image forming portion.

12. An image recording apparatus according to claim 8, wherein said transfer recording medium and said recording medium are applied with pressure.

13. An image recording apparatus according to claim 8, wherein said transfer recording medium has microcapsule-like image forming elements.

14. A recording apparatus for recording on a recording medium, comprising:
   (a) conveying means for conveying a transfer recording medium having a transfer recording layer, transfer characteristics of which vary upon application of a plurality of kinds of energy;
   (b) a recording section provided along a conveyance route of said transfer recording medium conveyed by said conveying means, said recording section having an energy applying means for selectively applying said plurality of kinds of energy to said transfer recording medium;
   (c) a transfer section for transferring onto said recording medium an image transferred to on said transfer recording medium; and
   (d) a contacting member having a sharp edge for pressure contacting said transfer recording layer of said transfer recording medium and scraping said transfer recording layer downstream of said recording section and upstream of said transfer section with respect to a conveying direction of said transfer recording medium conveyed by said conveying means.

15. A recording apparatus according to claim 14, including a vibrating contacting member.

16. A recording apparatus according to claim 14 further comprising removing means for removing substances scraped off said transfer recording layer by said contacting member by coming into contact with said transfer recording layer.

17. A recording apparatus according to claim 16, wherein said removing means comprises a brush.

18. A recording apparatus according to claim 14 wherein said contacting member imparts tension to said transfer recording medium in a direction perpendicular to the advancing direction thereof.

19. A recording apparatus for recording on a recording medium, comprising:
   a first housing having conveying means for conveying a transfer recording medium having a transfer recording layer, transfer characteristics of which vary upon application of a plurality of kinds of energy and a first energy applying means for applying a first energy to said transfer recording medium and;
   a second housing having a second energy applying means for applying a second energy different from said first energy to said transfer recording medium and a contacting member having a sharp edge for pressure contacting said transfer recording layer of said transfer recording medium and scraping said transfer recording layer downstream of said first energy applying means and said second energy applying means, said first housing and said second housing are relatively openable.

20. A recording apparatus according to claim 19, wherein said contacting member vibrates.

21. A recording apparatus according to claim 19 further comprising removing means for removing substances scraped off said transfer recording layer by said contacting member by coming into contact with said transfer recording layer.

22. A recording apparatus according to claim 21 wherein said removing means comprises a brush.

23. A recording apparatus according to claim 19 wherein said contacting member imparts tension to said transfer recording medium in a direction perpendicular to the advancing direction thereof.

24. A recording apparatus for recording on a recording medium, comprising:
   conveying means for conveying a transfer recording medium having a transfer recording layer having a microcapsule-like image forming elements, transfer characteristics of which vary upon application of optical energy and thermal energy;
   a recording section provide along a conveyance route of said transfer recording medium conveyed by said conveying means, said recording section having an energy applying means for selectively applying said plurality of kinds of energy to said transfer recording medium;
   a transfer section for transferring onto said recording medium an image transferred to on said transfer recording medium; and
   a contacting member having a sharp edge for pressure contacting said transfer recording layer of said transfer recording medium and scraping said transfer recording layer downstream of said recording section and upstream of said transfer section with respect to conveying direction of said transfer recording medium conveyed by said conveying means.

25. A recording apparatus according to claim 24, including a vibrating contacting member.

26. A recording apparatus according to claim 24 further comprising removing means for removing substances scraped off said transfer recording layer by said contacting member by coming into contact with said transfer recording layer.

27. A recording apparatus according to claim 26 wherein said removing means comprises a brush.

28. A recording apparatus according to claim 24 wherein said contacting member imparts tension to said transfer recording medium in a direction perpendicular to the advancing direction thereof.

29. A recording apparatus for recording on a recording medium, comprising:
   conveying means for conveying a transfer recording medium having a transfer recording layer, transfer characteristics of which vary upon application of energy;
   a first image forming section provided along a conveyance route of said transfer recording medium conveyed by said conveying means so as to apply said energy to said transfer recording medium to form an image on said transfer recording medium;
   a second image forming section for forming on said recording medium a visible image in response to the image formed on said transfer recording medium at said first image forming section; and
   a contacting member having a sharp edge for pressure contacting said transfer recording layer of said transfer recording medium and scraping said transfer recording layer downstream of said first image forming section and upstream of said second image forming section with respect to a conveying direction of said transfer recording medium conveyed by said conveying means.

30. A recording apparatus according to claim 29 wherein said contacting member vibrates.

31. A recording apparatus according to claim 29 further comprising removing means for removing substances scrape off said transfer recording layer by said contacting member by coming into contact with said transfer recording layer.

32. A recording apparatus according to claim 31 wherein said removing means comprises a brush.

33. A recording apparatus according to claim 29 wherein said contacting member imparts tension to said transfer recording medium in a direction perpendicular to the advancing direction thereof.

34. A recording apparatus according to claim 1, wherein said projections are minute projections.

35. A recording apparatus according to claim 1, wherein said transfer recording medium is detachable to said recording apparatus.

* * * * *

UNITED STATES PATENT AND TRADEMARK OFFICE
CERTIFICATE OF CORRECTION

PATENT NO. : 4,978,968

DATED : December 18, 1990

INVENTOR(S) : NORIYOSHI ISHIKAWA, ET AL.

It is certified that error appears in the above-identified patent and that said Letters Patent is hereby corrected as shown below:

ON THE TITLE PAGE,
IN [56] REFERENCES CITED

FOREIGN PATENT DOCUMENTS, "2113860  11/1875  United Kingdom" should be deleted.

SHEET 6 OF 47

Figure 8:
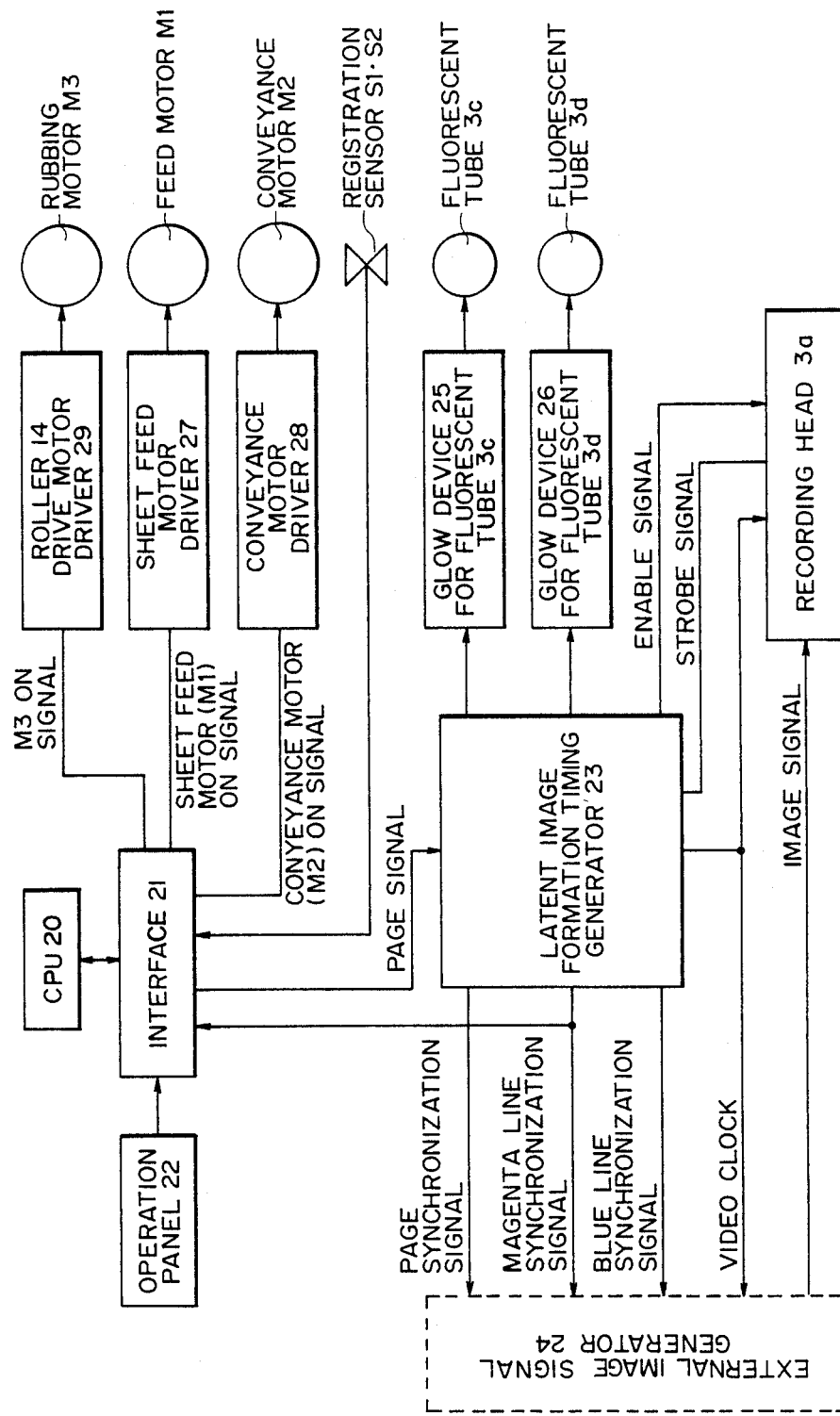
FIG. 8 is a block diagram of the image recording apparatus to which the present invention is applied.

FIG. 8, "CONYEYANCE" should read --CONVEYANCE--.

COLUMN 1

Line 5, "No. 071,086,720" should read
        --No. 07/86,720--.
    Line 15, "system" should read --systems--.

COLUMN 3

Line 55, "diagram" should read --diagrams--.

COLUMN 4

Line 14, "this" should be deleted.

COLUMN 6

Line 43, "60    C." should read --60°C.--.

COLUMN 9

Line 19, "heat." should read --heat--.

UNITED STATES PATENT AND TRADEMARK OFFICE
CERTIFICATE OF CORRECTION

PATENT NO. : 4,978,968

DATED : December 18, 1990

INVENTOR(S) : NORIYOSHI ISHIKAWA, ET AL.

It is certified that error appears in the above-identified patent and that said Letters Patent is hereby corrected as shown below:

COLUMN 10

Line 16, "been" should read --has been--.

COLUMN 11

Line 44, "clock" should read --clock.--.
    Line 60, "conveyance motor M2" should read --conveyance motor M2.--.

COLUMN 12

Line 10, "$L_2$ distance" should read --$L_2$: distance--.
    Line 12, "$L_3$ distance" should read --$L_3$: distance--.
    Line 65, "shows" should read --show--.

COLUMN 13

Line 22, "Phd 2" should read --$P_2$--.
    Line 26, "ranster" should read --raster--.

COLUMN 16

Line 16, "A still" should read --Still--.

COLUMN 17

Line 11, "downwardly If" should read --downwardly. If--.

UNITED STATES PATENT AND TRADEMARK OFFICE
CERTIFICATE OF CORRECTION

PATENT NO. : 4,978,968
DATED : December 18, 1990
INVENTOR(S) : NORIYOSHI ISHIKAWA, ET AL.

It is certified that error appears in the above-identified patent and that said Letters Patent is hereby corrected as shown below:

COLUMN 18

Line 24, "by a" should read --of--.
    Line 29, "thereof" should read --thereof.--.

COLUMN 20

Line 9, "a" (second occurrence) should read --as--.
    Line 46, "conveying unit U1" should read
        --conveying unit $U_1$--.
    Line 63, "guide unit U" should read --guide unit $U_2$--.

COLUMN 21

Line 24, "conveying unit U" should read
        --conveying unit $U_1$ is--.
    Line 36, "wide In this sate," should read
        --wide.  In this state,--.

COLUMN 22

Line 6, "magnet 120g" should read --magnet 120g.--.
    Line 19, "108." should read --108 is facilitated.--.

COLUMN 23

Line 21, "when" should read --When--.
    Line 56, "lontitudinally" should read
        --longitudinally--.

UNITED STATES PATENT AND TRADEMARK OFFICE
CERTIFICATE OF CORRECTION

PATENT NO. : 4,978,968
DATED : December 18, 1990
INVENTOR(S) : NORIYOSHI ISHIKAWA, ET AL.

It is certified that error appears in the above-identified patent and that said Letters Patent is hereby corrected as shown below:

COLUMN 24

Line 4, "arranged" (first occurrence) should be deleted.
    Line 35, "is" (first occurrence) should be deleted.

COLUMN 26

Line 17, "dissapear." should read --disappear.--.

COLUMN 27

Line 35, "an explanatory to plan" should read --a top plan--.
    Line 39, ""   "," should read --"\/",--.

COLUMN 28

Line 51, "tetraphthalate." should read --terephthalate.--.

COLUMN 29

Line 48, "methacrelate" should read --methacrylate--.
    Line 58, "methoxybenzophe-none;" should read --methoxybenzophenone;--.

UNITED STATES PATENT AND TRADEMARK OFFICE
CERTIFICATE OF CORRECTION

PATENT NO. : 4,978,968
DATED : December 18, 1990
INVENTOR(S) : NORIYOSHI ISHIKAWA, ET AL.

It is certified that error appears in the above-identified patent and that said Letters Patent is hereby corrected as shown below:

COLUMN 31

Line 33, "contacting" should read --pressure contacting--.
    Line 34, "rotation and" should read --rotation; and--.
    Line 66, "and" (second occurrence) should read --said--.

COLUMN 32

Line 2, "contacting" should read --pressure contacting--.
    Line 34, "rotation and" should read --rotation; and--.
    Line 59, "and" should read --said--.
    Line 61, "contacting" should read --pressure contacting--.
    Line 62, "rotation and" should read --rotation; and--.

COLUMN 33

Line 24, "to on" should read --onto--.

COLUMN 34

Line 19, "provide" should read --provided--.
    Line 26, "to on" should read --onto--.

UNITED STATES PATENT AND TRADEMARK OFFICE
CERTIFICATE OF CORRECTION

PATENT NO. : 4,978,968

DATED : December 18, 1990

INVENTOR(S) : NORIYOSHI ISHIKAWA, ET AL.

It is certified that error appears in the above-identified patent and that said Letters Patent is hereby corrected as shown below:

COLUMN 35

Line 8, "scrape" should read --scraped--.

Signed and Sealed this

Sixth Day of October, 1992

Attest:

DOUGLAS B. COMER

Attesting Officer

Acting Commissioner of Patents and Trademarks